United States Patent
Fujimori et al.

(10) Patent No.: US 12,002,515 B2
(45) Date of Patent: Jun. 4, 2024

(54) MEMORY DEVICE CONFIGURED TO APPLY DIFFERENT ERASE INTENSITIES TO DIFFERENT BLOCKS DURING AN ERASE OPERATION AND MEMORY SYSTEM FOR INSTRUCTING THE MEMORY DEVICE TO CARRY OUT THE ERASE OPERATION

(71) Applicant: KIOXIA CORPORATION, Tokyo (JP)

(72) Inventors: Takumi Fujimori, Yokohama Kanagawa (JP); Tetsuya Sunata, Yokohama Kanagawa (JP); Masanobu Shirakawa, Chigasaki Kanagawa (JP); Hideki Yamada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 82 days.

(21) Appl. No.: 17/686,148

(22) Filed: Mar. 3, 2022

(65) Prior Publication Data
US 2023/0090202 A1 Mar. 23, 2023

(30) Foreign Application Priority Data
Sep. 22, 2021 (JP) .................. 2021-154486

(51) Int. Cl.
*G11C 16/04* (2006.01)
*G11C 16/08* (2006.01)
(Continued)

(52) U.S. Cl.
CPC .......... *G11C 16/16* (2013.01); *G11C 16/0483* (2013.01); *G11C 16/08* (2013.01); *G11C 16/3445* (2013.01)

(58) Field of Classification Search
CPC ..... G11C 16/16; G11C 16/0483; G11C 16/08; G11C 16/3445; G11C 11/5635; H10B 43/27
(Continued)

(56) References Cited

U.S. PATENT DOCUMENTS 5,805,501 A * 9/1998 Shiau ............... G11C 16/16
365/185.29
7,110,301 B2 9/2006 Lee et al.
(Continued)

OTHER PUBLICATIONS

Zambelli et al., "Impact of the NAND Flash Power Supply on Solid State Drives Reliability and Performance" IEEE Transactions on Device and Materials Reliability, vol. 18, No. 2, Jun. 2018, pp. 247-255, (9 pages).
(Continued)

*Primary Examiner* — Tha-O H Bui
(74) *Attorney, Agent, or Firm* — Kim & Stewart LLP

(57) ABSTRACT

A memory device includes a first block including a first memory cell and a first word line connected to the first memory cell, a second block including a second memory cell and a second word line connected to the second memory cell, and a control circuit. The control circuit applies a first voltage to each of the first and second word lines to supply a first erase pulse having a first erase intensity to each of the first and second blocks, when a first erase operation is executed, and applies the first voltage to the first word line and a second voltage higher than the first voltage to the second word line, to supply the first erase pulse to the first block and a second erase pulse having a second erase intensity less than the first erase intensity to the second block, when a second erase operation is executed.

20 Claims, 28 Drawing Sheets

(51) Int. Cl.
    *G11C 16/16*         (2006.01)
    *G11C 16/34*         (2006.01)
(58) Field of Classification Search
    USPC ..................................................... 365/185.11
    See application file for complete search history.

(56)                References Cited

U.S. PATENT DOCUMENTS

| | | | |
|---|---|---|---|
| 7,269,070 | B2 | 9/2007 | Kim |
| 8,982,630 | B2 | 3/2015 | Asaoka et al. |
| 9,779,038 | B2* | 10/2017 | Kasorla .................... G06F 13/24 |
| 10,242,743 | B2* | 3/2019 | Hsu ......................... G11C 16/08 |
| 2003/0117886 | A1* | 6/2003 | Shiga ................... G11C 16/107 |
| | | | 365/233.1 |
| 2017/0069372 | A1 | 3/2017 | Kodama et al. |
| 2018/0102172 | A1 | 4/2018 | Yi |
| 2019/0385681 | A1 | 12/2019 | Yun et al. |

OTHER PUBLICATIONS

Carlson, "Achieving Predictable Latency for Solid State Drives" 2018 Storage Developer Conference EMEA, Tel Aviv, Israel, Feb. 2018, 32 pages.

\* cited by examiner

FIG. 10

TBLERA

| VOLTAGE INFORMATION TABLE | | |
|---|---|---|
| CODE eopt | WORD LINE VOLTAGE (ADJUSTED VOLTAGE) | |
| 000 | Veopt0 | ← WORD LINE VOLTAGE FOR FIRST ERASE LOOP WHEN ERASE INTENSITY IS TO BE LOWER THAN DEFAULT ERASE INTENSITY |
| 001 | Veopt1 | ← WORD LINE VOLTAGE FOR SECOND ERASE LOOP WHEN ERASE INTENSITY IS TO BE LOWER THAN DEFAULT ERASE INTENSITY |
| 010 | Veopt2 | ← WORD LINE VOLTAGE FOR THIRD ERASE LOOP WHEN ERASE INTENSITY IS TO BE LOWER THAN DEFAULT ERASE INTENSITY |
| 011 | Veopt3 | ← WORD LINE VOLTAGE FOR SECOND ERASE LOOP WHEN ERASE INTENSITY IS TO BE EQUAL TO ERASE INTENSITY OF FIRST ERASE LOOP |
| 100 | Veopt4 | ← WORD LINE VOLTAGE FOR THIRD ERASE LOOP WHEN ERASE INTENSITY IS TO BE EQUAL TO ERASE INTENSITY OF FIRST ERASE LOOP |
| 101 | Veopt5 | ← WORD LINE VOLTAGE FOR SECOND ERASE LOOP WHEN ERASE INTENSITY IS TO BE LOWER THAN ERASE INTENSITY USED IN FIRST ERASE LOOP |
| 110 | Veopt6 | ← WORD LINE VOLTAGE FOR THIRD ERASE LOOP WHEN ERASE INTENSITY IS TO BE LOWER THAN ERASE INTENSITY USED IN FIRST ERASE LOOP |
| 111 | — | ← DEFAULT WORD LINE VOLTAGE OR NO ADJUSTMENT IN WORD LINE VOLTAGE |

FIG. 25

TBLERAip

| CODE eoptx | VOLTAGE INFORMATION TABLE | | | |
|---|---|---|---|---|
| | NUMBER OF ERASE LOOPS (PRIMARY BLOCK) | NUMBER OF ERASE LOOPS (SECONDARY BLOCK) | WORD LINE VOLTAGE (ADJUSTED VOLTAGE) | |
| 000 | NUMBER OF ERASE LOOPS FOR SECONDARY BLOCK IS EQUAL TO NUMBER OF ERASE LOOPS FOR PRIMARY BLOCK | | VSS | → WORD LINE VOLTAGE RESULTING IN NORMAL ERASE INTENSITY |
| 001 | LP1 (SECOND) | LP0 (FIRST) | Veopt1-0 | → WORD LINE VOLTAGE THAT ADJUSTS ERASE INTENSITY TO THAT USED IN FIRST ERASE LOOP, WHEN ERASE NODE VOLTAGE HAS VOLTAGE VALUE USED IN SECOND ERASE LOOP |
| 010 | LP2 (THIRD) | LP0 | Veopt2-0 | → WORD LINE VOLTAGE THAT ADJUSTS ERASE INTENSITY TO THAT USED IN FIRST ERASE LOOP WHEN ERASE NODE VOLTAGE HAS VOLTAGE VALUE USED IN THIRD ERASE LOOP |
| 011 | LP2 | LP1 | Veopt2-1 | → WORD LINE VOLTAGE THAT ADJUSTS ERASE INTENSITY TO THAT USED IN SECOND ERASE LOOP, WHEN ERASE NODE VOLTAGE HAS VOLTAGE VALUE USED IN THIRD ERASE LOOP |
| 100 | LP3 (FOURTH) | LP0 | Veopt3-0 | → WORD LINE VOLTAGE THAT ADJUSTS ERASE INTENSITY TO THAT USED IN FIRST ERASE LOOP, WHEN ERASE NODE VOLTAGE HAS VOLTAGE VALUE USED IN FOURTH ERASE LOOP |
| 101 | LP3 | LP1 | Veopt3-1 | → WORD LINE VOLTAGE THAT ADJUSTS ERASE INTENSITY TO THAT USED IN SECOND ERASE LOOP, WHEN ERASE NODE VOLTAGE HAS VOLTAGE VALUE USED IN FOURTH ERASE LOOP |
| 110 | LP3 | LP2 | Veopt3-2 | → WORDL LINE VOLTAGE THAT ADJUSTS ERASE INTENSITY TO THAT USED IN THIRD ERASE LOOP, WHEN ERASE NODE VOLTAGE HAS VOLTAGE VALUE USED IN FOURTH ERASE LOOP |
| 111 | — | — | — | → NO ADJUSTMENT IN WORD LINE VOLTAGE |

MEMORY DEVICE CONFIGURED TO APPLY DIFFERENT ERASE INTENSITIES TO DIFFERENT BLOCKS DURING AN ERASE OPERATION AND MEMORY SYSTEM FOR INSTRUCTING THE MEMORY DEVICE TO CARRY OUT THE ERASE OPERATION

CROSS-REFERENCE TO RELATED APPLICATION

This application is based upon and claims the benefit of priority from Japanese Patent Application No. 2021-154486, filed Sep. 22, 2021, the entire contents of which are incorporated herein by reference.

FIELD

Embodiments described herein relate generally to a memory device and a memory system.

BACKGROUND

NAND flash memories and memory systems including NAND flash memories are continuing to be developed.

DESCRIPTION OF THE DRAWINGS

FIG. 10 illustrates a voltage information table used in the memory device of the first embodiment.

FIG. 25 illustrates a voltage information table used in the memory device of the third embodiment.

DETAILED DESCRIPTION

Figure 1:
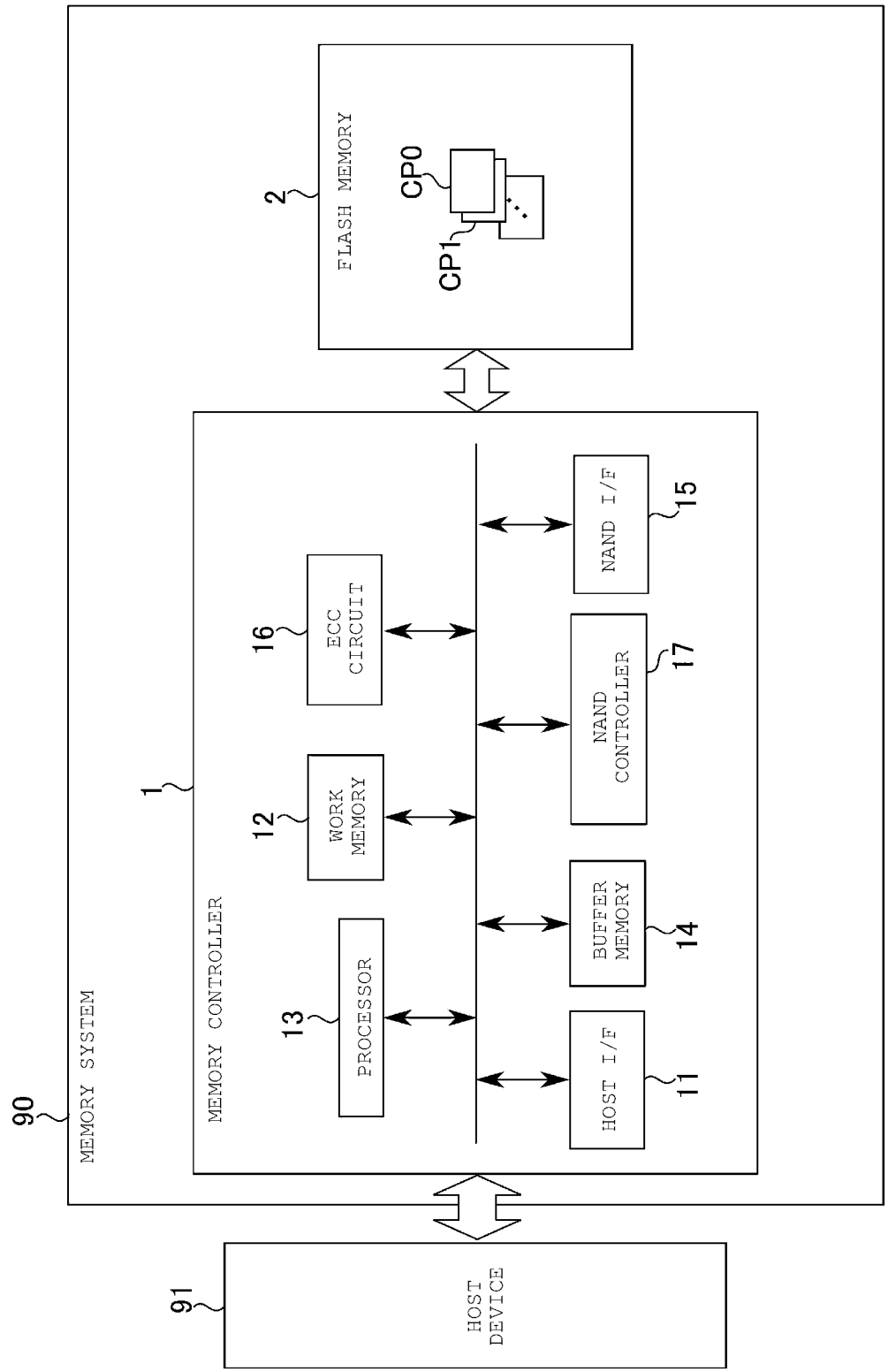
FIG. 1 is a block diagram illustrating a configuration example of a system including a memory device of a first embodiment.

Embodiments provide an improvement of characteristics of a memory device.

In general, according to one embodiment, a memory device includes: a first block including a first memory cell and a first word line connected to the first memory cell; a second block including a second memory cell and a second word line connected to the second memory cell; and a control circuit configured to execute an erase sequence for the first and second blocks, and determine voltages to be applied to the first and second word lines during the erase sequence. The control circuit applies a first voltage to each of the first and second word lines to supply a first erase pulse having a first erase intensity to each of the first and second blocks, when a first erase operation of a first erase sequence is executed on the first and second blocks; and the control circuit applies the first voltage to the first word line and a second voltage higher than the first voltage to the second word line, to supply the first erase pulse to the first block and a second erase pulse having a second erase intensity less than the first erase intensity to the second block, when a second erase operation of a second erase sequence is executed on the first and second blocks.

Hereinafter, the embodiment will be described in detail with reference to the drawings. In the following description, components having the same function and configuration are denoted by the same reference numerals.

In addition, in each of the following embodiments, when components (for example, circuits, wirings, various voltages, signals, and the like) having reference symbols with numbers/alphabets for distinction at the ends thereof do not need to be distinguished from each other, the reference symbols in which the numbers/alphabets at the ends thereof are omitted is used in the description.

EMBODIMENT

Memory devices, memory systems, and control methods thereof of embodiments will be described with reference to FIGS. 1 to 28.

(1) First Embodiment

A memory device, a memory system, and a control method thereof according to a first embodiment will be described with reference to FIGS. 1 to 21.

(a) Configuration Example

FIG. 1 is a block diagram illustrating a configuration example of the memory system including the memory device of the embodiment.

As illustrated in FIG. 1, a memory system 90 includes a memory controller 1 and a flash memory 2.

The memory controller 1 communicates with a host device 91 by a host bus. The host device 91 is, for example, a digital camera, a personal computer, a smartphone, a future phone, an in-vehicle device, a game device, an unmanned aerial vehicle, a server, or the like. The host bus is, for example, an SD® interface, a serial attached small (SAS) computer system interface, a serial advanced technology attachment (SATA), a peripheral component interconnect express (PCIe), a non-volatile memory express (NVMe), a universal serial bus (USB), or a bus according to a universal flash storage (UFS). It is noted that the memory controller 1 may communicate with the host device 91 wirelessly.

The memory controller 1 controls the flash memory 2. The memory controller 1 accesses the flash memory 2 in response to an instruction (hereinafter, referred to as a host command) received from the host device 91.

The memory controller 1 is connected to the flash memory 2 by a bus performing a data transfer method according to a certain standard (or specification).

In the embodiment, the flash memory 2 is an example of the memory device and is, for example, a semiconductor memory device such as a non-volatile semiconductor memory device. The flash memory 2 is, for example, a NAND flash memory. The flash memory 2 includes a plurality of memory chips CP (CP0, CP1, . . . ).

It is noted that the plurality of flash memories 2 may be connected to the memory controller 1. In this case, each of the plurality of flash memories 2 is individually connected to the memory controller 1 via the corresponding bus (for example, channels) as control units independent of each other.

The memory controller 1 and the flash memory 2 may be provided in one storage device by combining the memory controller 1 and the flash memory 2. For example, the memory card such as an SD® card, a USB memory, a solid state drive (SSD), or the like may be provided as the storage device.

(a-1) Memory Controller

As illustrated in FIG. 1, the memory controller (also simply referred to as a controller) 1 includes a host interface circuit 11, a work memory 12, a processor (CPU) 13, a buffer memory 14, a NAND interface circuit 15, an error check and correct (ECC) circuit 16, and a NAND controller 17. These components 11 to 17 are connected to an internal bus in the memory controller 1. These components 11 to 17 can transmit and receive various signals and various data to and from each other via the internal bus.

The memory controller 1 is, for example, a system on a chip (SoC). It is noted that functions of the components 11 to 17 of the memory controller 1 described below can be implemented by hardware or a combination of hardware and firmware (software).

The host interface circuit 11 is connected to the host device 91 via the host bus. The host interface circuit 11 transfers the host command and data received from the host device 91 to the processor 13 and the buffer memory 14, respectively. The host interface circuit 11 transfers data in the buffer memory 14 to the host device 91 in response to the instruction of the processor 13.

The work memory (for example, RAM) 12 is used as a work area of the processor 13. The work memory 12 stores firmware for managing the flash memory 2 and various tables (for example, a logical-to-physical address translation table). The work memory 12 is, for example, a memory (for example, a volatile semiconductor memory) such as a DRAM or an SRAM.

The processor 13 controls operations of the entire memory controller 1. The processor 13 generates the command with respect to the flash memory 2 instructing the flash memory 2 to perform the operation according to the host command or the internal process of the memory system 90. For example, the processor 13 allows the NAND controller 17 to issue various commands such as a write command, a read command, or an erase command. The processor 13 can control the NAND controller 17 based on the host command and allow the flash memory 2 to execute the operation requested by the host device 91. The processor 13 can control the NAND controller 17 and execute various internal processes for managing the flash memory 2 regardless of the host command.

The buffer memory 14 temporarily stores a data written to the flash memory 2 (hereinafter, referred to as a write data), a data read from the flash memory 2 (hereinafter, referred to as a read data), and a data of which error is corrected by the ECC circuit 16.

The NAND interface circuit 15 is connected to the flash memory 2 via a NAND bus. The NAND interface circuit 15 controls communication between the NAND controller 17 and the flash memory 2. The NAND interface circuit 15 transmits/receives various signals based on the NAND interface described later to/from the flash memory 2 based on the instruction from the processor 13.

The ECC circuit 16 performs an error detection process and an error correction process on the data stored in the flash memory 2. The ECC circuit 16 generates the error correction code (ECC) during the data writing and adds the generated error correction code (ECC) to the write data. The ECC circuit 16 decodes the error correction code (ECC) in the read data and detects the presence or absence of the error bit during the data reading process. The ECC circuit 16 corrects the detected error when the error bit is detected from the read data.

The NAND controller 17 generates commands, addresses, and the like to be transferred between the controller 1 and the flash memory 2 based on the instruction from the processor 13. The NAND controller 17 issues a write command, a read command, an erase command, or the like to the flash memory 2. For example, the NAND controller 17 may issue various commands based on the NAND interface to the flash memory 2 regardless of the host command. For example, the plurality of NAND controllers 17 may be provided in the memory controller 1 according to the number of flash memories 2 connected to the memory controller 1. Each of the plurality of NAND controllers 17 is configured to control communication with the corresponding one of the plurality of flash memories 2.

(a-2) Flash Memory

Figure 2:
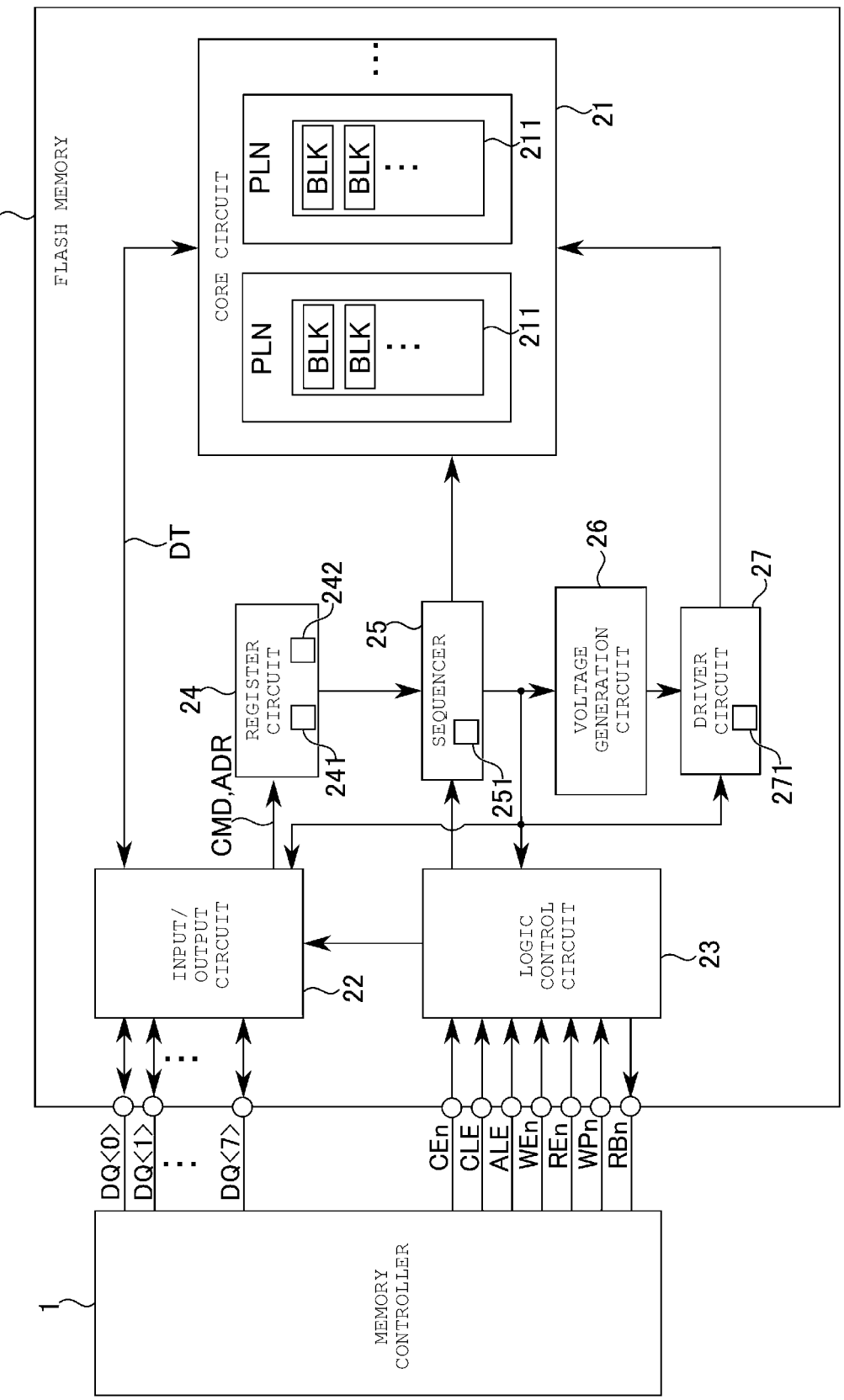
FIG. 2 is a block diagram illustrating a configuration example of the memory device of the first embodiment.

FIG. 2 is a block diagram illustrating a configuration example of the flash memory 2 of the embodiment.

As illustrated in FIG. 2, the NAND flash memory 2 includes a core circuit 21, an input/output circuit 22, a logic control circuit 23, a register circuit 24, a sequencer 25, a voltage generation circuit 26, a driver circuit 27, and the like.

The core circuit 21 includes a plurality of planes PLN. Each plane PLN includes at least a memory cell array 211. The memory cell array 211 includes a plurality of blocks BLK. The planes PLN are capable of operating independently of each other in the core circuit 21. The plurality of planes PLN can operate simultaneously (concurrently).

The detailed description of an internal configuration of the core circuit 21 will be described later.

The input/output circuit 22 and the logic control circuit 23 are connected to the memory controller 1 via the NAND bus. The input/output circuit 22 and the logic control circuit 23 transmit and receive signals based on the NAND interface. Specific examples of the NAND interface signal include a chip enable signal CEn, an address latch enable signal ALE, a command latch enable signal CLE, a write enable signal WEn, a read enable signal REn, a ready/busy signal RBn, and input/output signals DQ (DQ <0>, DQ <1>, . . . , DQ <7>).

The input/output circuit 22 receives the signal DQ from the memory controller 1. The input/output circuit 22 transmits the signal DQ from the flash memory 2 to the memory controller 1. The signal DQ is a set of signals with a data width of 8 bits. The signal DQ may contain a command CMD, an address ADR, and a data (write data and read data) DT.

For example, the input/output circuit 22 transmits the received command CMD and address ADR to the register circuit 24. The input/output circuit 22 transmits the received write data DT to the core circuit 20. The input/output circuit 22 transmits the data DT from the core circuit 21 to the memory controller 1 as a read data.

The logic control circuit 23 receives the signals CEn, ALE, CLE, WEn, WPn, and REn. The logic control circuit 23 transmits the processing results of the received signals CEn, ALE, CLE, WEn, WPn, REn and the signals CEn, ALE, CLE, WEn, WPn, and REn to the sequencer 25. The logic control circuit 23 transmits the signal RBn to the memory controller 1.

The signal CEn is individually input to the corresponding chip CP. The signal RBn is individually output from the corresponding chip CP. The signals ALE, CLE, WEn, REn, and DQ are input in common to each chip CP. The signal CEn is a signal for enabling the corresponding chip CP. The signal CLE is a signal notifying the flash memory 2 (each chip CP) that the signal DQ from the memory controller 1 contains a command. The signal ALE is a signal notifying the flash memory 2 that the signal DQ from the memory controller 1 contains an address. The signal WEn is a signal for indicating to the flash memory 2 that the signal DQ from the memory controller 1 should be received therein. The signal REn is a signal indicating to the flash memory 2 that the signal DQ should be output from the flash memory 2 to the memory controller 1. The signal WPn is a signal instructing prohibition of data writing and data erasing to the flash memory 2. The ready/busy signal RBn a signal indicating whether the corresponding chip CP of the flash memory 2 is in a ready state (a state in which the instruction from the memory controller 1 can be received) or a busy state (a state in which the instruction from the memory controller 1 cannot be received). When the chip CP is in the busy state, the signal level of the ready/busy signal RBn is set to the "L" level.

The register circuit 24 stores the command CMD and the address ADR. The register circuit 24 transfers the address ADR and the command CMD to the sequencer 25 and other circuits.

The register circuit 24 includes, for example, a command register 241 and an address register 242. The command register 241 stores (temporarily stores) the command CMD transmitted from the memory controller 1. The command CMD is a set (signal set) of signals having a plurality of bits. The address register 242 temporarily stores (stores) the address ADR. The address ADR indicates an address of a target for the operation of the command CMD. The address ADR includes a block address, a page address (corresponding to a word line address), a column address, and the like. A set including one or more commands CMD and one or more addresses ADR transmitted from the memory controller 1 to the flash memory 2 for the execution of a certain operation sequence is also referred to as a command set.

The sequencer 25 receives the command CMD and the address ADR. The sequencer 25 controls the entire flash memory 2 according to a sequence corresponding to the received command CMD. For example, the sequencer 25 controls each plane PLN to execute the read sequence of reading a data from the address ADR, the write sequence of writing a data to the address ADR, the erase sequence of erasing a data in the address ADR, or the like.

The sequencer 25 includes the plurality of control circuits for controlling the operation to be executed by the flash memory 2. For example, the sequencer 25 includes an erase sequence control circuit 251 for controlling the erase sequence. In some cases, the sequencer 25 may include a decoding circuit for decoding the command CMD and the address ADR.

The voltage generation circuit 26 generates a plurality of voltages used for the write sequence, the read sequence, the erase sequence, and the like based on the instruction from the sequencer 25. The voltage generation circuit 26 supplies the generated voltage to the driver circuit 27.

The driver circuit 27 outputs the plurality of voltages supplied from the voltage generation circuit 26 to the core circuit 21. The driver circuit 27 includes a plurality of regulator circuits 271. The regulator circuit 271 outputs one of the plurality of voltages according to the operation to be executed.

<Configuration Example of Plane PLN>

Figure 3:
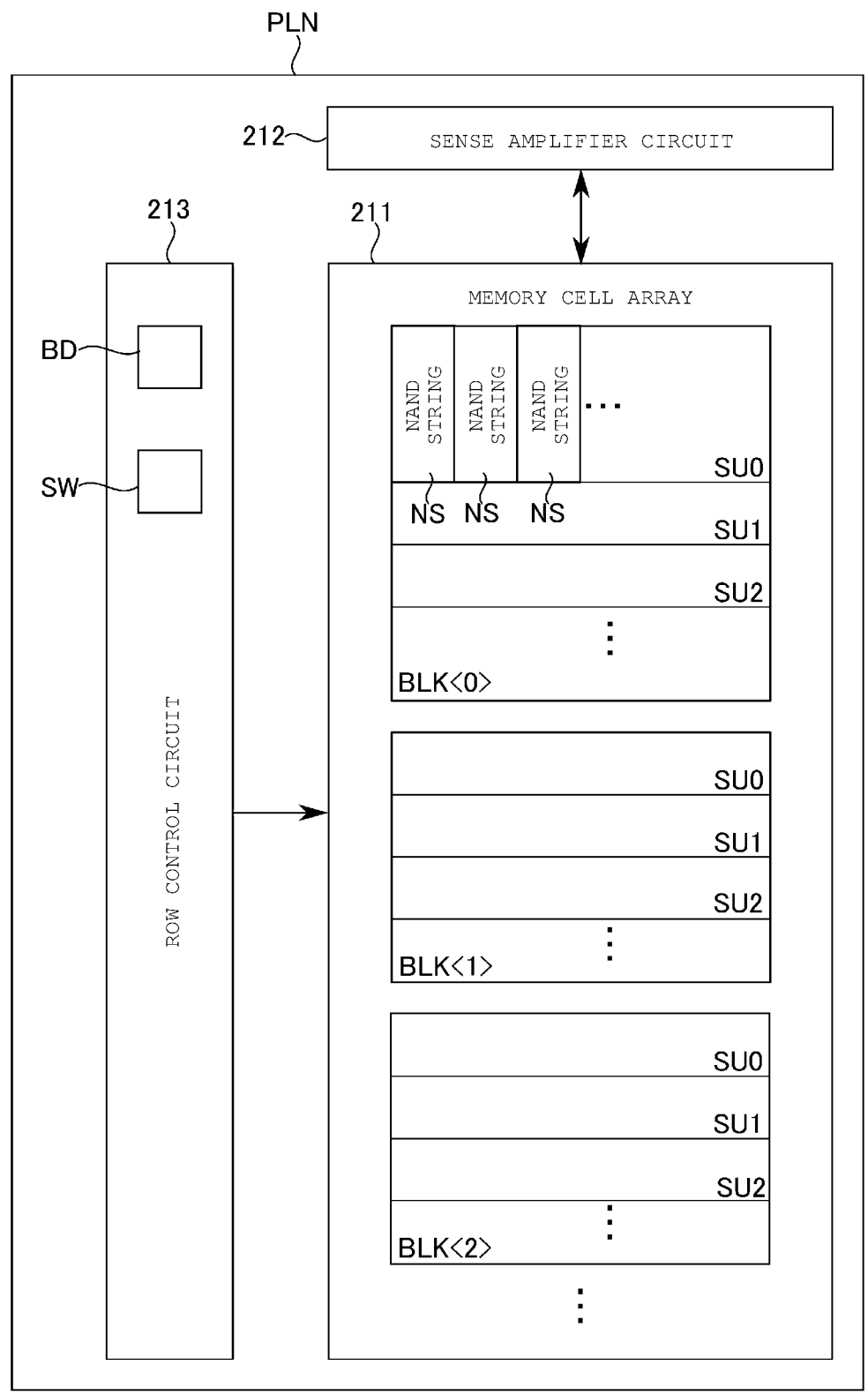
FIG. 3 is a block diagram illustrating the configuration example of the memory device of the first embodiment.

FIG. 3 is a block diagram illustrating a configuration example of the plane PLN in the flash memory 2 of the embodiment.

As illustrated in FIG. 3, in the core circuit 21, each plane PLN includes the memory cell array 211, a sense amplifier circuit 212, and a row control circuit 213.

The memory cell array 211 stores the data DT. The memory cell array 211 includes the plurality of blocks BLK (BLK<0>, BLK<1>, BLK<2>, . . . ). Each block BLK includes the plurality of string units SU (SU0, SU1, SU2, . . . ). Each string unit SU includes a plurality of NAND strings NS. The NAND string NS includes the plurality of memory cells connected in series. The memory cells are associated with rows and columns of the block BLK. It is noted that the number of blocks in the memory cell array 211, the number of string units in the block BLK, the number of NAND strings in the string unit SU, and the number of memory cells in the NAND string NS may be any number.

(Memory Cell Array)

Figure 4:
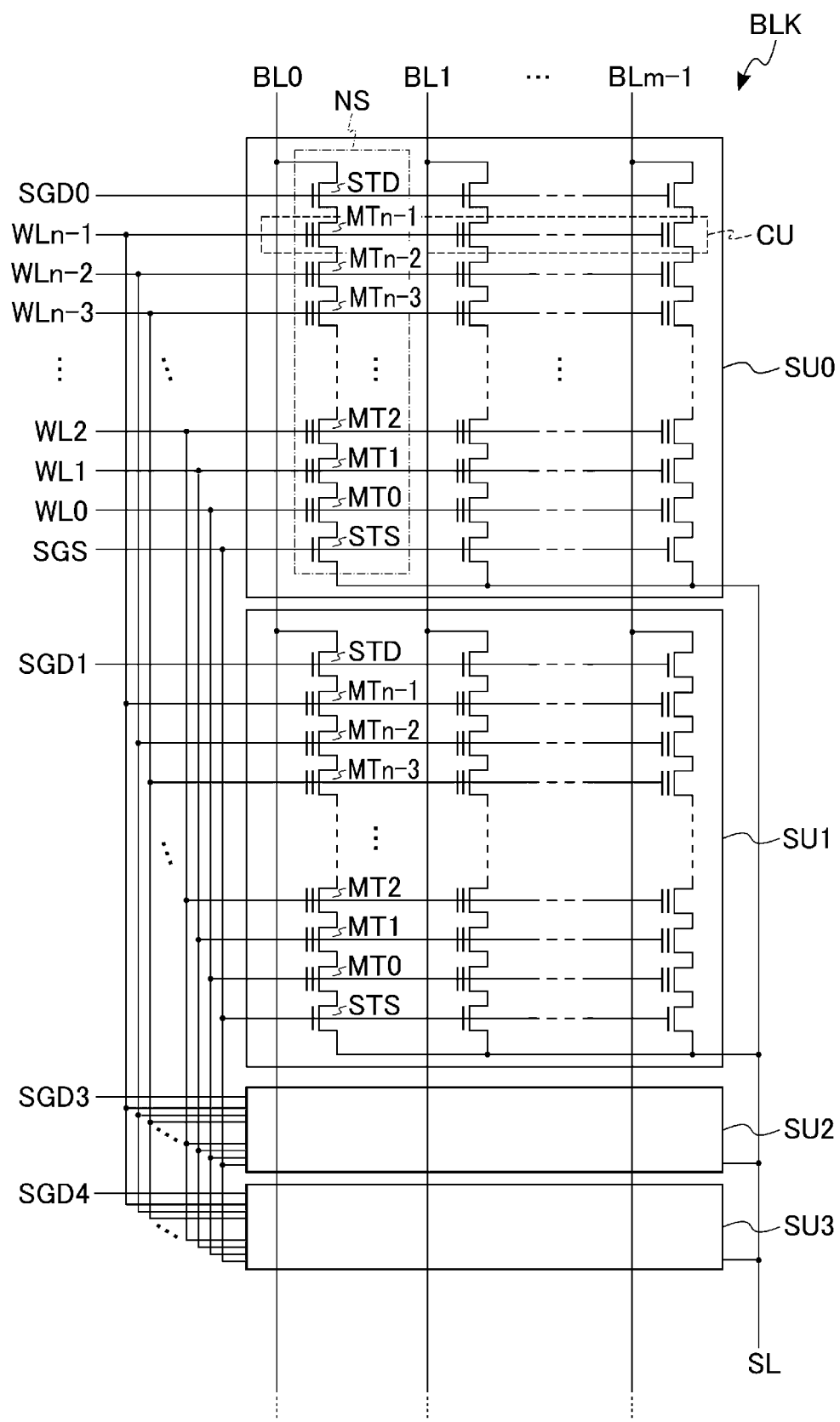
FIG. 4 is a circuit diagram illustrating a configuration example of a memory cell array of the memory device of the first embodiment.

FIG. 4 is an equivalent circuit diagram illustrating a configuration example of the memory cell array 211 in the flash memory 2 of the embodiment. FIG. 4 illustrates a circuit configuration of a certain block BLK in the memory cell array 211.

As illustrated in FIG. 4, the block BLK includes, for example, four string units SU (SU0 to SU3).

Each of the NAND strings NS includes the plurality of (n) memory cells MT (MT0 to MTn−1) and select transistors STS and STD, where n is an integer of 2 or more. The plurality of memory cells MT are connected in series between the source of the select transistor STD and the drain of the select transistor STS.

The memory cell MT stores the data in a non-volatile manner. A memory cell (also referred to as a memory cell transistor) MT is a field effect transistor having a control gate and a charge storage layer.

A gate of the select transistor STD of each string unit SU0 to SU3 is connected to the corresponding one of the plurality of select gate lines SGD0 to SGD3. A gate of the select transistor STS of each string unit SU0 to SU3 is commonly connected to, for example, a select gate line SGS. It is noted that in some embodiments the gate of each select transistor STS may be connected to the corresponding one of the plurality of the select gate lines provided in each of the plurality of string units SU0 to SU3.

The control gates of the memory cells MT0 to MTn−1 belonging to the same block BLK are connected to the corresponding word lines WL0 to WLn−1, respectively.

The drain of the select transistor STD of the NAND string NS belonging to the same column in the memory cell array 211 is connected to bit lines BL (BL0 to BLm−1), where m is an integer of 2 or more. The bit line BL is commonly connected to the NAND string NS belonging to the same column among the plurality of blocks BLK. The sources of the plurality of select transistors ST2 are commonly connected to a source line SL.

The string unit SU is a group of the NAND strings NS connected to different bit lines BL and connected to the same select gate line SGD. In the following, in a certain string unit SU, a set CU of memory cells MT commonly connected to the same word line WL is also referred to as a cell unit CU. The block BLK is a group of the plurality of string units SU having common word lines WL. The memory cell array 211 is a group of the plurality of blocks BLK having common bit lines BL.

Figure 5:
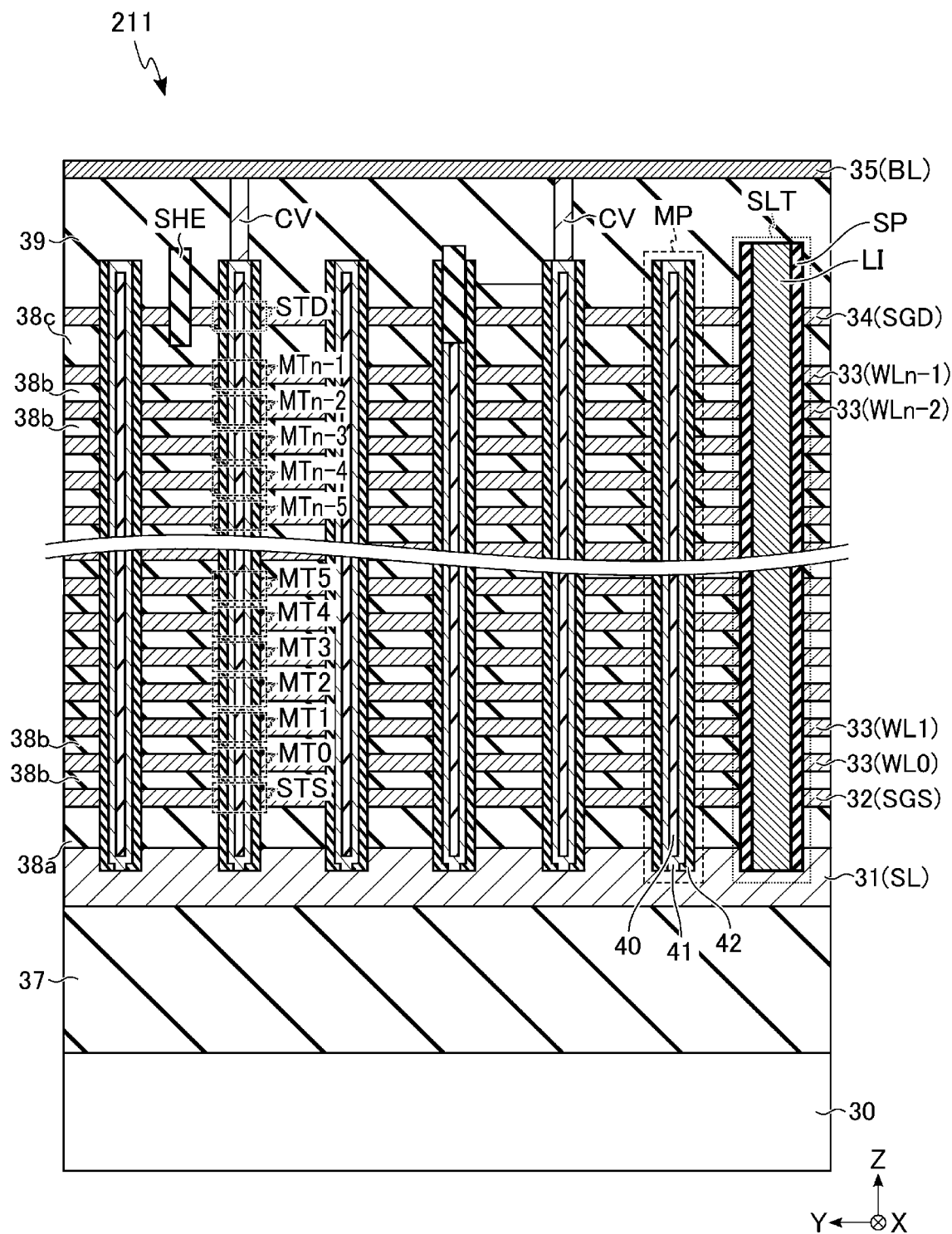
FIG. 5 is a cross-sectional view illustrating the configuration example of the memory cell array of the memory device of the first embodiment.

FIG. 5 is a schematic cross-sectional view illustrating a structure example of the memory cell array in the flash memory 2 of the embodiment.

As illustrated in FIG. 5, the memory cell array 211 includes a semiconductor substrate (hereinafter, also simply referred to as a substrate) 30, a plurality of conductive layers 31, 32, 33, and 34, a plurality of insulating layers 37, 38 (38a, 38b, and 38c), and 39, and a plurality of memory pillars MP. The memory cell array 211 has a structure in which the plurality of conductive layers 32, 33, and 34 are stacked in the direction (Z direction) perpendicular to the upper surface of the substrate 30. For example, the conductive layers 32, 33, and 34 contain tungsten.

The insulating layer 37 is provided on the upper surface of the semiconductor substrate 30. For example, when circuits (not illustrated) corresponding to the sense amplifier circuit 212, the row control circuit 213, the sequencer 25, and the like are provided on the semiconductor substrate 30, the insulating layer 37 covers the circuits 25, 211, and 212 on the semiconductor substrate 30.

The conductive layer 31 is provided on the upper surface of the insulating layer 37. The conductive layer 31 is, for example, a plate-like layer extending along the X-Y plane substantially parallel to the upper surface of the semiconductor substrate 30. The conductive layer 31 is used as a source line SL. The conductive layer 31 contains, for example, phosphorus-doped silicon.

The insulating layer 38a is provided on the upper surface of the conductive layer 31. The conductive layer 32 is provided on the upper surface of the insulating layer 38a. The conductive layer 32 is, for example, a plate-shaped layer extending along the X-Y plane. The conductive layer 32 is used as a select gate line SGS.

Above the conductive layer 32 in the Z direction, the insulating layer 38b and the conductive layer 33 are alternately stacked in the Z direction. The conductive layer 33 is, for example, a plate-shaped layer extending along the X-Y plane. The plurality of stacked conductive layers 33 are used as word lines WL0 to WLn−1 in order from the semiconductor substrate 30 side.

The conductive layer 34 is provided above the uppermost conductive layer 33 via the insulating layer 38c. The conductive layer 34 is, for example, a plate-shaped layer extending along the X-Y plane. The conductive layer 34 is used as a select gate line SGD.

The conductive layer 35 is provided above the conductive layer 34 via the insulating layer 39. The conductive layer 35 has, for example, has a line-shape extending in the Y direction. The conductive layer 35 is used as a bit line BL. The plurality of conductive layers 35 are arranged along the X direction in the depth direction of the paper surface of FIG. 5. The conductive layer 35 contains, for example, copper.

Each of the memory pillars MP is provided in a stacked body including the plurality of conductive layers 32, 33, and 34. The memory pillar MP extends through the stacked body along in the Z direction and penetrates the plurality of insulating layers 38 and the plurality of conductive layers 32, 33, and 34. The bottom of the memory pillar MP is in contact with the conductive layer 31. A portion where the memory pillar MP and the conductive layer 32 intersect functions as a select transistor STS. Each portion where the memory pillar MP and one conductive layer 33 intersect functions as one memory cell MT. A portion where the memory pillar MP and the conductive layer 34 intersect functions as a select transistor STD.

Each of the memory pillars MP includes, for example, a core layer 40, a semiconductor layer 41, and a stacked film 42.

The core layer 40 is, for example, an insulator and extends in the Z direction.

The semiconductor layer 41 covers the periphery of the core layer 40. In a lower portion of the memory pillar MP, a portion of the semiconductor layer 41 is in contact with the conductive layer 31. Accordingly, the semiconductor layer 41 is electrically connected to the conductive layer 31 (which corresponds to the source line SL). In an upper portion of each memory pillar MP, an upper portion of the semiconductor layer 41 is in contact with one conductive layer 35 via a contact CV. Accordingly, the semiconductor layer 41 is electrically connected to the conductive layer 35 (which corresponds to one bit line BL). The semiconductor layer 41 contains, for example, silicon.

The stacked film 42 covers the side surface and the bottom surface of the semiconductor layer 41 except for the portion where the semiconductor layer 41 and the conductive layer 31 are in contact with each other. The stacked film 42 includes, for example, a tunnel insulating film (not illustrated), a charge trap film (not illustrated), and a block insulating film (not illustrated). The tunnel insulating film is provided between the semiconductor layer 41 and the charge trap film. The charge trap film is provided between the tunnel insulating film and the block insulating film. The block insulating film is provided between the charge trap film and the conductive layers 32, 33, and 34. The charge trap film contains, for example, silicon nitride.

A slit SLT is provided in the stacked body including the conductive layers 32, 33, and 34. The slit SLT has a portion provided along, for example, an X-Z plane. The slit SLT separates the adjacent conductive layers 32, 33, and 34 from each other in the Y direction. A contact LI in the slit SLT is provided in the slit SLT. A lower end of the contact LI is in contact with the conductive layer 31. The contact LI is used as, for example, a portion of the source line SL. A spacer SP is provided between the contact LI and the conductive layers 32, 33, and 34. The spacer SP separates and insulates the contact LI from the conductive layers 32, 33, and 34.

A slit SHE divides the adjacent conductive layers 34 in the Y direction.

In each of the above-mentioned memory pillars MP, the semiconductor layer 41 is used as a channel region of the memory cell MT and the select transistors STD and STS. The charge trap film of the stacked film 42 is used as a charge storage layer of the memory cell MT. The flash memory 2 can allow the current to flow through the memory pillar MP between the bit line BL and the contact LI by turning on the memory cell MT and the select transistors STD and STS. It is noted that in some embodiments silicon may be used for the charge storage layer of the memory cell MT.

It is noted that the circuit configuration and structure of the memory cell array 211 in the flash memory 2 are not limited to the circuit configuration in FIG. 4 and structure in FIG. 5.

For example, the memory pillar MP and the plurality of conductive layers 32, 33, and 34 may be provided above the well region in the semiconductor layer. In this case, at the lower portion (bottom) of the memory pillar MP, the semiconductor layer 41 is electrically connected to the well region, which is for example, a p-type semiconductor region.

A threshold voltage of the memory cell MT changes according to an amount of charge stored in the charge storage layer (charge trap film). By associating the threshold voltage of the memory cell MT with a data to be stored, one memory cell MT can store the data of one bit or more. A memory cell capable of storing a 1-bit data is referred to as a single level cell (SLC). A memory cell capable of storing a 2-bit data is referred to as a multi-level cell (MLC). A memory cell capable of storing a 3-bit data is referred to as a triple level cell (TLC). A memory cell capable of storing a 4-bit data is referred to as a quadruple level cell (QLC).

Figure 6:
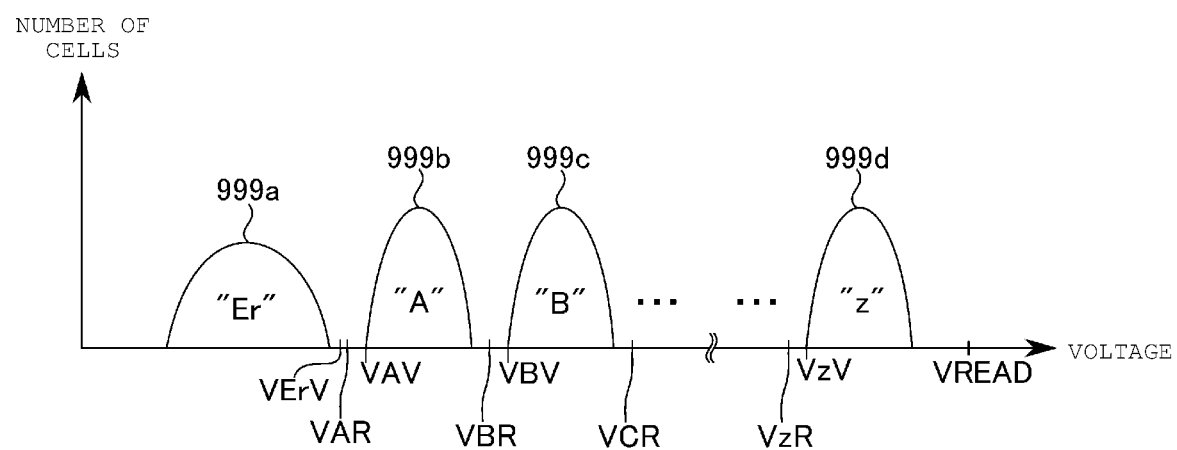
FIG. 6 is a diagram illustrating a relationship between a threshold voltage of a memory cell and data stored in the memory cell.

FIG. 6 is a diagram illustrating a relationship between data stored in the memory cell MT and the threshold voltage of the memory cell MT.

As illustrated in FIG. 6, the memory cell MT can be in one of a plurality of states in accordance with its threshold voltage. The plurality of memory cells has variations in characteristics. In consideration of the variation in characteristics, a particular data value is associated with a voltage value distribution (hereinafter, referred to as a threshold voltage distribution) 999 (999a, 999b, 999c, and 999d).

The memory cell MT may be in an erase state and one or more programmed states.

In FIG. 6, the "Er" state corresponds to an erase state (state in which the data is erased), and the "A", "B", . . . , and "z" states correspond to the programmed states (states in which data has been programmed in the memory cell). It is noted that the "z" state conveniently indicates the programmed state corresponding to the highest threshold voltage (threshold voltage distribution) among the plurality of programmed states that the memory cell MT may be in.

The SLC may be in one of two states ("Er" and "A" states). The MLC may be in one of four states ("Er", "A", "B", and "C" states). The TLC may be in one of eight states ("Er", "A", "B", . . . , "F", and "G" states). The QLC may be in one of 16 states ("0", "1", "2", . . . , "E", and "F" states.

In the example of FIG. 6, a threshold voltage distribution 999a of the memory cell MT in the "Er" state is lower than the voltage VAR. A threshold voltage distribution 999b of the memory cell MT in the "A" state is equal to or higher than the voltage VAR and is lower than the voltage VBR (>VAR). A threshold voltage distribution 999c of the memory cell MT in the "B" state is equal to or higher than the voltage VBR and is lower than the voltage VCR (>VBR). A threshold voltage distribution 999d of the memory cell MT in the "z" state is equal to or higher than the voltage VzR and is lower than the voltage VREAD.

Each of the voltages (voltage values) VAR, VBR, . . . , and VzR corresponds to the voltage used for reading data. In the following, each of the voltages VAR, VBR, . . . , and VzR is also referred to as a determination level or a read level. The voltages VAR to VGR are also collectively referred to as a read voltage VCGR. The voltage VREAD is, for example, a voltage applied to the word line WL that is not connected to a read target during the read operation (referred to herein as a non-selected word line). When the voltage VREAD is applied to the memory cell MT, the memory cell MT is turned on regardless of the data stored in the memory cell MT. The data stored in the memory cell MT is determined based on the result of turning on/off of the memory cell MT related to the applied read level.

Voltages VAV, VBV, . . . , and VzV are provided for each state for verification of the data writing. The voltage VAV is higher than the read level VAR and is lower than or equal to the lower limit of the desired threshold voltage distribution 999b in the "A" state. The voltage VBV is higher than the read level VBR and is lower than or equal to the lower limit of the desired threshold voltage distribution 999c in the "B" state. The voltage VzV is higher than the read level VzR and is lower than or equal to the lower limit of the desired threshold voltage distribution 999d in the "z" state.

A voltage VErV is provided between the threshold voltage distribution 999a in the "Er" state and the threshold voltage distribution 999b in the "A" state for verification of the data erasing. For example, the voltage VErV is lower than the voltage VAR and higher than or equal to the upper limit of the desired threshold voltage distribution 999a in the "Er" state.

In the following, each of the voltages VErV, VAV, VBV, . . . , and VGV is also referred to as a verification level.

In relation to the verification of each state, when the verification level is applied to the memory cell MT, it is determined whether the verification of each memory cell related to data writing or data erasing is a pass (or a fail) according to whether the memory cell is turned on. It is verified whether the executed operation sequence is successful according to whether the number of times of verification pass/fail of the plurality of memory cells is in the allowable range.

Referring back to FIG. 3, the sense amplifier circuit 212 and the row control circuit 213 of the plane PLN will be described.

The sense amplifier circuit 212 performs various controls related to the columns of the memory cell array 211 during various operations with respect to the plane PLN.

The sense amplifier circuit 212 senses the signal (for example, current or voltage) in accordance with the threshold voltage of the memory cell MT in the memory cell array 211 during the read sequence. Accordingly, the sense amplifier circuit 212 reads out the data. The sense amplifier circuit 212 transmits the read data to the input/output circuit 22. The sense amplifier circuit 212 transfers the write data DT to the memory cell array 211 via the bit line BL during the write sequence. For example, the sense amplifier circuit 212 includes a latch circuit (not illustrated). The latch circuit temporarily stores the signal sense result, the write data DT, and the verification result.

The row control circuit 213 performs various controls related to the row of the memory cell array 211 during various operations with respect to the plane PLN.

The row control circuit 213 includes a block decoder BD and a switch circuit SW.

The block decoder BD decodes the address ADR supplied from the sequencer 25. The block decoder BD transmits the block address of the decoding result to the switch circuit SW.

The switch circuit SW controls the electrical connection (conduction/non-conduction) between the block BLK and the driver circuit 27 based on the decoding result from the block decoder BD.

The flash memory 2 of the embodiment can execute the erase operation simultaneously (in parallel in time) with respect to the plurality of blocks BLK in a certain plane PLN. The flash memory 2 of the embodiment can use different erase conditions (for example, erase intensities of the erase voltages (which are applied in the form of erase pulses)) for each block with respect to the plurality of (two or more) blocks BLK that are erase targets (referred to as selected blocks) during the simultaneous erase operation with respect to the plurality of blocks BLK. It is noted that, it may be possible to erase the data in the block BLK (in particular, in the memory cells MC of the block BLK), by supplying an erase current (in the form of a current pulse) for data erasing to memory cells MC of the block BLK.

Configurations of various circuits related to the execution of the erase sequence in the flash memory 2 of the embodiment will be described with reference to FIGS. 7 to 10.

(a-3) Block Decoder and Switch Circuit

Figure 7:
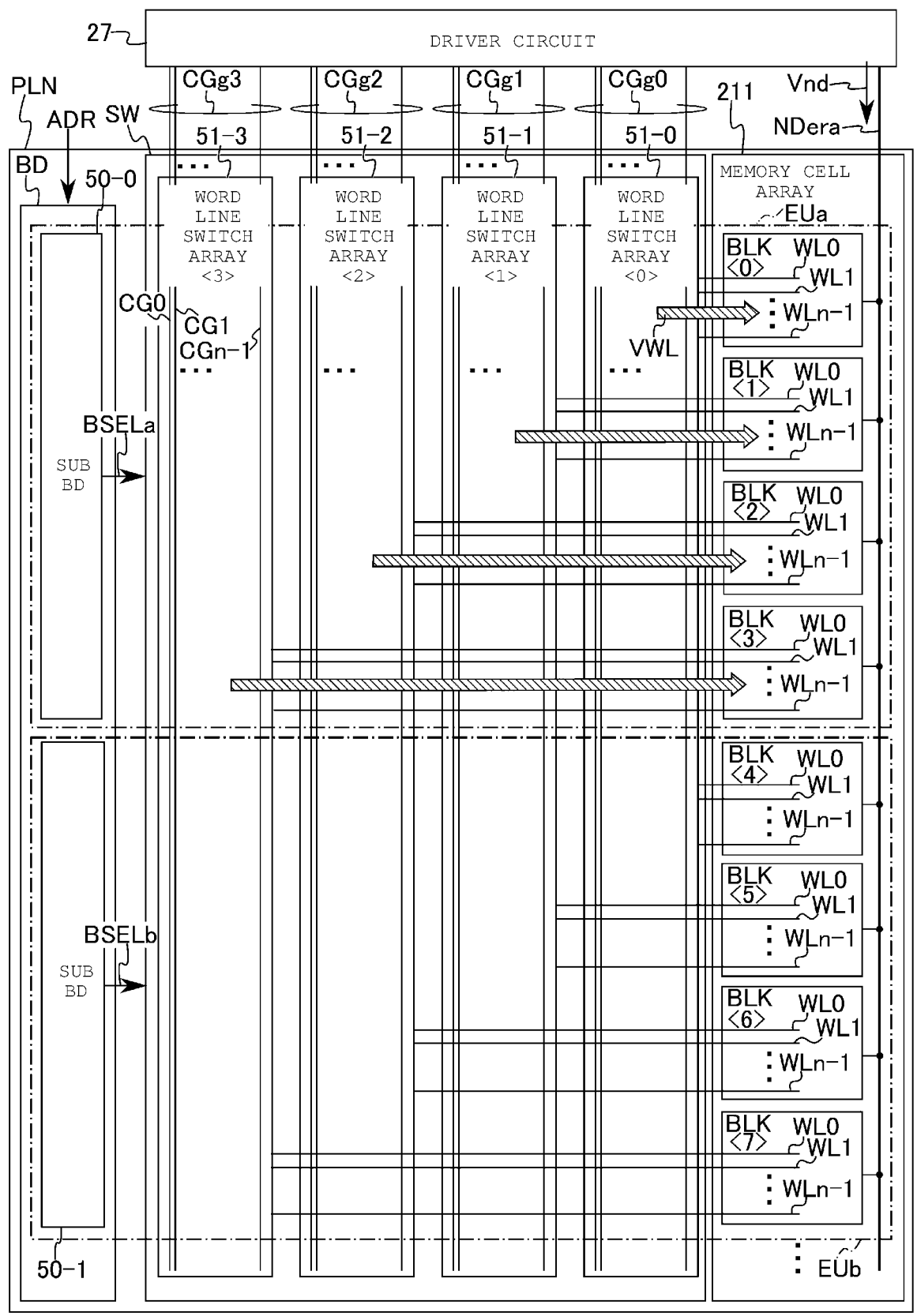
FIG. 7 is a block diagram illustrating a first configuration example of the memory device of the first embodiment.

FIG. 7 is a schematic diagram illustrating a configuration example of the block decoder BD and the switch circuit SW in the flash memory 2 of the embodiment.

In each plane PLN, the block decoder BD and the switch circuit SW control the selection and non-selection of the plurality of blocks BLK in the memory cell array 211.

The block decoder BD and the switch circuit SW control the electrical connection and separation between the memory cell array 211 (which includes a plurality of blocks BLK) and the driver circuit 27 via wiring groups CGg (CGg0, CGg1, CGg2, and CGg3).

For example, four wiring groups CGg0, CGg1, CGg2, and CGg3 are provided between the driver circuit 27 and the memory cell array 211. Each wiring group CGg includes a plurality of wirings (hereinafter, also referred to as CG lines) CG (CG0, CG1, . . . , CGn−1). The number of CG lines CG in each wiring group CGg is the same as the number of word lines WL in one block BLK.

The block decoder BD includes a plurality of sub-block decoders (SUB BD) 50 (50-0 and 50-1).

The plurality of sub-block decoders 50 receive the address ADR. Each of the plurality of sub-block decoders 50 decodes the block address of the address ADR. Each of the plurality of sub-block decoders 50 transmits the decoding result (hereinafter, also referred to as a block selection signal) BSEL (BSELa and BSELb) of the block address to the switch circuit SW.

Each sub-block decoder 50 performs management (selection/non-selection control) of blocks BLK of which number is the same as the number of wiring group CGg. For example, when the four wiring groups CGg are provided between the driver circuit 27 and the memory cell array 211, each sub-block decoder 50 is associated with the four blocks BLK. One sub-block decoder 50 is provided for each unit EU (EUa and EUb) (hereinafter, referred to as a block groups or the simultaneous selection units) of the plurality of blocks BLK that can be simultaneously selected.

Accordingly, one sub-block decoder 50 can simultaneously set one or more (herein, up to four) blocks BLK to be in the selected state (activated state) based on the decoding result.

The switch circuit SW includes a plurality of word line switch arrays 51 (51-0, 51-1, 51-2, and 51-3).

Each of the plurality of word line switch arrays 51 is connected to one corresponding group among the plurality of wiring groups CGg.

Each word line switch array 51 is electrically connected to one of the plurality of blocks BLK associated with each sub-block decoder 50 for each sub-block decoder 50. For example, a word line switch array 51-0 is electrically connected to the block BLK<0> and the block BLK<4>. A word line switch array 51-1 is electrically connected to the block BLK<1> and the block BLK<5>. A word line switch array 51-2 is electrically connected to the block BLK<2> and the block BLK<6>. A word line switch array 51-3 is electrically connected to the block BLK<3> and the block BLK<7>.

The word line switch array 51 includes a plurality of transfer gates (not illustrated). Each transfer gate is connected between one corresponding CG line CG and one corresponding word line WL. The transfer gate (which is, for example, a field effect transistor) is turned on or off based on the block selection signal BSEL from the sub-block decoder 50. The CG line CG is electrically connected to the corresponding word line WL by the transfer gate in the on state. The CG line CG is electrically separated from the corresponding word line WL by the transfer gate in the off state.

In the word line switch array 51, the plurality of transfer gates receive different decoding results (block selection signals) BLKSELa and BLKSELb for each of the sub-block decoders 50-1 and 50-2 (block groups EUa and EUb). Accordingly, even when the plurality of blocks BLK are connected to the same word line switch array 51, the transfer gate belonging to the block group EU including the block BLK corresponding to the address ADR is turned on, and the transfer gate belonging to the block group EU not corresponding to the address ADR is turned off. Therefore, the block group EU corresponding to the address ADR is electrically connected to the driver circuit 27. At this time, the block group EU not corresponding to the address ADR is electrically disconnected from the driver circuit 27.

It is noted that the switch circuit SW further includes a plurality of drain side select gate line switches (not illustrated) and a plurality of source side select gate line switches (not illustrated). Each drain side select gate line switch and each source side select gate line switch are turned on or off based on the decoding result of the address ADR. The drain side select gate line switch corresponding to the address ADR and the source side select gate line switch corresponding to the address ADR are turned on. The drain side select gate line switch that does not correspond to the address ADR and the source side select gate line switch that does not correspond to the address ADR are turned off.

Figure 8:
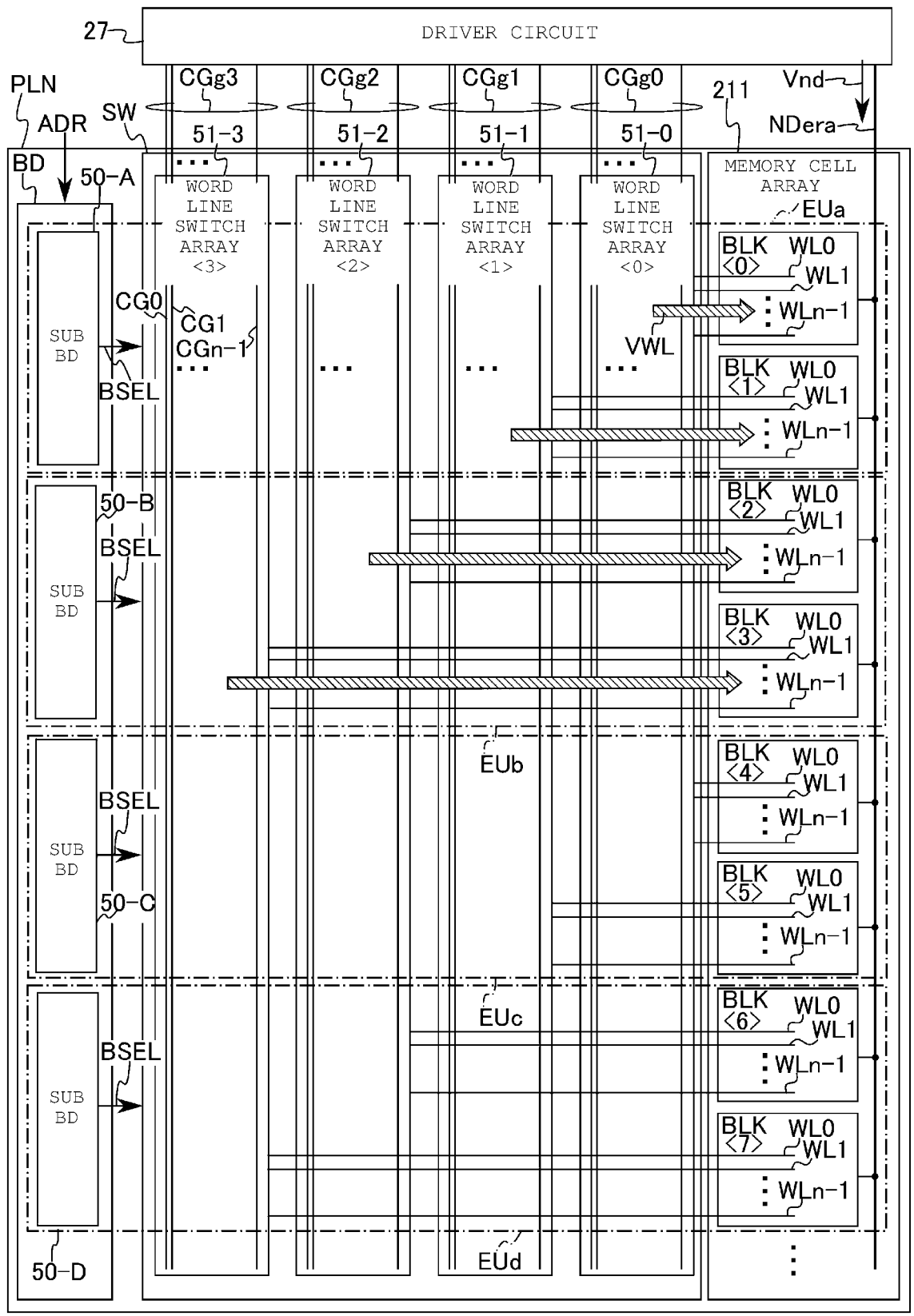
FIG. 8 is a block diagram illustrating a second configuration example of the memory device of the first embodiment.

FIG. 8 illustrates the modified example of the circuit configuration of FIG. 7.

As illustrated in FIG. 8, when four wiring groups CGg are provided, one sub-block decoder 50 may be associated with two adjacent blocks BLK. Accordingly, the selection and non-selection of the plurality of blocks BLK may be controlled with a smaller control unit EU.

For example, when the two blocks BLK0 and BLK1 are set to the selected state by a sub-block decoder 50-A and the word line switch array 51, the blocks BLK6 and BLK7 associated with a sub-block decoder 50-D may also be electrically connected to the wiring groups CGg2 and CGg3.

In addition, when the two blocks BLK0 and BLK1 selected by the sub-block decoder 50-A are electrically connected the wiring groups CGg0 and CGg1, the plurality of blocks BLK corresponding to the wiring groups CGg2 and CGg3 do not need to be electrically connected the wiring groups CGg2 and CGg3 by the word line switch array 51 controlled by the sub-block decoders 50-B and 50-D.

The driver circuit 27 is connected to the plurality of blocks BLK via the wiring group CGg and the switch circuit SW. The driver circuit 27 is connected to an erase node NDera of the memory cell array 211. The erase node NDera is commonly connected to the plurality of blocks BLK. The erase node NDera is a node (including wiring and terminal) for supplying the voltage Ve having a certain magnitude (voltage value) to the channel (e.g., semiconductor layer 41 of the memory pillar MP) of the memory cells MT during the erase operation in the erase sequence.

It is noted that, when the memory cell array 211 has the structure illustrated in FIG. 5, the erase node NDera corresponds to the source line SL and the contact LI. However, in some cases, according to the structure of the memory cell array 211, the erase node NDera may correspond to the p-type well region in the semiconductor layer (or semiconductor substrate) to which the memory pillar MP is connected.

In the embodiment, according to the configuration of FIG. 7 (and FIG. 8), during the erase sequence of the flash memory 2, the driver circuit 27 supplies a voltage Vnd of a certain magnitude (hereinafter, referred to as an erase node voltage) to the erase node NDera connected to the block BLK and supplies a voltage VWL of a certain magnitude (hereinafter, referred to as a word line voltage) to the word line WL via the wiring group CG.

The voltage in accordance with the potential difference between the erase node NDera and the word line WL is supplied as an erase voltage to the plurality of memory cells MT in the block BLK that is an erase target.

In the erase sequence, the flash memory 2 of the embodiment selects the plurality of blocks BLK as erase targets and substantially simultaneously executes the erase operations with respect to the selected plurality of blocks BLK.

The flash memory 2 of the embodiment supplies the erase voltage (in the form of an erase pulse) having different erase intensities to the plurality of blocks BLK that are erase targets by controlling the voltage of the word line WL of a certain block BLK among the plurality of blocks BLK that are erase targets.

In the following, among the plurality of blocks BLK selected as the erase target of the erase sequence, a main target of the erase sequence is referred to as a primary block (BLKprm). For example, the erase voltage having a default value of the erase intensity is supplied to the primary block (BLKprm).

Further, among the plurality of blocks BLK selected as the target of the erase sequence, the block in which the command and the address are transmitted and received after the command and the address of the primary block (BLKprm) are transmitted and received is referred to as a secondary block (BLKsnd). For example, the erase voltage having the erase intensity changed from the default value by the control described later is supplied to the secondary block (BLKsnd).

(a-4) Erase Sequence Control Circuit and Driver Circuit

Figure 9:
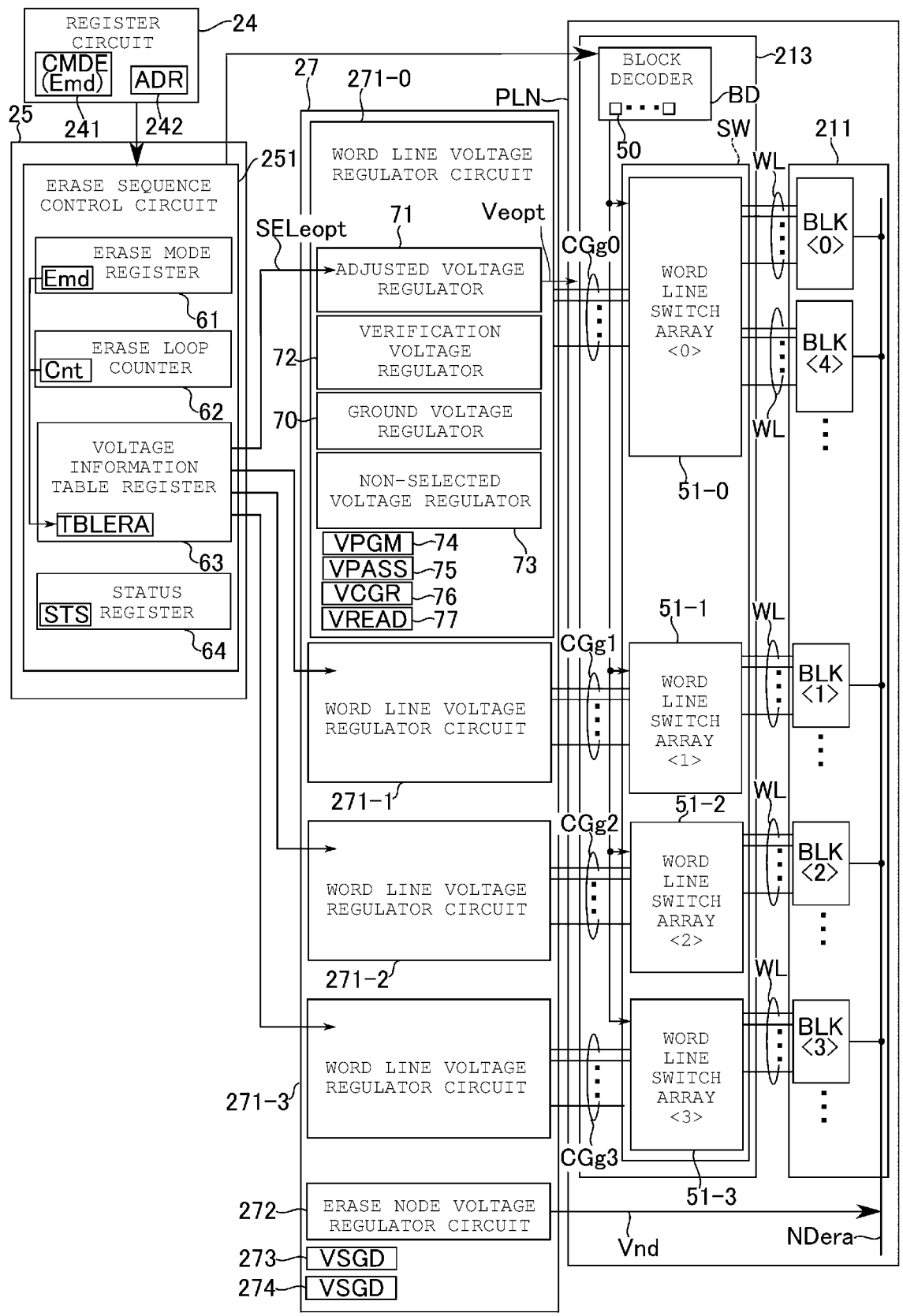
FIG. 9 is another block diagram illustrating the second configuration example of the memory device of the first embodiment.

FIG. 9 is a schematic diagram illustrating a configuration example of the erase sequence control circuit 251 and the driver circuit 27 in the memory system of the embodiment.

As illustrated in FIG. 9, the erase sequence control circuit 251 includes an erase mode register 61, an erase loop counter 62, a voltage information table register 63, and a status register 64. The erase sequence control circuit 251 is, for example, a circuit (or a functional block) in the sequencer 25. However, in some cases, the erase sequence control circuit 251 may include not only a circuit in the sequencer 25 but also, for example, a data storage area of the register circuit 24.

The erase mode register 61 stores an erase mode Emd. The erase mode Emd is transmitted to the flash memory 2 together with the command set including an erase command CMDE. The erase command CMDE is stored in the command register 241. It is noted that the erase mode Emd may be temporarily stored in the register circuit 24 (for example, the command register 241).

The erase mode register 61 is configured so that the plurality of erase modes Emd can be stored according to the number of blocks BLK that can be selected simultaneously. The plurality of erase mode registers 61 may be provided in the erase sequence control circuit 251 according to the number of blocks BLK that can be selected simultaneously.

The erase mode Emd contains information indicating various conditions (for example, an erase intensity) of the erase operation to be executed in a certain block BLK in the erase sequence. The erase mode Emd is represented by, for example, several bits of data (code). In the following, the information on the erase intensity of the erase voltage indicated by the erase mode Emd is also referred to as erase intensity information.

For example, the erase mode Emd is transmitted to the flash memory 2 as a signal set (for example, a prefix command) different from the erase command CMDE. However, in some cases, the erase mode Emd may be provided in an erase command CMDE2. It is noted that the erase mode Emd having a code indicating that the erase condition of the erase operation to be executed is a default condition may be provided in the erase command CMDE.

The erase loop counter 62 counts the number (count value) Cnt of erase loops (LP) in the erase sequence that is being executed. One erase loop includes one erase operation (supply of erase voltage) and a verification operation (hereinafter, referred to as erase verification) related to the erase operation with respect to each of the blocks BLK with respect to which the erase operation is executed. In the following, the count value (number of erase loops) Cnt of the erase loops is also referred to as erase loop number information.

The table register 63 stores a table TBLERA for controlling the conditions of the erase operation with respect to the plurality of selected blocks BLK (BLKprm and BLKsnd).

The table TBLERA includes, for example, the plurality of codes eopt indicating the conditions (for example, the erase intensity) of the erase operation. In the following, the table TBLERA will be referred to as a voltage information table TBLERA.

FIG. 10 is a schematic diagram illustrating an example of the voltage information table TBLERA in the flash memory 2 of the embodiment.

As illustrated in FIG. 10, the voltage information table TBLERA includes a plurality of codes (hereinafter, also referred to as adjusted voltage codes or control codes) eopt. For example, the code eopt is a 3-bit data (signal set, DAC value).

Each of the adjusted voltage codes eopt indicates the word line voltage VWL to be applied in the selected block BLK in the erase operation of the erase sequence.

The adjusted voltage code eopt of "000" is a code indicating a voltage value Veopt0 of the word line voltage VWL at which the erase intensity of the erase voltage supplied to the secondary block BLKsnd becomes smaller than an erase intensity (VERA0) of an erase voltage (EP0) used in a first erase loop (LP0) of the primary block BLKprm.

The adjusted voltage code eopt of "001" is a code indicating a voltage value Veopt1 of the word line voltage VWL at which the erase intensity of the erase voltage supplied to the secondary block BLKsnd becomes smaller than an erase intensity (VERA1) of an erase voltage (EP1) used in a second erase loop (LP1) of the primary block BLKprm.

The adjusted voltage code eopt of "010" is a code indicating a voltage value Veopt2 of the word line voltage VWL at which the erase intensity of the erase voltage supplied to the secondary block BLKsnd becomes smaller than an erase intensity (VERA2) of an erase voltage (EP2) used in a third erase loop (LP2) of the primary block BLKprm.

The adjusted voltage code eopt of "011" is a code indicating a voltage value Veopt3 of the word line voltage VWL for supplying to the secondary block BLKsnd the erase voltage having an erase intensity corresponding to the erase intensity (VERA0) of the erase voltage (EP0) used in the first erase loop (LP0) of the primary block BLKprm, when the erase node voltage Vnd has a voltage value used during the second erase loop (LP1) of the primary block BLKprm.

The adjusted voltage code eopt of "100" is a code indicating a voltage value Veopt4 of the word line voltage VWL for supplying to the secondary block BLKsnd the erase voltage having an erase intensity corresponding to the erase intensity (VERA0) of the erase voltage (EP0) used in the first erase loop (LP0) of the primary block BLKprm, when the erase node voltage Vnd has a voltage value used during the third erase loop (LP2) of the primary block BLKprm.

The adjusted voltage code eopt of "101" is a code indicating a voltage value Veopt5 of the word line voltage VWL for supplying to the secondary block BLKsnd the erase voltage having an erase intensity smaller than the erase intensity (VERA0) of the erase voltage (EP0) used in the first erase loop (LP0) of the primary block BLKprm, when the erase node voltage Vnd has a voltage value used during the second erase loop (LP1) of the primary block BLKprm.

The adjusted voltage code eopt of "110" is a code indicating a voltage value Veopt6 of the word line voltage VWL for supplying to the secondary block BLKsnd the erase voltage having the erase intensity smaller than the erase intensity (VERA0) of the erase voltage (EP0) used in the first erase loop (LP0) of the primary block BLKprm, when the erase node voltage Vnd has a voltage value used during the third erase loop (LP2) of the primary block BLKprm.

The adjusted voltage code eopt of "111" is a code indicating, for example, that the adjustment of the word line voltage VWL of the secondary block BLKsnd is not performed or the default voltage value (for example, a voltage VSS) is output. During the erase operation, the adjusted voltage code eopt of "111" may be supplied to a word line voltage regulator circuit 271 of the primary block BLKprm.

In one embodiment, when Emd is set to 0, indicating that an erase intensity less than the default intensity is to be applied to the secondary blocks as depicted below in FIG. 20: the adjusted voltage code of '000' is selected when cnt=1; the adjusted voltage code of '001' is selected when cnt=2; and the adjusted voltage code of '010' is selected when cnt=3. When Emd is set to 1, indicating that an erase intensity equal to the erase intensity of the first loop is to be applied to the secondary blocks as depicted below in FIG. 21: the adjusted voltage code of '111' is selected when cnt=1; the adjusted voltage code of '011' is selected when cnt=2; and the adjusted voltage code of '100' is selected when cnt=3. When Emd is set to 2, indicating that an erase intensity less than the erase intensity of the first loop is to be applied to the secondary blocks: the adjusted voltage code of '000' is selected when cnt=1; the adjusted voltage code of '101' is selected when cnt=2; and the adjusted voltage code of '110' is selected when cnt=3. When no adjustment to the erase intensity is to be made, Emd is set to 3 and the word line voltage VWL is set to VSS. Therefore, when Emd is set to 3, the adjusted voltage code of '111' is selected for all values of cnt.

It is noted that the voltage information table TBLERA is stored in a specific storage area of a certain block BLK of the flash memory 2. The voltage information table TBLERA is read from the block BLK and stored in the table register 63 when the memory system 90 is turned on. However, in some cases, the voltage information table TBLERA may be provided from the memory controller 1 (or the host device 91).

Referring back to FIG. 9, the status register 64 temporarily stores the signal set (hereinafter, also referred to as a status code) indicating the status of the operation that has been executed or is being executed in the flash memory 2 (for example, the operation result of the plurality of blocks and the result of the erase verification of the plurality of blocks).

The erase sequence control circuit 251 may be provided for each plane PLN so that the plurality of planes PLN can operate independently of each other.

The driver circuit 27 includes a plurality of word line voltage regulator circuits 271 (271-0, 271-1, 271-2, and 271-3).

Each of the plurality of word line voltage regulator circuits (also referred to as sub-drivers) 271 corresponds to one of the plurality of word line switch arrays 51. The word line voltage regulator circuit 271-0 is connected to the word line switch array 51-0. The word line voltage regulator circuit 271-1 is connected to the word line switch array 51-1. The word line voltage regulator circuit 271-2 is connected to the word line switch array 51-2. The word line voltage regulator circuit 271-3 is connected to the word line switch array 51-3.

Each word line voltage regulator circuit 271 includes a plurality of regulators 70, 71, 72, 73, 74, 75, and 76.

Each of the regulators 70, 71, 72, 73, 74, 75, and 76 outputs various voltages used to control the corresponding block BLK during the execution of the operation sequence to the word line WL via the CG line group CGg and the word line switch array 51.

A ground voltage regulator 70 outputs the ground voltage VSS in the erase operation or the like of the erase sequence.

A verification voltage regulator 72 outputs the verification voltage including a desired verification level during the verification operation of the erase sequence (referred to herein as erase verification) or during the verification operation of the write sequence (referred to herein as program verification).

The non-selected voltage regulator 73 outputs the non-selected voltage to the non-selected block in the erase operation and erase verification of the erase sequence. For example, the verification voltage used for program verification is used as a non-selected voltage of the erase sequence. However, in some cases, the voltage other than the verification voltage may be used as a non-selected voltage in the erase sequence.

In the embodiment, the adjusted voltage regulator 71 outputs an adjusted voltage Veopt having a certain voltage value as the word line voltage VWL based on a selected adjusted voltage code SELeopt in order to adjust (control) the erase intensity of a certain block BLK in the erase operation of the erase sequence. The adjusted voltage Veopt is applied to the plurality of word lines WL of a certain block BLK via the CG line group CGg and the word line switch array 51.

As described above, each word line voltage regulator circuit 271 outputs the word line voltage VWL having a voltage value set in accordance with the adjusted voltage code eopt (SELeopt) and supplied by the adjusted voltage regulator 71, to the corresponding block BLK via the word line switch array 51.

It is noted that the plurality of adjusted voltage regulators 71 may be provided in the regulator circuit 271 so as to correspond to the plurality of respective voltages Veopt based on the above-mentioned adjusted voltage code eopt. The adjusted voltage regulator 71 may control and output the magnitude of the voltage supplied from the voltage generation circuit 26 based on the selected adjusted voltage code eopt. Alternatively, the adjusted voltage regulator 71 may select one of the plurality of adjusted voltages Veopt supplied from the voltage generation circuit 26 based on the selected adjusted voltage code eopt. Furthermore, the voltage generation circuit 26 may generate the adjusted voltage corresponding to the adjusted voltage code eopt based on the selected adjusted voltage code eopt and supply the adjusted voltage to the adjusted voltage regulator 71.

The regulator circuit 271 further includes the plurality of regulators 74, 75, 76, and 77 for various operation sequences that can be executed by the flash memory 2. The regulator 74 outputs a program voltage VPGM during the program operation in the write sequence. The regulator 75 outputs a non-selected voltage VPASS during the program operation. The regulator 76 outputs a read voltage VCGR that includes one or more read levels in the read sequence. The regulator 77 outputs a non-selected voltage VREAD during the read sequence.

The driver circuit 27 further includes a plurality of regulator circuits 272, 273, and 274 in addition to the plurality of word line voltage regulator circuits 271 provided for each of the word line switch arrays 51.

The erase node voltage regulator circuit 272 outputs the voltage Vnd for the erase operation of the erase sequence to the erase node (source line or well region) NDera.

During the execution of various operation sequences, the drain-side select gate line voltage regulator circuit 273 outputs a select gate line voltage VSGD corresponding to the operation to be executed to the drain-side select gate line SGD of the selected and non-selected blocks.

During the execution of various operation sequences, the source-side select gate line voltage regulator circuit 274 outputs a select gate line voltage VSGS corresponding to the operation to be executed to the source-side select gate line SGS of the selected and non-selected blocks.

For example, the plurality of regulator circuits 271, 272, 273, and 274 are provided for each plane PLN so that the plurality of planes PLN can operate independently of each other.

In the flash memory 2 of the embodiment, during the execution of the erase sequence, the erase sequence control circuit 251 selects one of the plurality of adjusted voltage codes eopt in the voltage information table TBLERA corresponding to the block BLK, based on the erase mode (erase intensity information) Emd in the erase mode register 61 and the count value (erase loop number information) Cnt in the erase loop counter 62. The erase sequence control circuit 251 transmits the selected adjusted voltage code eopt to the driver circuit 27.

In the driver circuit 27, the adjusted voltage code eopt is supplied to the plurality of regulator circuits 271. The adjusted voltage regulator circuit 271 outputs the adjusted voltage Veopt supplied to the word lines WL in the selected block BLK to the word line switch array 51 based on the adjusted voltage code eopt.

The block decoder BD transmits the decoding result of the address ADR to the switch circuit SW.

The switch circuit SW receives the decoding result of the address ADR. In the switch circuit SW, the decoding result of the address ADR is supplied to each of the word line switch arrays 51.

Each of the word line switch arrays 51 connects any one of the corresponding plurality of blocks BLK to the driver circuit 27 based on the supplied decoding result.

As a result, among the plurality of blocks BLK in a certain plane PLN, the plurality of blocks BLK that are target of the erase operation are selected. At this time, the block that is not a target of the erase operation is not selected.

In addition, among the plurality of blocks BLK in the plane PLN including the primary block BLKprm, one or more blocks BLK connected to the word line switch array 51 different from the word line switch array 51 to which the primary block BLKprm is connected, is selected as a secondary block BLKsnd.

(b) Concept

A concept of the flash memory 2 of the embodiment will be described with reference to FIGS. 11 and 12.

As described above, the flash memory 2 of the embodiment simultaneously executes the erase operation with respect to the plurality of blocks BLK during the erase sequence.

Figure 11:
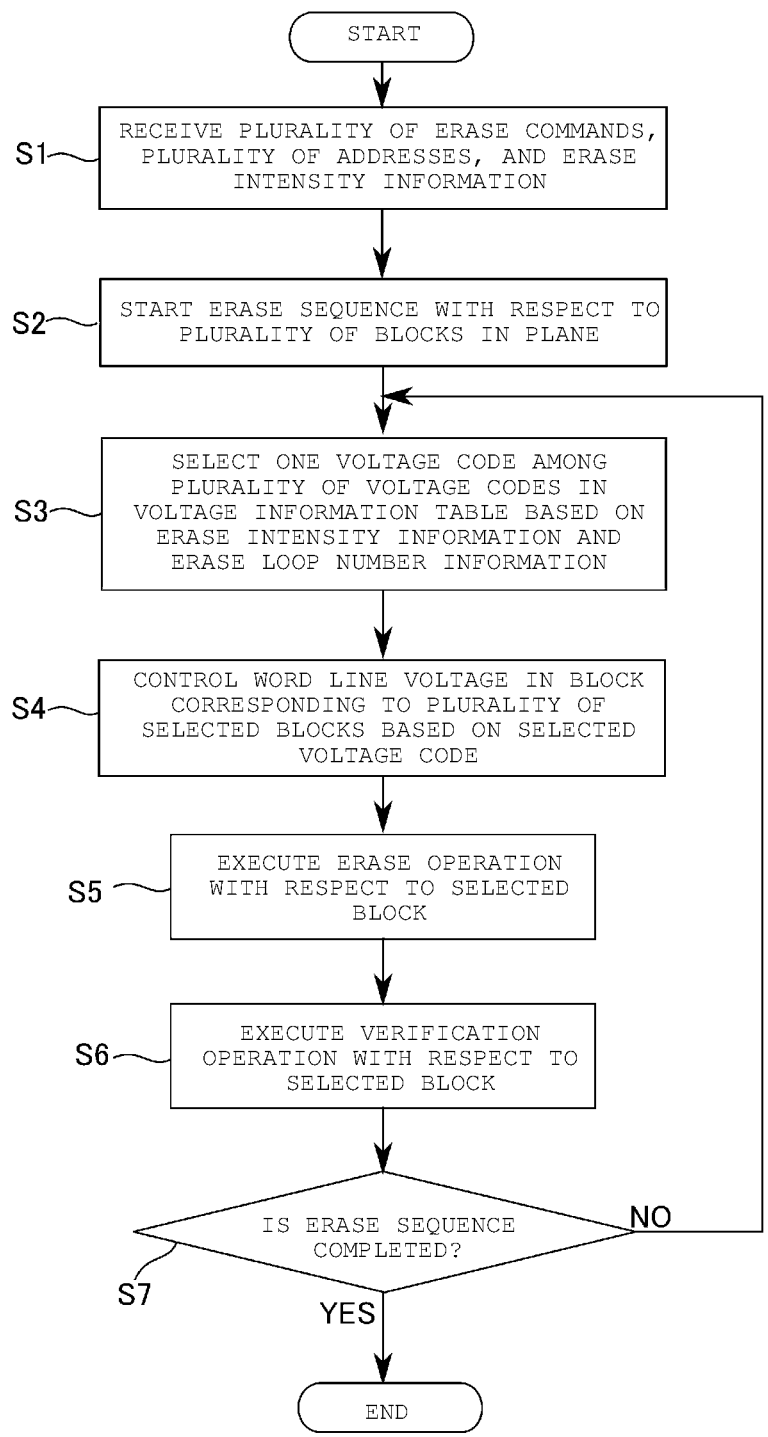
FIG. 11 is a flowchart illustrating an erase sequence performed in the memory device of the first embodiment.

FIG. 11 is a flowchart illustrating the concept of the erase sequence of the flash memory 2 of the embodiment.

[S1]

As illustrated in FIG. 11, during the execution of a certain erase sequence, the flash memory 2 receives the plurality of erase commands CMDE and the plurality of addresses ADR with respect to the certain plane PLN. The flash memory 2 receives the erase intensity information Emd together with the erase command CMDE and the address ADR. However, in some cases, the erase intensity information Emd may not be transmitted from the memory controller 1 to the flash memory 2 according to the erase sequence to be executed.

[S2]

The flash memory 2 executes the erase sequence for the plurality of blocks BLK in a certain plane PLN based on the erase command CMDE and the address ADR.

[S]

The flash memory 2 selects the adjusted voltage code eopt in the voltage information table TBLERA based on the erase intensity information (Emd) and the erase loop number information (erase loop count value Cnt).

[S4]

The flash memory 2 determines the voltage (voltage value) Veopt applied to the word line WL in one or more blocks BLKsnd among the plurality of selected blocks BLKprm and BLKsnd based on the selected adjusted voltage code SELeopt.

[S5]

The flash memory 2 simultaneously executes the erase operations in the erase loops of the erase sequences for the plurality of selected blocks BLKprm and BLKsnd.

In each of the plurality of selected blocks BLKprm and BLKsnd, the flash memory 2 applies the erase node voltage Vnd to the erase node (well region or source line) NDera and applies the word line voltage VWL in accordance with the erase intensity determined in accordance with [S4] to the word line WL. Accordingly, the erase voltage (in the form of an erase pulse) having an erase intensity corresponding to a voltage difference between the erase node voltage Vnd and the word line voltage VWL is applied to each of the selected blocks BLKprm and BLKsnd.

Figure 12:
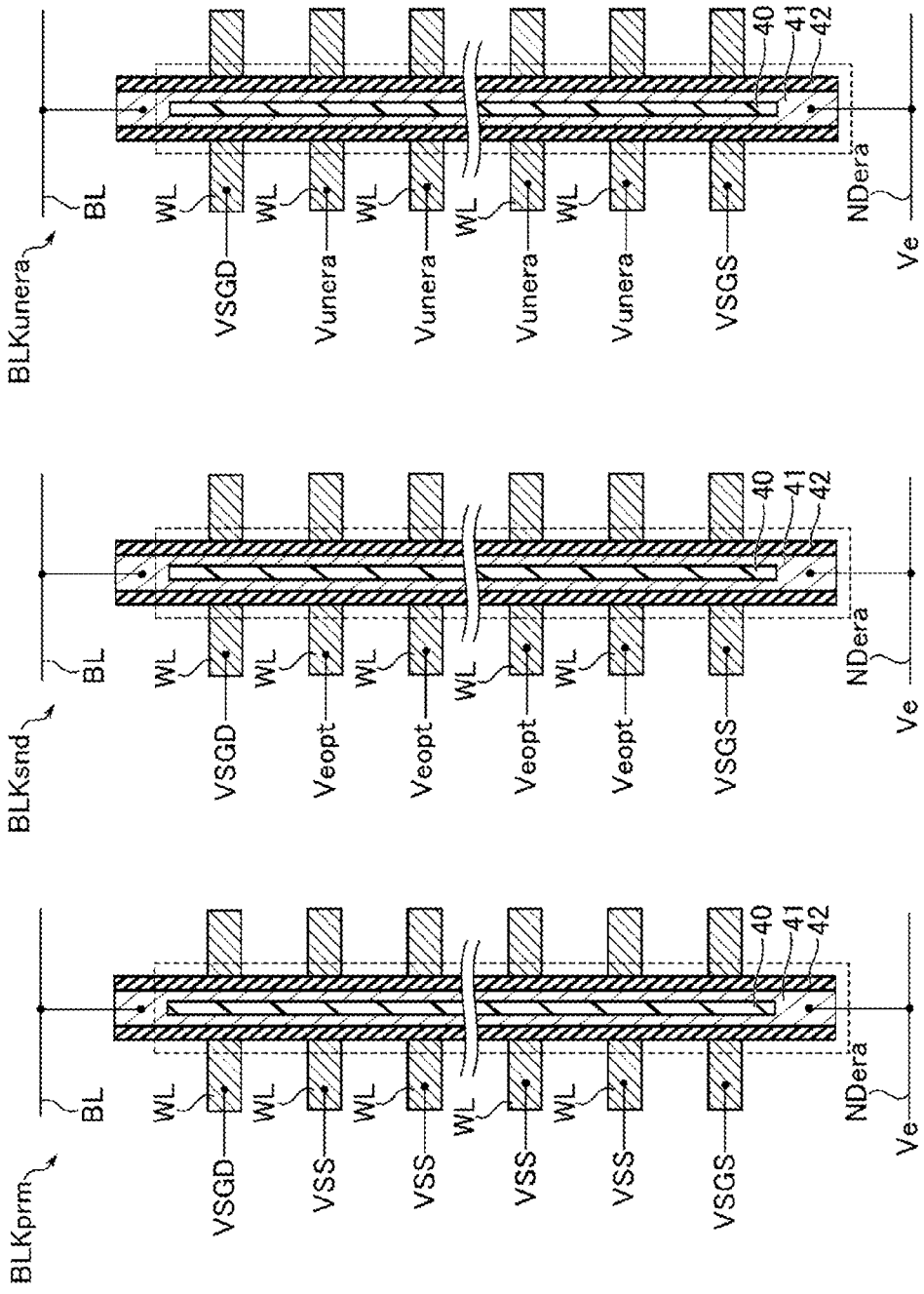
FIGS. 12A-12C are schematic diagrams illustrating the operation example of the memory device of the first embodiment.

FIG. 12 is a schematic diagram illustrating a potential state of the block in the erase operation in the flash memory 2 of the embodiment.

As illustrated in FIGS. 12A, 12B, and 12C, the flash memory 2 applies the erase node voltage Vnd having a certain voltage value Ve to the erase node NDera to which the plurality of blocks BLK (BLKprm, BLKsnd, and BLKunsel) in a certain plane PLN are commonly connected.

As illustrated in FIG. 12A, the flash memory 2 applies the ground voltage VSS to the word lines WL of the selected block BLKprm. Accordingly, the erase voltage EP is supplied to the selected block BLKprm. The erase intensity of the erase voltage EP supplied to the selected block BLKprm corresponds to the difference between the word line voltage VWL (here, the ground voltage VSS) and the erase node voltage Vnd (voltage value Ve).

As illustrated in FIG. 12B, the flash memory 2 applies an adjusted voltage Veopt to the word lines WL of the selected block BLKsnd. The adjusted voltage Veopt has a positive voltage value (>VSS). Accordingly, the erase voltage EP is supplied to the selected block BLKsnd. The erase intensity of the erase voltage EP supplied to the selected block BLKsnd corresponds to the difference between the erase node voltage Vnd (voltage value Ve) and the adjusted voltage Veopt. For example, the erase intensity of the erase voltage EP in the block BLKsnd where the voltage Veopt is applied to the word lines WL is smaller than the erase intensity of the erase voltage in the block BLKprm where the ground voltage VSS is applied to the word lines WL.

As illustrated in FIG. 12C, the flash memory 2 applies a non-selected voltage Vunera to the word lines WL of the non-selected block BLKunsel. The non-selected voltage Vunera has a positive voltage value (>VSS) and is higher than, for example, the adjusted voltage Veopt. For example, the potential difference between the non-selected voltage Vunera and the erase node voltage VND has a large enough magnitude that the electrons in the charge storage layer of the stacked film 42 do not substantially move from the charge storage layer to the semiconductor layer 41 (or a large enough magnitude that holes do not inject into the charge storage layer).

As described above, in the embodiment, even when the erase node voltage Vnd having a certain voltage value is commonly applied to the plurality of selected blocks BLKprm and BLKsnd, the word line voltage VWL is different among the plurality of selected blocks BLKprm and BLKsnd. As mentioned above, the erase intensity is based on the potential difference between the erase node NDera and the word line WL.

Therefore, in the embodiment, each of the plurality of erase voltages EP having different erase intensities is supplied to each of the plurality of selected blocks BLKprm and BLKsnd.

It is noted that, in some cases, in all of the selected blocks BLKprm and BLKsnd, the ground voltage VSS may be used for the word line voltage VWL as in illustrated in FIG. 12A. Accordingly, the erase voltage EP having the same erase intensity is supplied to the plurality of selected blocks BLKprm and BLKsnd. It is noted that, in some cases, the adjusted voltage Veopt may be supplied to the word lines WL of the primary block BLKprm according to a change over time in the characteristics of the block BLK (for example, a deterioration of the characteristics of the block BLK).

[S6]

After the erase operation, the flash memory 2 executes the verification operation (erase verification) related to the erase operation with respect to the selected blocks BLKprm and BLKsnd. The erase verification is sequentially executed for each of the selected blocks BLKprm and BLKsnd.

[S7]

The flash memory 2 determines whether the erase sequence is completed.

For example, when the flash memory 2 determines that the result of the erase verification with respect to a certain block (for example, the primary block BLKprm) among the plurality of selected blocks BLKprm and BLKsnd is fail (NO in S7), the flash memory 2 executes the processes of S3 to S6.

When the flash memory 2 determines that the result of the erase verification with respect to at least the primary block BLKprm among the plurality of selected blocks BLKprm and BLKsnd is pass (YES in S7), the flash memory 2 completes the erase sequence.

As described above, the flash memory 2 of the embodiment can simultaneously execute the erase operation with respect to the plurality of selected blocks BLKprm and BLKsnd during the erase sequence.

Then, the flash memory 2 of the embodiment controls the word line voltage VWL of the selected blocks BLKprm and BLKsnd based on the adjusted voltage code eopt selected based on the erase intensity information Emd and the erase loop number information Cnt from the voltage information table TBLERA. Accordingly, the flash memory 2 of the embodiment can supply the erase voltage EP having an appropriate erase intensity to each of the plurality of selected blocks BLKprm and BLKsnd.

(c) Operation Example

An operation example of the flash memory 2 of the embodiment will be described with reference to FIGS. 13 to 21.

Figure 13:
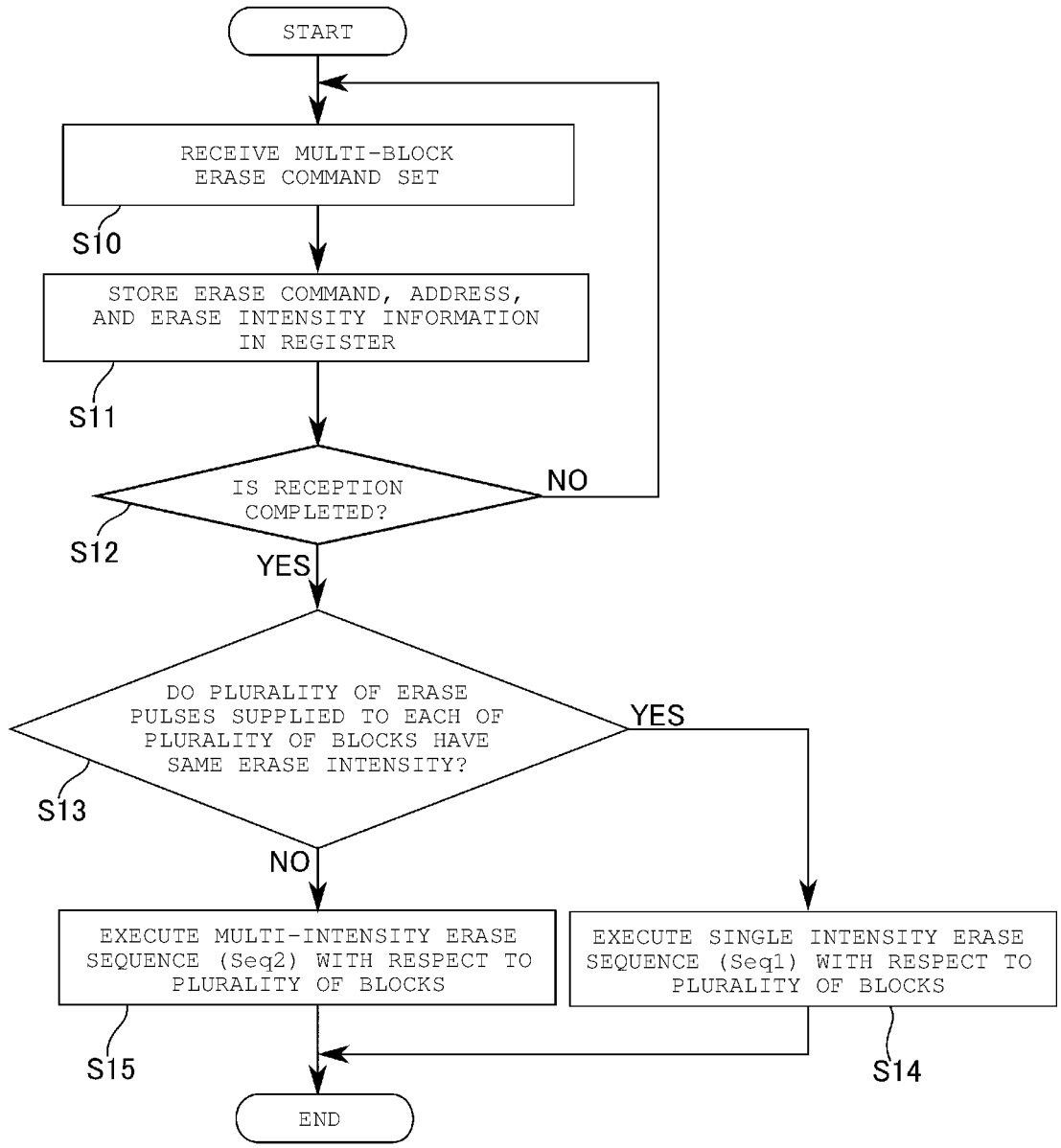
FIG. 13 is a flowchart illustrating an operation example of the memory device of the first embodiment.

FIG. 13 is a flowchart illustrating the operation example of the flash memory 2 of the embodiment. FIG. 14 is a sequence diagram illustrating the operation example of the flash memory 2 of the embodiment.

[S10]

The memory controller 1 transmits the plurality of erase commands CMDE and the plurality of addresses ADR to the flash memory 2 of the embodiment.

As illustrated in FIG. 13, the flash memory 2 of the embodiment receives the command set including the erase command CMDE and the address ADR issued by the memory controller 1.

FIG. 14 illustrates a sequence diagram of a command set CAset received by the flash memory 2 during the erase sequence.

Figures 14A, 14B:
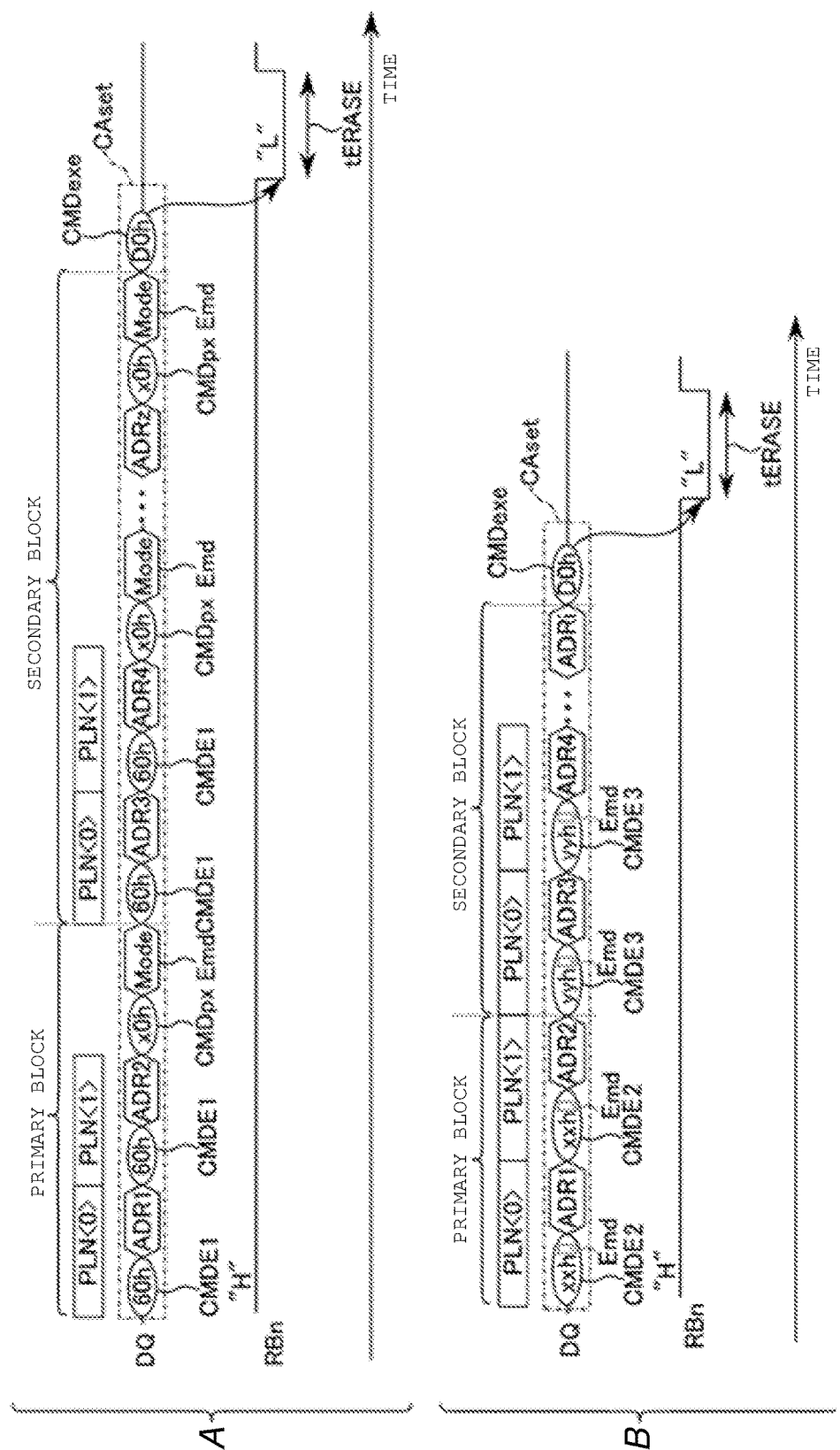
FIGS. 14A and 14B are sequence diagrams illustrating the operation example of the memory device of the first embodiment.

As illustrated in FIG. 14A, during the period when the ready/busy signal RBn is in the "H" level, an erase command CMDE1 and the address ADR for the erase sequence are transferred from the memory controller 1 to the flash memory 2.

The memory controller 1 issues a command set including the erase command (for example, "60 h") CMDE1 and the address ADR for each of the plurality of planes (for example, two planes PLN<0> and PLN<1>) in units of a plane.

When the erase sequence is simultaneously executed for the plurality of blocks BLK, the memory controller 1 transmits the plurality of erase commands CMDE1 and the plurality of addresses ADR to the flash memory 2.

When the memory controller 1 commands the erase sequence for the plurality of blocks BLK, the memory controller 1 transmits the command set CAset including one or more erase commands CMDE1 and one or more addresses ADR indicating that the erase sequence to be executed uses the plurality of blocks BLK as an erase target to the flash memory 2. In the following, the command set including the command CMDE1 and the address ADR indicating that the plurality of blocks BLK are erase targets is referred to as a multi-block erase command set (or an erase command group) CAset. In the following, the sequence in which the erase sequence is executed simultaneously (in parallel) for the plurality of blocks BLK is referred to as a multi-block erase sequence.

The flash memory 2 receives one or more command sets including the erase command CMDE1 related to each of the planes PLN<0> and PLN<1> and the address ADR of the primary block BLKprm. After the flash memory 2 receives the erase command CMDE and address ADR related to the primary block BLKprm, the flash memory 2 receives one or more command sets including the erase command CMDE1 related to each of the planes PLN<0> and PLN<1> and the address ADR of the secondary block BLKsnd.

After receiving the erase command CMDE1 and the address ADR related to the primary block BLKprm, the flash memory 2 receives a prefix command CMDpx and the code indicating the erase mode (erase intensity information) Emd. In the embodiments, Emd that is set for the primary block BLKprm is 3, so that there is no adjustment in the erase intensity and the word line voltage VWL that is applied to the primary block BLKprm is VSS.

It is noted that the erase mode Emd (and the prefix command CMDpx) is transmitted from the memory controller 1 to the flash memory 2 for the primary block BLKprm and each of the plurality of secondary blocks BLKsnd that are the targets of the erase sequence. The flash memory 2 receives one or more erase modes Emd (and the prefix command CMDpx) for the primary block BLKprm and each of the secondary blocks BLKsnd.

Subsequent to the transmission of the plurality of erase commands CMDE1, the plurality of addresses ADR, the prefix command CMDpx, and the erase mode Emd, for the primary block BLKprm and each of the secondary blocks BLKsnd, the memory controller 1 transmits an execution command CMDexe of the erase sequence to the flash memory 2.

Accordingly, the multi-block erase command set CAset is transmitted from the memory controller 1 to the flash memory 2.

The flash memory 2 receives the execution command CMDexe after receiving the plurality of erase commands CMDE1, the plurality of addresses ADR, the prefix command CMDpx, and the erase mode Emd, for the primary block BLKprm and each of the secondary blocks BLKsnd.

As illustrated in FIG. 14B, the erase mode Emd may be incorporated in the erase command (xxh) CMDE2 with respect to the primary block BLKprm and the erase command (yyh) CMDE3 with respect to the secondary block BLKsnd. By receiving the erase commands CMDE2 and CMDE3 including the erase mode Emd, the flash memory 2 can identify that the target block BLK of the erase sequence is the primary block BLKprm by the erase command CMDE2 and that the target block BLK of the erase sequence is the secondary block BLKsnd by the erase command CMDE3, and can receive the erase intensity information Emd related to the target block BLK.

It is noted that the multi-block erase command set CAset may include a plurality of erase commands CMDE1, CMDE2, and CMDE3, a plurality of addresses ADR, and codes of a plurality of erase modes Emd only for one plane PLN.

Also, in some cases, according to the erase sequence being executed, the erase mode Emd is not provided in the multi-block erase command set CAset.

[S11]

In the flash memory 2, the sequencer 25 stores the erase commands CMDE (CMDE1, CMDE2, and CMDE3) and the address ADR in the register circuit 24. For example, when the command CMDE includes the code related to the erase mode Emd, the sequencer 25 stores the code related to the erase mode Emd in the erase mode register 61 of the erase sequence control circuit 251.

[S12]

The sequencer 25 determines whether the reception of the multi-block erase command set CAset is completed. For example, the completion of reception of the multi-block erase command set CAset is determined based on the reception of the execution command CMDexe of the operation sequence such as "D0 h".

When the sequencer 25 determines that the reception of the multi-block erase command set CAset is not completed (NO in S12), the sequencer 25 executes the processes of S10 and S11.

[S13]

When the sequencer 25 determines that the reception of the multi-block erase command set CAset is completed (YES in S12), the sequencer 25 determines whether the plurality of erase operations in each erase loop executed for the plurality of selected blocks BLKprm and BLKsnd is a first erase sequence (hereinafter, referred to as a single intensity erase sequence) Seq1 including the erase operation using the same erase intensity (single erase intensity) between the selected blocks BLKprm and BLKsnd or a second erase sequence (hereinafter, referred to as a multi-intensity erase sequence) Seq2 including the erase operation using each of the plurality of erase intensities.

It is noted that, when the sequencer 25 determines that the reception of the multi-block erase command set CAset is completed, the sequencer 25 (or the erase sequence control circuit 251) changes the signal level of the ready/busy signal RBn from the "H" level to the "L" level.

For example, the sequencer 25 determines the erase intensity used for the erase operation with respect to the selected blocks BLKprm and BLKsnd based on the erase mode (erase intensity information) Emd in the erase mode register 61.

When the sequencer 25 determines that the plurality of erase operations of each erase loop with respect to the plurality of selected blocks BLKprm and BLKsnd in erase sequences Seq (Seq1 and Seq2) are executed by using the single erase intensity (YES in S13), the sequencer 25 instructs the erase sequence control circuit 251 to execute the single intensity erase sequence Seq1.

When the sequencer 25 determines that the plurality of erase operations of each erase loop LP with respect to the plurality of selected blocks BLKprm and BLKsnd in the erase sequence are executed by using the plurality of erase intensities (NO in S13), the sequencer 25 instructs the erase sequence control circuit 251 to execute the multi-intensity erase sequence Seq2.

[S14]

When it is YES in S13, the erase sequence control circuit 251 executes the single intensity erase sequence Seq1.

[S15]

When it is NO in S13, the erase sequence control circuit 251 executes the multi-intensity erase sequence Seq2.

As described below, the erase sequence control circuit 251 executes the single intensity erase sequence Seq1 or the multi-intensity erase sequence Seq2 according to the received multi-block erase command set CAset.

<Single Intensity Erase Sequence>

Figure 15:
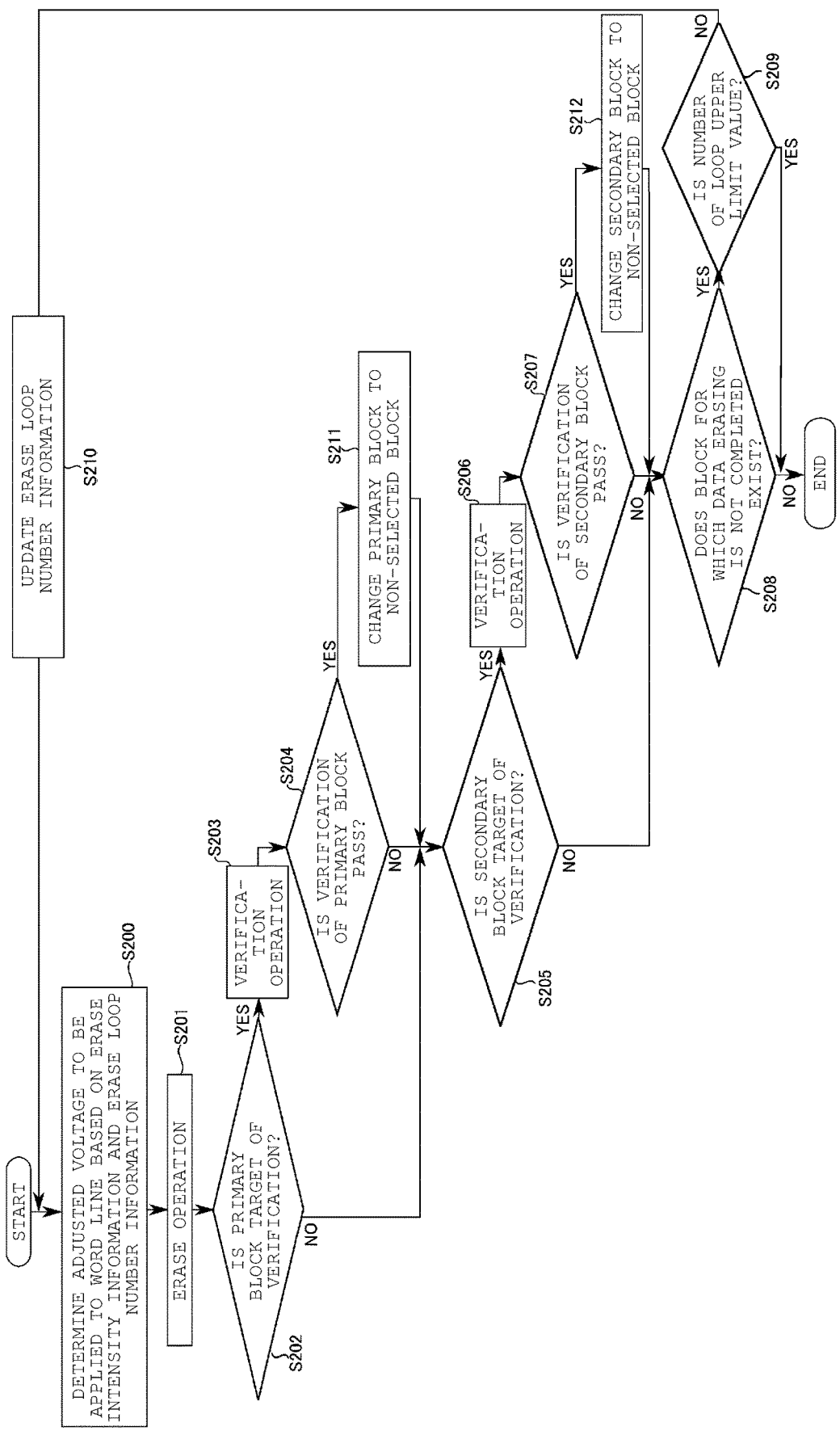
FIG. 15 is a flowchart illustrating a single intensity erase sequence in the memory device of the first embodiment.
Figure 16:
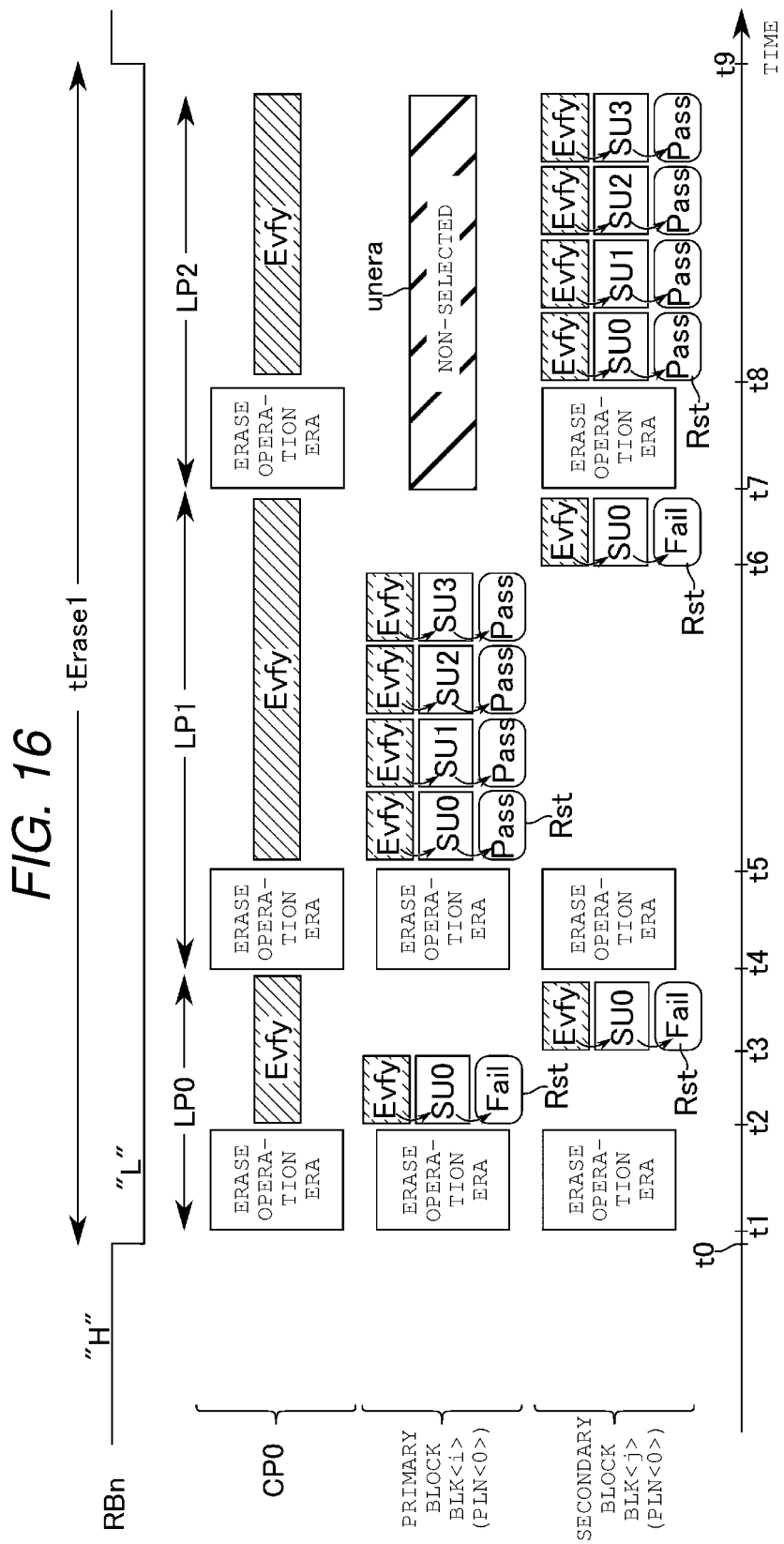
FIG. 16 is a timing chart illustrating the single intensity erase sequence in the memory device of the first embodiment.
Figure 17:
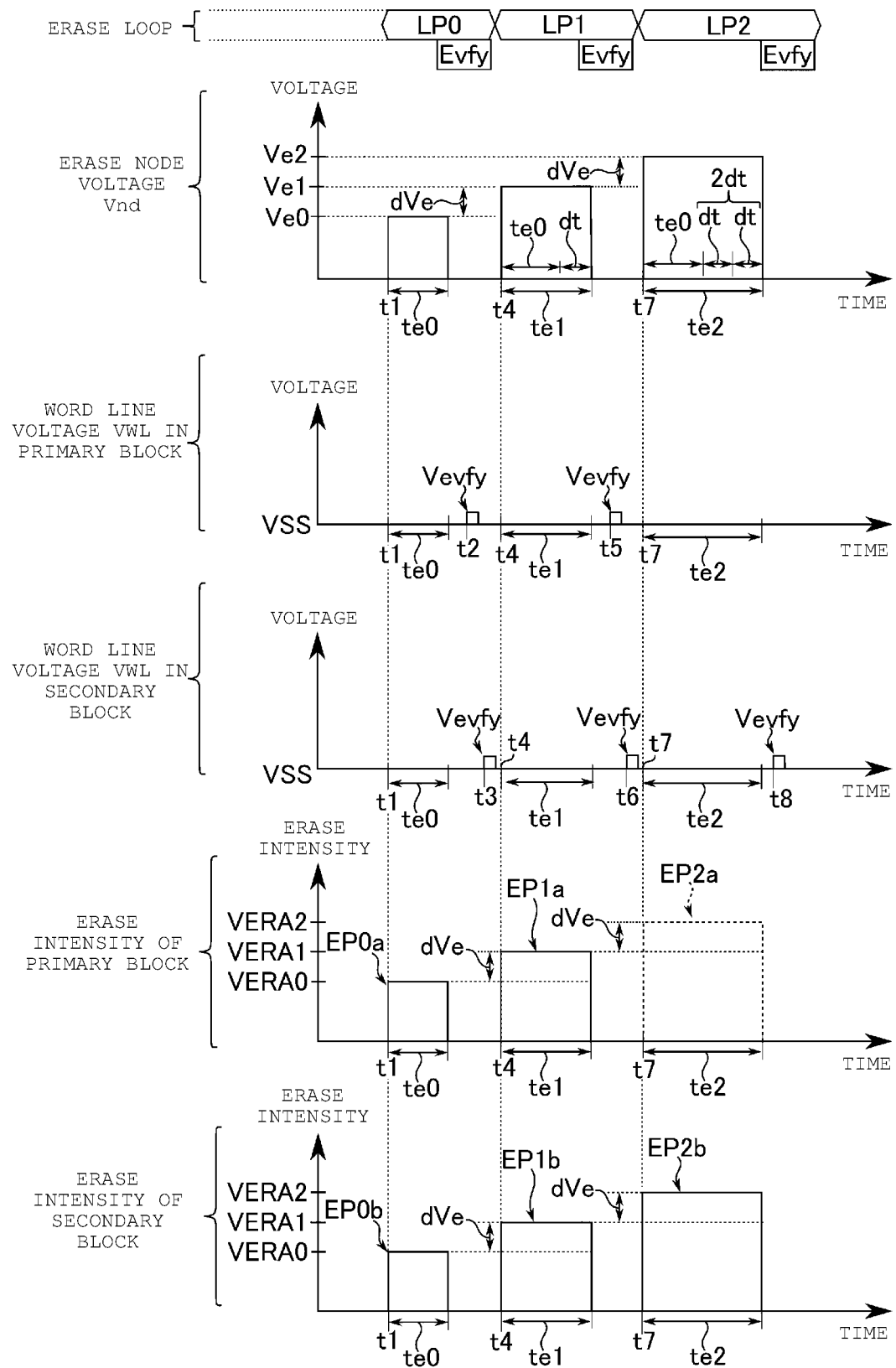
FIG. 17 is a waveform diagram illustrating the single intensity erase sequence in the memory device of the first embodiment.

FIG. 15 is a flowchart illustrating the processing flow of the single intensity erase sequence Seq1 in the flash memory 2 of the embodiment. FIG. 16 is a timing chart of the single intensity erase sequence Seq1 in the flash memory 2 of the embodiment. FIG. 17 is a waveform diagram illustrating the erase intensity of the voltage applied to each wiring in the single intensity erase sequence Seq1 and the erase voltage supplied to each of the blocks BLKprm and BLKsnd in the flash memory 2 of the embodiment.

As illustrated in FIGS. 15 to 17, at the time t0, the erase sequence control circuit 251 starts the single intensity erase sequence Seq1. The single intensity erase sequence Seq1 includes one or more erase loops LP. Also, in the single intensity erase sequence Seq1, Emd is set to 3.

The erase sequence control circuit 251 refers to the erase intensity information (erase mode) Emd of the erase mode register 61 and the erase loop number information (the number of erase loops, count value) Cnt of the erase loop counter 62 in order to execute the first erase loop LP0 of the erase sequence.

The erase sequence control circuit 251 selects the corresponding adjusted voltage code eopt from the plurality of codes in the voltage information table TBLERA in the register 63 based on the erase intensity information Emd and the erase loop number information Cnt.

When the single intensity erase sequence Seq1 is executed, the erase sequence control circuit 251 transmits the code eopt (e.g., code '111') indicating the default value to the regulator circuit 271. It is noted that, when the word line voltage VWL is set to the default value in the erase operation, in some cases, the erase sequence control circuit 251 does not transmit the adjusted voltage code eopt to the word line voltage regulator circuit 271.

The erase sequence control circuit 251 transfers the plurality of addresses ADR to the block decoder BD. The block decoder BD decodes the address ADR. In the block decoder BD, the sub-block decoder 50 transmits the decoding result of the address ADR to the switch circuit SW. In the switch circuit SW, the plurality of word line switch arrays 51 electrically connect the selected block BLK to the regulator circuit 271. A plurality of blocks <i> and <j> in the plane PLN<0> in a certain chip CP0 are selected. For example, block <i> is selected as a primary block BLKprm and block <j> is selected as a secondary block BLKsnd. It is noted that "i" and "j" are integers of 0 or more, and "j" is different from "i".

Accordingly, as illustrated in FIG. 16, one or more erase operations ERA and one or more verification operations Evfy are executed with respect to the plurality of blocks BLKprm and BLKsnd in a certain chip CP0.

[S201]

The erase sequence control circuit 251 instructs the word line voltage regulator circuit 271 to output various voltages for the erase operation ERA.

The erase node voltage regulator circuit 272 outputs the erase node voltage Vnd for the first erase loop LP0 to the erase node NDera.

The select gate line voltage regulator circuits 273 and 274 output the voltages VSGD and VSGS to the select gate lines SGD and SGS corresponding to the selected blocks BLKprm and BLKsnd, respectively.

The word line voltage regulator circuit 271 outputs the word line voltage VWL based on the adjusted voltage code SELeopt from the erase sequence control circuit 251.

Herein, all the word line voltage regulator circuits 271 corresponding to the selected blocks BLKprm and BLKsnd output for example, the word line voltage VWL having a certain voltage value (herein, the ground voltage VSS) to the word line WL via the CG line group CGg and the word line switch array 51 based on the selected adjusted voltage code SELeopt. Accordingly, the word line voltage VWL having the same voltage value is applied to each of the word lines WL of the plurality of selected blocks BLKprm and BLKsnd.

Accordingly, as illustrated in FIG. 17, the plurality of voltages VSS and Vnd for applying the erase voltage EP to the plurality of memory cells MT are applied to the word line WL and the erase node NDera, respectively.

Therefore, the erase voltage EP having a certain erase intensity EP0$a$ is supplied to each of the selected blocks BLKprm and BLKsnd. In the single intensity erase sequence Seq1, the erase intensity of an erase voltage EP0$b$ supplied to the secondary block BLKsnd is equal to the erase intensity VERA0 of the erase voltage EP0$a$ supplied to the primary block BLKprm.

It is noted that, when the erase voltage EP having the same erase intensity is supplied to the primary block BLKprm and the secondary block BLKsnd, the adjusted voltage Veopt in accordance with the selected adjusted voltage code SELeopt may be applied to each of the word lines WL of both the primary block BLKprm and the secondary block BLKsnd.

More specifically, in the example illustrated in FIG. 17, in the first erase loop LP0, the erase node voltage Vnd having a voltage value Ve0 is applied to the erase node NDera by the erase node voltage regulator circuit 272.

The ground voltage VSS is applied to the word lines WL of all the selected blocks (primary block and secondary block) BLKprm and BLKsnd by the ground voltage regulator 70 of the word line voltage regulator circuit 271. However, in some cases, the voltage Veopt higher than the ground voltage VSS based on the adjusted voltage code SELeopt is applied to the word lines WL of all the selected blocks BLKprm and BLKsnd.

Accordingly, at the time t1, the erase voltage (erase pulse) EP0 (EP0a and EP0b) having the erase intensity VERA0 is supplied to the selected blocks BLKprm and BLKsnd. The erase sequence control circuit 251 supplies the erase voltage EP0 to the selected blocks BLKprm and BLKsnd in a predetermined period (pulse width) te0 and, after that, stops the output of the voltage from each regulator circuit 271, 272, 273, and 274.

After the erase operation ERA of the first erase loop LP0, the erase sequence control circuit 251 executes the verification operation (erase verification) Evfy with respect to the erase operation ERA in the first erase loop LP0. The erase verification Evfy is executed for each selected block BLKprm and BLKsnd, unlike the erase operation ERA that is executed simultaneously for the plurality of selected blocks BLKprm and BLKsnd.

[S202]

The erase sequence control circuit 251 determines whether one or more primary blocks BLKprm among the plurality of selected blocks BLKprm and BLKsnd are targets of the erase verification Evfy.

[S203]

When the erase sequence control circuit 251 determines that one or more primary blocks BLKprm among the plurality of selected blocks BLKprm and BLKsnd are the targets of the erase verification Evfy (YES in S202), the erase sequence control circuit 251 executes the erase verification Evfy with respect to the primary block BLKprm.

At the time t2, a verification voltage (hereinafter, referred to as an erase verification voltage) Vevfy having the erase verification level is applied to the plurality of word lines WL of the primary block BLKprm.

[S204]

The erase sequence control circuit 251 determines whether the result Rst of the erase verification Evfy with respect to the primary block BLKprm is pass or not (fail). For example, the execution of the erase verification Evfy and the determination of the verification result Rst are executed for each string unit SU (SU0 to SU3) of the block BLK (BLKprm and BLKsnd). For example, when the erase verification Evfy is executed with respect to the plurality of string units SU of a certain block BLK in a certain order, at the time when the string unit SU of which the result Rst of the erase verification Evfy is verification fail (fail) is detected, the erase verification Evfy with respect to the block BLK is ended.

When the erase sequence control circuit 251 determines that the result Rst of the erase verification Evfy with respect to the primary block BLKprm is not verification pass (is verification fail) (NO in S204), the erase sequence control circuit 251 performs the process of S205. For example, when one or more string units SU (for example, the string unit SU0 in FIG. 16) among the plurality of string units SU of the primary block BLKprm that is a target of the erase verification Evfy are verification fail, the erase sequence control circuit 251 determines that the erase verification Evfy (and erase operation ERA) of the primary block BLKprm including the string unit SU that is the verification fail is fail.

When the result Rst of the erase verification Evfy with respect to the primary block BLKprm is fail, the erase sequence control circuit 251 maintains the primary block BLKprm of which the erase verification Evfy is fail as the selected block.

[S205]

The erase sequence control circuit 251 determines whether one or more secondary blocks BLKsnd among the plurality of selected blocks BLKprm and BLKsnd are the targets of the erase verification Evfy.

[S206]

When the erase sequence control circuit 251 determines that one or more secondary blocks BLKsnd among the plurality of selected blocks BLKprm and BLKsnd are the targets of the erase verification Evfy (YES in S206), the erase sequence control circuit 251 executes the erase verification Evfy with respect to each secondary block BLKsnd.

At the time t3, the erase verification voltage Vevfy is applied to the word lines WL of each secondary block BLKsnd.

[S207]

The erase sequence control circuit 251 determines whether the erase verification Evfy with respect to each secondary block BLKsnd is pass.

For each secondary block BLKsnd, when the erase sequence control circuit 251 determines that the result Rst of the erase verification Evfy with respect to the secondary block BLKsnd is not pass (NO in S207), the erase sequence control circuit 251 performs the process of S208. For example, similarly to the determination of pass/fail of the erase verification Evfy with respect to the primary block BLKprm, when one or more string units SU (for example, the string unit SU0 in FIG. 16) among the plurality of string units SU (SU0 to SU3) of the secondary block BLKsnd that is a target of the erase verification Evfy are the verification fail, the erase sequence control circuit 251 determines that the erase verification Evfy (and the erase operation ERA) of the secondary block BLKsnd is fail.

When the result Rst of the erase verification Evfy with respect to any of the secondary blocks BLKsnd is fail (for example, when the string unit SU of the secondary block BLKsnd is the verification fail), the erase sequence control circuit 251 maintains the secondary block BLKsnd which has failed the erase verification Evfy to be the selected block.

[S208]

The erase sequence control circuit 251 determines whether there are blocks in which the data erasing is not completed (i.e., which have not passed the erase verification), in the plurality of selected blocks BLKprm and BLKsnd based on the result Rst of the erase verification Evfy.

[S209]

When the erase sequence control circuit 251 determines that there are blocks for which data erasing is not completed (YES in S208), the erase sequence control circuit 251 determines whether the current number of erase loops LP (count value Cnt) is the upper limit value of the erase loop LP (for example, whether the count value Cnt is equal to the upper limit value).

[S210]

When the erase sequence control circuit 251 determines that the number of erase loops (count value Cnt) is not the upper limit value of the erase loop LP (for example, the current number Cnt of erase loops is less than the upper limit value) (NO in S209), the erase sequence control circuit 251 updates (for example, increments) the count value Cnt as the erase loop number information in the erase loop counter 62.

The erase sequence control circuit 251 executes the processing flows from S200 to S202 as the second erase loop LP1 of the single intensity erase sequence Seq1.

For example, in the second erase loop LP1, the erase sequence control circuit 251 executes the erase operation ERA simultaneously with respect to the plurality of selected blocks BLKprm and BLKsnd based on the erase intensity information Emd and the erase loop number information Cnt by using the erase voltage EP1 (EP1a and EP1b) having different erase intensity from that of the first erase loop LP0.

As illustrated in FIG. 17, for example, at least one of the voltage value and the supply period of the voltage Vnd of the erase node NDera is changed according to the increase in the number of erase loops LP. The erase node voltage regulator circuit 272 outputs the erase node voltage Vnd having a voltage value Ve1 to the erase node NDera. The voltage value Ve1 is higher than the voltage value Ve0 by a step-up voltage dVe. Further, a supply period (pulse width) te1 of the voltage value Ve1 is longer than a supply period te0 of the voltage value Ve0 by an additional period dt.

The erase sequence control circuit 251 transmits the adjusted voltage code SELeopt selected based on the erase intensity information Emd and the updated count value (number of erase loops) Cnt to the word line voltage regulator circuit 271.

As in the example of FIG. 17, in the single intensity erase sequence Seq1, the voltage value of the word line voltage VWL used in the second erase loop LP1 is the same as the voltage value of the word line voltage VWL used in the first erase loop LP0.

By changing the voltage value of the erase node voltage Vnd and the supply period of the erase voltage EP, the erase intensity VERA1 of the erase voltage EP1 of the second erase loop LP1 is stronger than the erase intensity VERA0 of the erase voltage EP0 of the first erase loop LP0.

At the time t4, erase voltages EP1a and EP1b having the erase intensity VERA1 are supplied to the selected blocks BLKprm and BLKsnd, respectively.

After the erase operation ERA with respect to the selected blocks BLKprm and BLKsnd in the second erase loop LP1, similarly to S202 described above, the erase sequence control circuit 251 determines whether the primary block BLKprm is a target of the erase verification Evfy (S202).

For example, as illustrated in FIG. 16, when the result Rst of the erase verification Evfy with respect to the primary block BLKprm in the first erase loop LP0 is fail, after the erase operation ERA is executed with respect to the primary block BLKprm in the second erase loop LP1, the erase sequence control circuit 251 executes the erase verification Evfy with respect to the primary block BLKprm that is a target of the erase verification Evfy at the time t5 (S203). After that, it is determined whether the erase verification Evfy with respect to the primary block BLKprm is pass (S204).

When the erase sequence control circuit 251 determines that the result Rst of the erase verification Evfy with respect to the primary block BLKprm is pass (YES in S204), the erase sequence control circuit 251 changes the primary block BLKprm that has passed the erase verification Evfy from the selected block to the non-selected block. For example, when the erase sequence control circuit 251 determines that the verification result Rst of all the string units SU of the selected block (herein, the primary block BLKprm) is pass, the erase sequence control circuit 251 determines that the erase verification Evfy with respect to the selected block BLKprm is pass.

When the result Rst of the erase verification Evfy with respect to any of the secondary blocks BLKsnd in the first erase loop LP0 is fail, after the erase operation ERA in the second erase loop LP1 and the erase verification Evfy with respect to the primary block BLKprm, the erase sequence control circuit 251 determines one or more of the secondary blocks BLKsnd that are each a target of the erase verification Evfy (S205).

For each secondary block BLKsnd that is a target of the erase verification Evfy (YES in S205), the erase sequence control circuit 251 executes the erase verification Evfy in the second erase loop LP1 with respect to the secondary block BLKsnd at the time t6 (S206).

After the erase sequence control circuit 251 determines whether the result Rst of the erase verification Evfy with respect to the secondary block BLKsnd is fail, the erase sequence control circuit 251 executes the process of S208.

When there are blocks BLKprm and BLKsnd in which data has not been erased, the erase sequence control circuit 251 executes the processes of S209 and S210.

The erase sequence control circuit 251 executes a third erase loop LP2 in the single intensity erase sequence Seq1.

Similarly to the first and second erase loops LP0 and LP1, the erase sequence control circuit 251 executes the processes of S200 and S201. The erase sequence control circuit 251 selects the adjusted voltage code eopt based on the erase intensity information Emd and the updated count value Cnt. For example, the erase sequence control circuit 251 supplies the erase node voltage Vnd having a voltage value Ve2 to the erase node NDera by the erase node voltage regulator circuit 272. The voltage value Ve2 is higher than the voltage value Ve1 by the step-up voltage dVe. In addition, a supply period (pulse width) tet of the voltage value Ve2 is longer than a supply period te1 of the voltage value Ve1 by the additional period dt.

At the time t7, the erase sequence control circuit 251 executes the erase operation ERA of the third erase loop LP2 with respect to the selected blocks BLKprm and BLKsnd (S201).

An erase voltage EP2b having the erase intensity VERA2 is supplied to the secondary block BLKsnd that is the selected block. The erase voltage EP2b has the erase intensity VERA2 in accordance with the potential difference between the erase node voltage Vnd (for example, a voltage value Vet) and the word line voltage VWL (for example, a ground voltage VSS).

In the third erase loop LP2, as described above (refer to S211), the primary block BLKprm is set to a non-selected state unera (non-selected block BLKunsel).

Therefore, the erase sequence control circuit 251 controls the word line voltage regulator circuit 271 so as to apply the non-selected voltage Vunera to the word line WL of the primary block BLKprm. Accordingly, in the third erase loop LP2, the erase voltage EP is not supplied to the primary block BLKprm set to the non-selected state unera. However, in the third erase loop LP2, when the primary block BLKprm that is a target of the erase operation ERA exists among the plurality of selected blocks BLKprm and BLKsnd, an erase voltage EP2a is also supplied to the primary block BLKprm. The erase voltage EP2a has the erase intensity of VERA2.

[S202—NO]

After the erase operation ERA in the third erase loop LP2, the erase sequence control circuit 251 determines whether the primary block BLKprm is a target of the erase verification Evfy.

Herein, when the primary block BLKprm is in the non-selected state unera (non-selected block BLKunera), the erase sequence control circuit 251 determines that the primary block BLKprm is not a target of the erase verification Evfy. In this case (NO in S202), the erase sequence control circuit 251 executes the process of S205 related to the secondary block BLKsnd without executing the processes of S203, S204, and S211 of the erase verification Evfy related to the primary block BLKprm.

[S212]

The erase sequence control circuit 251 determines whether the secondary block BLKsnd is a target of the erase verification Evfy.

Similarly to the first and second erase loops LP0 and LP1 described above, when the secondary block BLKsnd is a target of erase verification Evfy (YES in S205), the erase sequence control circuit 251 executes the processes of S206 and S207. At the time t8, the erase sequence control circuit 251 executes the erase verification Evfy on the secondary block BLKsnd that is a target of the erase verification Evfy.

When the erase sequence control circuit 251 determines that the result Rst of the erase verification Evfy with respect to the secondary block BLKsnd is pass (YES in S207), the erase sequence control circuit 251 changes the secondary block BLKsnd that has passed the erase verification Evfy from the selected block to the non-selected block BLKunera (S212).

After that, the erase sequence control circuit 251 performs the process of S208.

It is noted that, when the erase sequence control circuit 251 determines that the secondary block BLKsnd is not a target of the erase verification Evfy (NO in S205), the erase sequence control circuit 251 executes the process of S208 without executing the processes of S206, S207, and S212 of the erase verification Evfy related to the secondary block BLKsnd.

[S208—NO and S209—YES]

In the third erase loop LP2, the erase sequence control circuit 251 determines whether there is the block for which the data erasing is not completed among the plurality of selected blocks BLKprm and BLKsnd.

When the erase sequence control circuit 251 determines that there is no block for which the data erasing is not completed (NO in S208) among the plurality of selected blocks BLKprm and BLKsnd, the erase sequence control circuit 251 ends the erase sequence Seq1.

When there is a block for which the data erasing is not completed (YES in S208), the erase sequence control circuit 251 determines whether the current number of erase loops (count value) Cnt is the upper limit value of the erase loop LP (for example, whether the count value Cnt is equal to the upper limit value). When the current number of erase loops is not the upper limit value (NO in S209), the erase sequence control circuit 251 executes various processes for the fourth erase loop LP3 after the process of S212.

When the erase sequence control circuit 251 determines that the current number of erase loops (count value Cnt) is the upper limit value of the erase loop LP, even when there are blocks BLKprm and BLKsnd for which the data erasing is not completed, the erase sequence control circuit 251 ends the single intensity erase sequence Seq1.

The erase sequence control circuit 251 stores the result of the single intensity erase sequence Seq1 with respect to the plurality of selected blocks BLKprm and BLKsnd in the status register 64.

After that, at the time t9, the sequencer 25 changes the signal level of the ready/busy signal RBn from the "L" level to the "H" level. Accordingly, the flash memory 2 notifies the memory controller 1 of the completion of the erase sequence Seq1. For example, in the single intensity erase sequence Seq1, a period tERASE in which the signal level of the ready/busy signal RBn is set to the "L" level is "tERASE1".

Accordingly, the single intensity erase sequence Seq1 in accordance with the multi-block erase command set CAset in the flash memory 2 of the embodiment is completed.

It is noted that, in the chip CP0, the erase sequence of the plane PLN<1> (single intensity erase sequence Seq1 or multi-intensity erase sequence Seq2) may be executed in parallel with the single intensity erase sequence Seq1 of the plane PLN<0>.

In the embodiment, in the single intensity erase sequence Seq1 described above, the erase voltage EP having the same erase intensity is supplied to both the primary block BLKprm and the secondary block BLKsnd. Therefore, unlike the above example, the data erasing in the secondary block BLKsnd may be completed before the data erasing in the primary block BLKprm. In this case, in a state where the primary block BLKprm is maintained as the selected block, the secondary block BLKsnd is set to the non-selected block BLKunera.

<Multi-intensity Erase Sequence>

Figure 18:
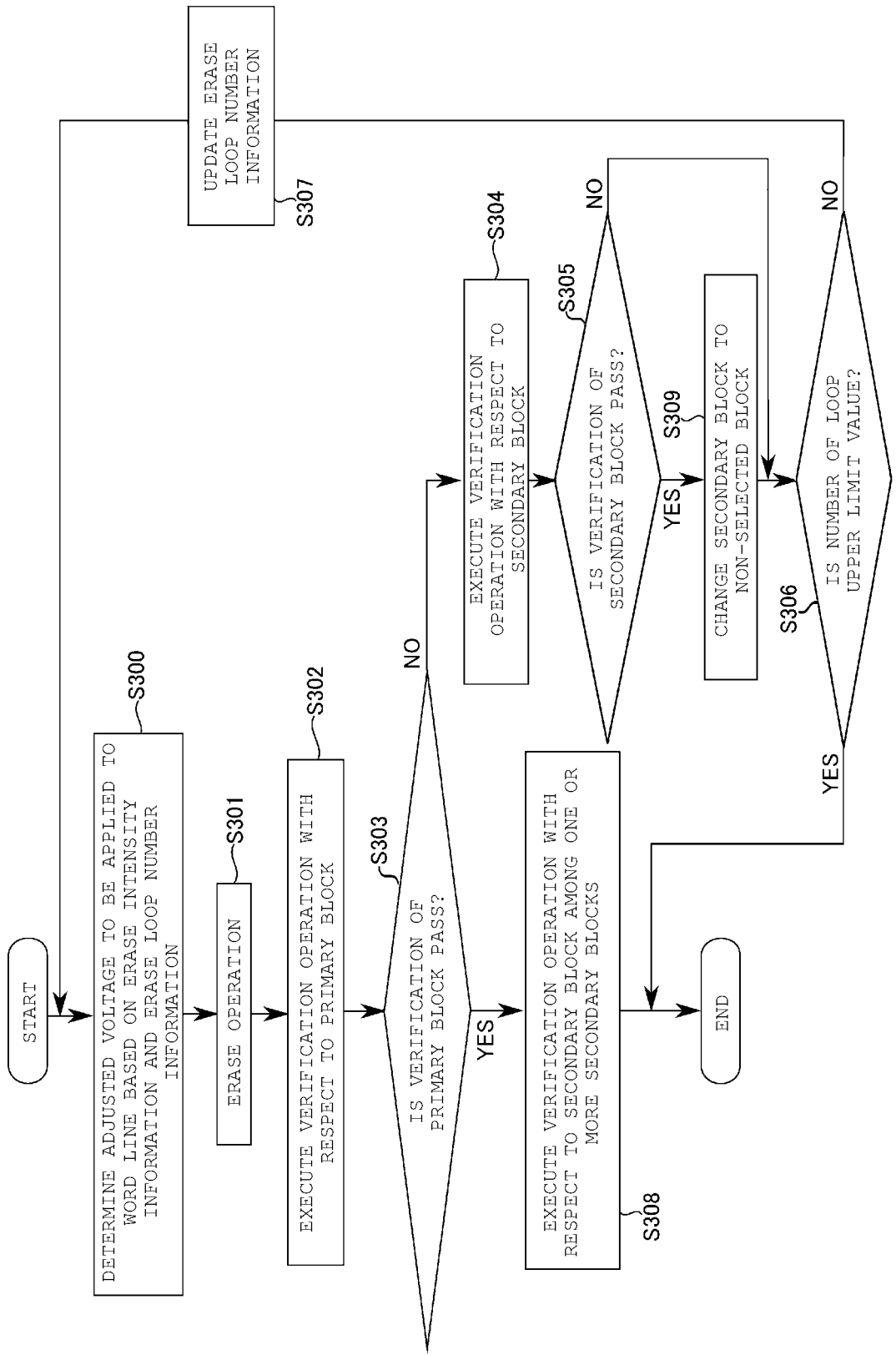
FIG. 18 is a flowchart illustrating a multi-intensity erase sequence in the memory device of the first embodiment.
Figure 19:
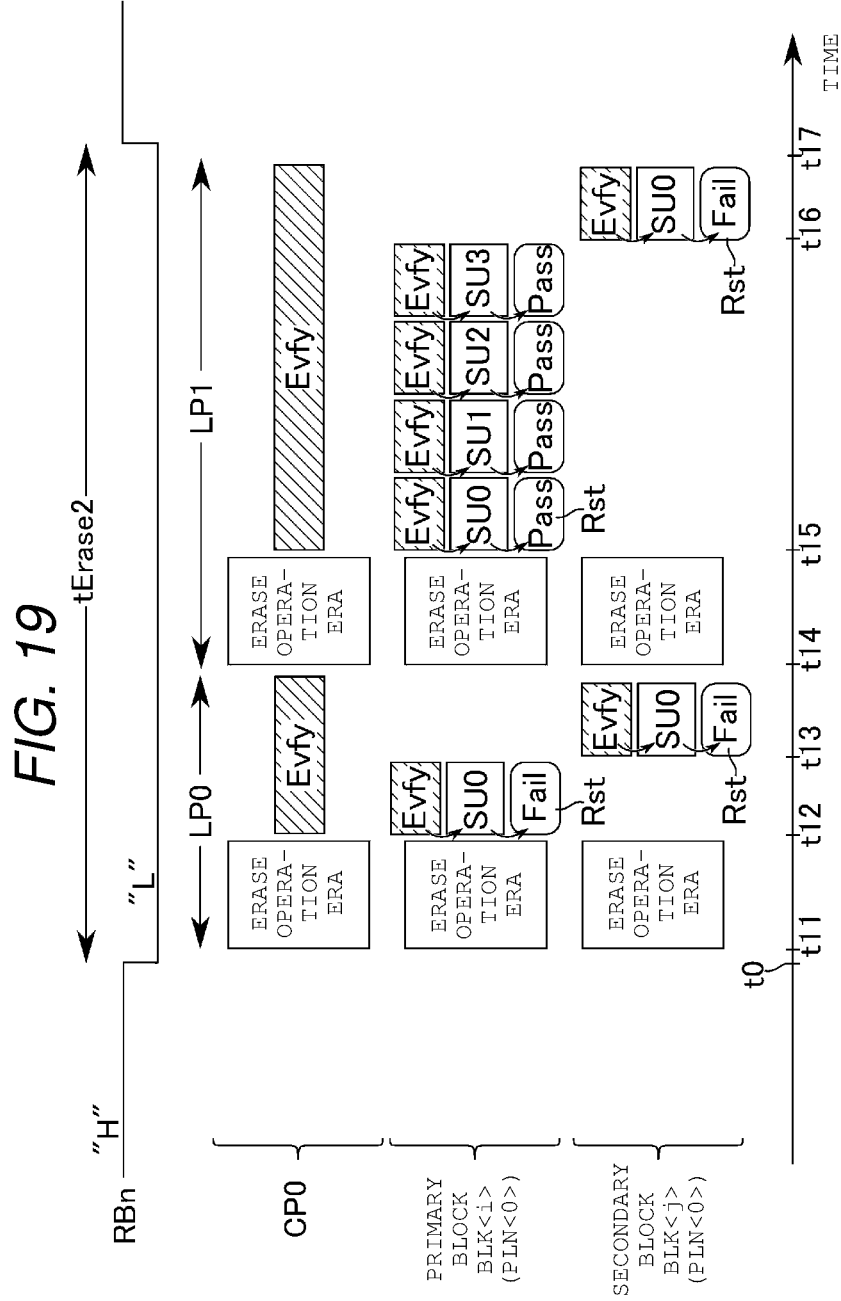
FIG. 19 is a timing chart illustrating the multi-intensity erase sequence in the memory device of the first embodiment.

FIG. 18 is a flowchart illustrating a processing flow of the multi-intensity erase sequence Seq2 in the flash memory 2 of the embodiment. FIG. 19 is a timing chart of the multi-intensity erase sequence Seq2 in the flash memory 2 of the embodiment. FIGS. 20 and 21 are waveform diagrams illustrating the erase intensity of the voltage applied to each wiring in the multi-intensity erase sequence Seq2 and the erase intensity of the erase voltage supplied to each of the blocks BLKprm and BLKsnd in the flash memory 2 of the embodiment.

[S300]

Figure 20:
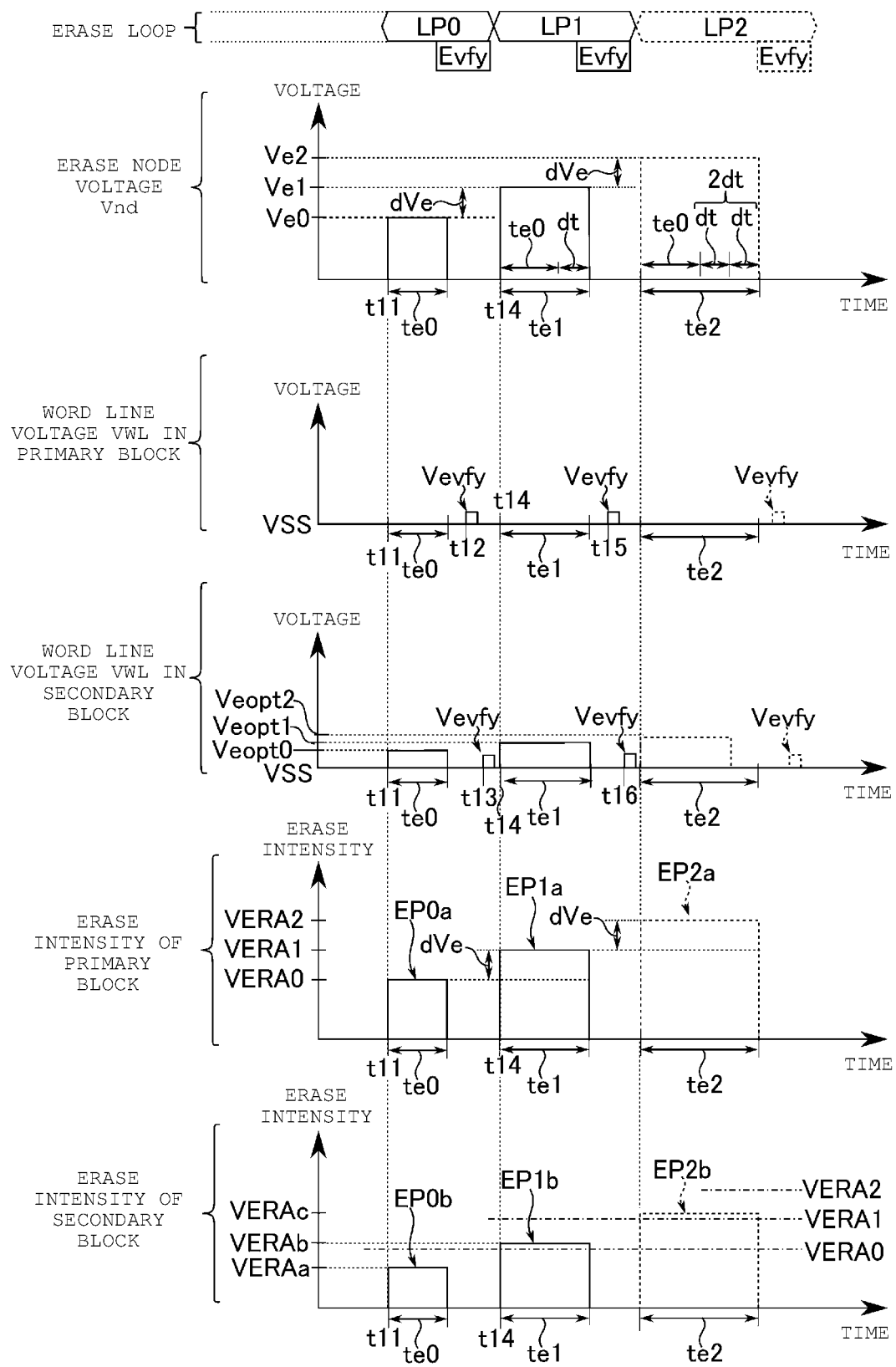
FIG. 20 is a waveform diagram illustrating the multi-intensity erase sequence in the memory device of the first embodiment.
Figure 21:
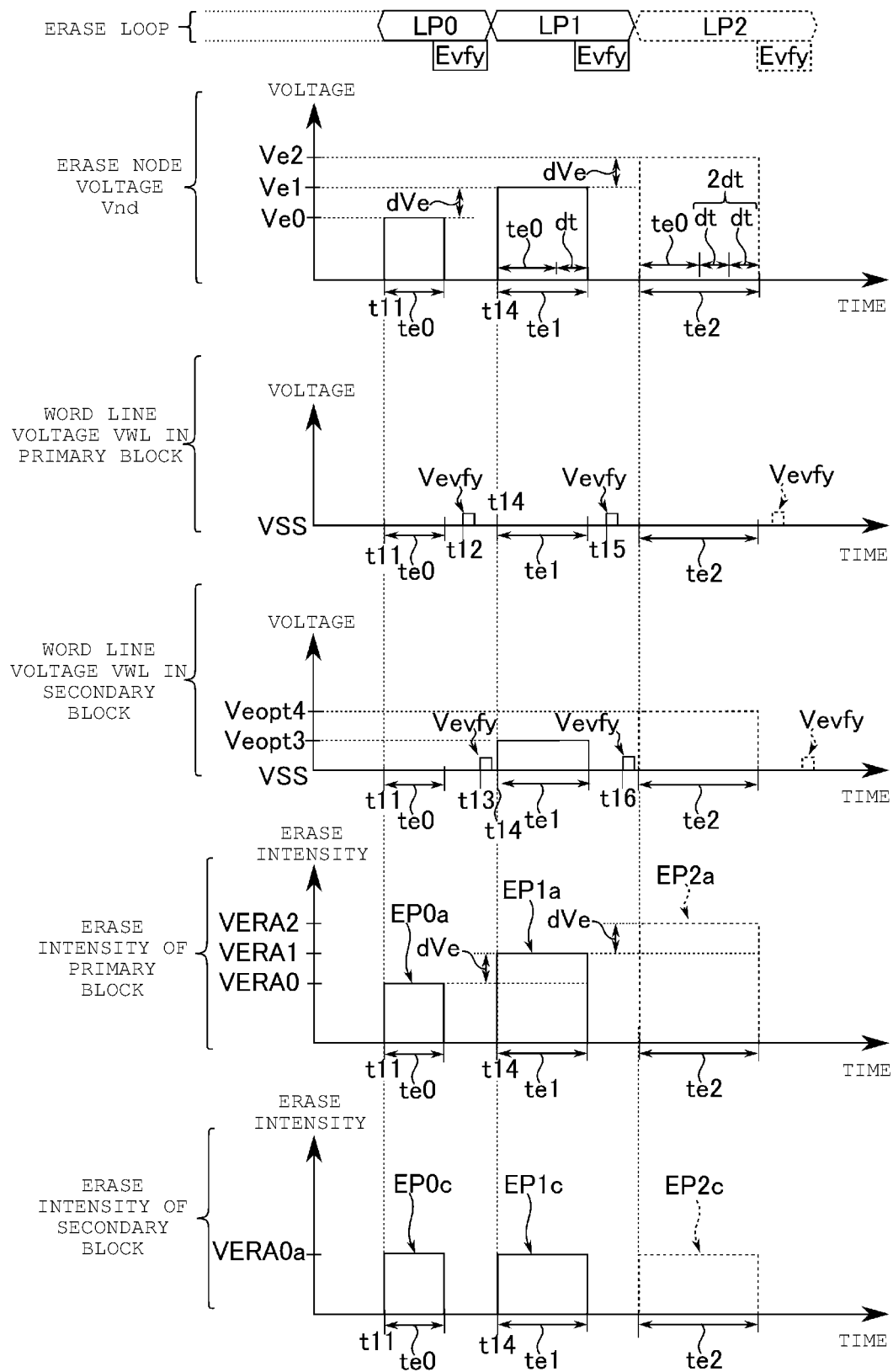
FIG. 21 is a waveform diagram illustrating the a modified multi-intensity erase sequence in the memory device of the first embodiment.

As illustrated in FIGS. 18 to 20, at the time t0, the erase sequence control circuit 251 starts the multi-intensity erase sequence Seq2.

In the multi-intensity erase sequence Seq2, the erase sequence control circuit 251 selects the adjusted voltage code eopt in the voltage information table TBLERA based on the erase intensity information (erase mode) Emd and the erase loop number information (count value) Cnt substantially in the same manner as the process of S200 of the single intensity erase sequence Seq1.

The erase sequence control circuit 251 transmits the selected adjusted voltage code SELeopt to the word line voltage regulator circuit 271 based on the plurality of addresses ADR.

[S301]

The erase sequence control circuit 251 executes the erase operation ERA in the first erase loop LP0 of the multi-intensity erase sequence Seq2 with respect to the plurality of selected blocks BLKprm and BLKsnd.

The erase node voltage regulator circuit 272 outputs the erase node voltage Vnd having the voltage value Ve0 to the erase node NDera. Each of the word line voltage regulator circuits 271 applies the word line voltage VWL to the word lines WL of each of the selected blocks BLKprm and BLKsnd. With respect to the word line voltage regulator circuit 271 to which the selected adjusted voltage code SELeopt is supplied, the adjusted voltage regulator 71 outputs the adjusted voltage Veopt having a voltage value in accordance with the supplied adjusted voltage code SELeopt as a word line voltage VWL.

At the time t11, the erase voltage EP in the erase operation ERA of the first erase loop LP0 is substantially simultaneously supplied to the primary block BLKprm and the secondary block BLKsnd as the selected blocks.

In the erase operation ERA of the multi-intensity erase sequence Seq2, an erase intensity VERAa of the erase voltage EP0b supplied to the secondary block BLKsnd is different from the erase intensity VERA0 of the erase voltage EP0a supplied to the primary block BLKprm.

For example, the ground voltage VSS is applied to the word lines WL in the primary block BLKprm. The erase intensity VERA0 of the erase voltage EP0a in the primary block BLKprm corresponds to the difference between the voltage value Ve0 of the erase node voltage Vnd and the ground voltage VSS.

The adjusted voltage Veopt is applied to the word lines WL of a certain secondary block BLKsnd. The adjusted voltage Veopt is different from the voltage (for example, the ground voltage VSS) applied to the word line WL of the primary block BLKprm. In the multi-intensity erase sequence Seq2, the adjusted voltage Veopt has a positive voltage value higher than the ground voltage VSS. In the example of FIG. 20, in a certain secondary block BLKsnd, the adjusted voltage (voltage value) Veopt0 is applied to the word lines WL. The erase intensity VERAa of the erase voltage EP0b in the secondary block BLKsnd corresponds to the difference between the voltage value Ve0 of the erase node voltage Vnd and the voltage value of the adjusted voltage Veopt (Veopt0).

Accordingly, the erase intensity VERAa of the erase voltage EP0b is weaker (smaller) than the erase intensity VERA0 of the erase voltage EP0a.

In this manner, the erase voltages EP having the different erase intensities VERA are supplied to the plurality of selected blocks BLKprm and BLKsnd based on the adjusted voltage code SELeopt selected by the erase intensity information Emd and the erase loop number information Cnt.

[S302]

At the time t12, the erase sequence control circuit 251 executes the erase verification Evfy in the first erase loop LP0 with respect to the primary block BLKprm among the plurality of selected blocks BLKprm and BLKsnd.

[S303]

The erase sequence control circuit 251 determines whether the erase verification Evfy with respect to the primary block BLKprm is pass (verification pass) or not (verification fail).

[S304]

When the erase sequence control circuit 251 determines that the result Rst of the erase verification Evfy with respect to the primary block BLKprm is not pass (NO in S303), the erase sequence control circuit 251 executes the erase verification Evfy with respect to a certain secondary block BLKsnd in the first erase loop LP0 at the time t13.

[S305]

The erase sequence control circuit 251 determines whether the erase verification Evfy with respect to the secondary block BLKsnd that is a target of the erase verification Evfy is pass.

[S306]

When the erase sequence control circuit 251 determines that the result Rst of the erase verification Evfy with respect to the secondary block BLKsnd is not pass (is fail) (NO in S305), the erase sequence control circuit 251 determines whether the current number Cnt of erase loops LP is an upper limit value.

[S307] When the erase sequence control circuit 251 determines that the number of erase loops LP is not the upper limit value (for example, the current number Cnt of erase loops is less than the upper limit value) (NO in S306), the erase sequence control circuit 251 updates (increments) the count value (erase loop number information) Cnt in the erase loop counter 62 indicating the number of erase loops LP.

After that, the erase sequence control circuit 251 executes the processing flows from S300 to S303 as the second erase loop LP1.

For example, the erase sequence control circuit 251 selects the adjusted voltage code eopt of the voltage information table TBLERA based on the erase intensity information Emd and the updated erase loop number information Cnt (S300). For example, in the second erase loop LP1, the voltage code eopt different from the voltage code eopt selected in the first erase loop LP0 is selected as the count value Cnt is updated.

At the time t14, the erase sequence control circuit 251 executes the erase operation ERA in the second erase loop LP1 with respect to one or more selected blocks BLKprm and BLKsnd (S301).

In the second erase loop LP1, the erase voltage EP1a is supplied to the primary block BLKprm. The erase voltage EP1a has the erase intensity VERA1 (>VERA0) in accordance with the difference between the voltage value Ve1 of the erase node voltage Vnd and the ground voltage VSS.

The erase voltage EP1b is supplied to the secondary block BLKsnd. The erase voltage EP1b has an erase intensity VERAb in accordance with the difference between the voltage value Ve1 of the erase node voltage Vnd and the adjusted voltage Veopt1 (>VSS). The erase intensity VERAb of the erase voltage EP1b is smaller than the erase intensity VERA1 of the erase voltage EP1a.

An adjusted voltage Veopt1 selected in the second erase loop LP1 is higher than the adjusted voltage Veopt0 selected in the first erase loop LP0. For example, the erase intensity VERAb of the erase voltage EP1b is stronger (larger) than the erase intensity VERAa of the erase voltage EP0b.

At the time t15, the erase sequence control circuit 251 executes the erase verification Evfy in the second erase loop LP1 with respect to the primary block BLKprm (S302). The erase sequence control circuit 251 determines whether the erase verification Evfy with respect to the primary block BLKprm in the second erase loop LP1 is pass (S303).

[S308]

In the second erase loop LP1, when the erase sequence control circuit 251 determines that the result Rst of the erase verification Evfy with respect to the primary block BLKprm is pass (YES in S303), the erase sequence control circuit 251 executes the erase verification Evfy with respect to a certain secondary block BLKsnd among one or more secondary blocks BLKsnd of the plurality of selected blocks BLKprm and BLKsnd at the time t16.

For example, the erase sequence control circuit 251 stores the result Rst of the erase verification Evfy with respect to the selected secondary block BLKsnd (and the primary block BLKprm) in the status register 64 as the status information STS related to the selected secondary block BLKsnd.

After this, the erase sequence control circuit 251 ends the multi-intensity erase sequence Seq2 regardless of the result of the erase verification Evfy with respect to the secondary block BLKsnd.

In this manner, when the result Rst of the erase verification Evfy with respect to the primary block BLKprm is pass, the erase sequence control circuit 251 ends the erase sequence Seq2 for the plurality of blocks BLK without depending on the status of the erase operation ERA with respect to the secondary block BLKsnd.

[S309]

It is noted that, in the second erase loop LP1, when the result Rst of the erase verification Evfy with respect to the primary block BLKprm is not the pass (NO in S303), the erase sequence control circuit 251 executes the processes of S304 and S305.

When the erase sequence control circuit 251 determines that the result Rst of the erase verification Evfy with respect to the secondary block BLKsnd is pass (YES in S305), the erase sequence control circuit 251 changes the secondary block BLKsnd from the selected block to the non-selected block. Accordingly, the secondary block BLKsnd that has passed the erase verification Evfy is excluded from the targets of the erase operation ERA and the erase verification Evfy.

After that, the erase sequence control circuit 251 determines whether the current number Cnt of erase loops LP is equal to the upper limit value (S306).

When the number Cnt of erase loops LP is not equal to the upper limit value (NO in S306), the erase sequence control circuit 251 executes the processes of S300 to S303 in the third erase loop LP2 for the primary block BLKprm after updating (S307) the count value (number of erase loops) Cnt as the erase loop number information. At this time, the erase sequence control circuit 251 does not execute the processes of S304 and S305 (and S309) for the secondary block BLKsnd set to the non-selected block.

When the number of erase loops LP is equal to the upper limit value (YES in S306), the erase sequence control circuit 251 ends the multi-intensity erase sequence Seq2.

For example, the erase sequence control circuit 251 stores the results of the multi-intensity erase sequence Seq2 for the plurality of selected blocks BLKprm and BLKsnd in the status register 64.

After that, at the time t17, the sequencer 25 changes the signal level of the ready/busy signal RBn from the "L" level to the "H" level. Accordingly, the flash memory 2 notifies the memory controller 1 of the completion of the erase sequence Seq2.

Accordingly, the multi-intensity erase sequence Seq2 in accordance with the multi-block erase command set CAset in the flash memory 2 of the embodiment is completed.

For example, in the multi-intensity erase sequence Seq2, the period tERASE in which the signal level of the ready/busy signal RBn is set to the "H" level is "tERASE2". In both the single intensity erase sequence Seq1 and the multi-intensity erase sequence Seq2, when it is determined in the second erase loop LP1 that the erase verification Evfy with respect to the primary block BLKprm is pass (the data erasing in the primary block BLKprm is completed), "tERASE2" is shorter than "tERASE1".

As described above, in the flash memory 2 of the embodiment, the erase sequence control circuit 251 completes the erase sequence Seq including the erase operation ERA that is simultaneously executed for the plurality of blocks belonging to the same plane PLN.

It is noted that, after the erase sequence Seq of the flash memory 2 of the embodiment, the erase state of the block (erase block) BLK may be managed by the timer.

FIG. 21 illustrates a modified example of the operation example of FIG. 20.

As illustrated in FIG. 21, the erase sequence control circuit 251 may also select a desired adjusted voltage code from the plurality of codes eopt in the voltage information table so that the erase intensity of an erase voltage EP1c in the second erase loop LP1 is substantially equal to the erase intensity of an erase voltage EP0c in the first erase loop LP0 according to the erase intensity information Emd and the erase loop number information Cnt. For example, in the first erase loop LP0, the ground voltage VSS is supplied to the word lines WL of the secondary block BLKsnd. In the second erase loop LP1, an adjusted voltage Veopt3 is supplied to the word lines WL of the secondary block BLKsnd. When the third erase loop LP2 is executed, the adjusted voltage Veopt4 is supplied to the word lines WL. The adjusted voltage (voltage value) Veopt4 is higher than the adjusted voltage (voltage value) Veopt3. For example, the magnitude of the adjusted voltage Veopt3 is equal to the voltage value dVe, and the magnitude of the adjusted voltage Veopt4 is equal to twice the voltage value dVe.

Accordingly, in each of the erase loops LP0, LP1, and LP2, each of the erase voltages EP0b, EP1c, and EP2c supplied to the secondary block BLKsnd has substantially the same erase intensity (voltage value) VERA0a. For example, the erase intensity VERA0a is substantially equal to the erase intensity VERA0.

(d) Summary

The flash memory 2 (and the memory system 90) of the embodiment executes the erase sequences Seq (Seq1 and Seq2) simultaneously (in parallel) with respect to the plurality of blocks BLK (BLKprm and BLKsnd) belonging to a certain plane PLN.

Accordingly, the flash memory 2 of the embodiment can shorten the period tERASE of the erase sequence Seq for the plurality of selected blocks (BLKprm and BLKsnd).

In addition, as the result of shortening the period tERASE of the erase sequence Seq, the flash memory 2 of the embodiment can improve the delay of other operations (for example, the latency of the read sequence).

The flash memory 2 of the embodiment can reduce the frequency of the suspended state of the erase sequence Seq due to other operations (for example, read sequence) with respect to the flash memory 2 as the period of the erase sequence Seq is shortened.

As a result, the flash memory 2 of the embodiment can reduce the power consumption generated by the erase sequence Seq.

In addition, as a tendency related to the data erasing in a certain flash memory, when the number of erase operations with respect to a certain selected block in the erase sequence increases, the selected block may be in the over-erased state.

In the plurality of selected blocks BLKprm and BLKsnd with respect to which the erase sequence Seq is executed simultaneously, the flash memory 2 of the embodiment can adjust the erase intensity of the erase voltage EP supplied to a certain selected block (for example, the secondary block BLKsnd) based on the erase intensity information Emd and the erase loop number information Cnt.

Accordingly, in the flash memory 2 of the embodiment, even when the number of erase operations ERA for the selected blocks BLKprm and BLKsnd increases according to the increase of the erase loop LP, the selected blocks BLKprm and BLKsnd can be prevented from being in the over-erased state.

As described above, the memory device and the memory system of the embodiment can improve the characteristics of the memory device.

(2) Second Embodiment

A memory device, a memory system, and a method for controlling them of the second embodiment will be described with reference to FIG. 22.

The flash memory 2 of the embodiment changes the word line voltage VWL of the secondary block BLKsnd from the first voltage value to the second voltage value in the erase operation ERA with respect to the primary block BLKprm and the secondary block BLKsnd.

Accordingly, during the period when the erase voltage EP having a certain erase intensity with respect to the primary block BLKprm is applied, the erase intensity of the erase voltage EP supplied to the secondary block BLKsnd is controlled.

Figure 22:
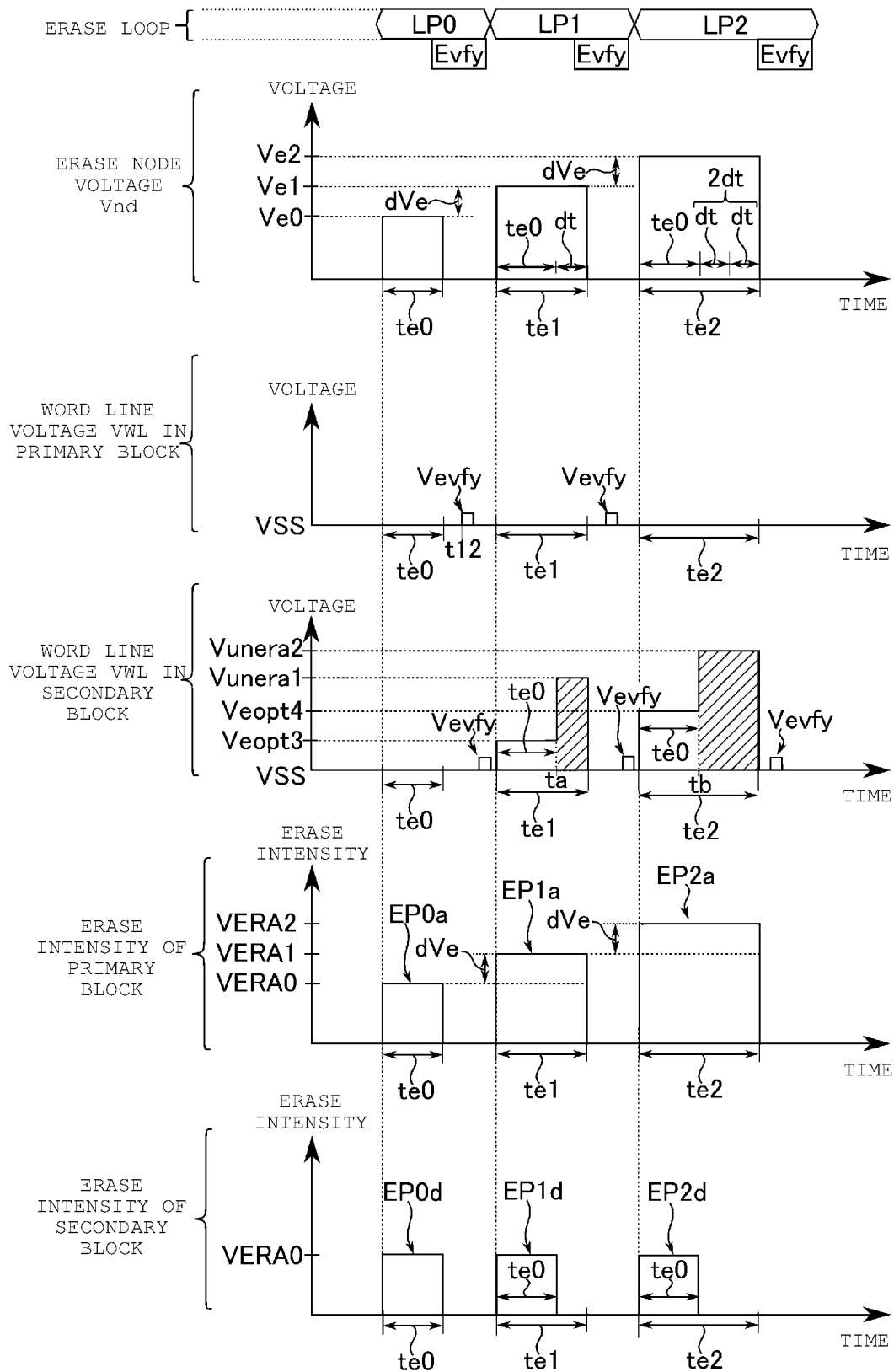
FIG. 22 is a waveform diagram illustrating an operation example of a memory device of the second embodiment.

FIG. 22 is a waveform diagram illustrating an operation example of the flash memory 2 of the embodiment.

As described above, the flash memory 2 receives the multi-block erase command set CAset including the erase mode Emd from the memory controller 1.

The erase sequence control circuit 251 transmits the voltage information (adjusted voltage code) SELeopt of the word line voltage VWL to each word line voltage regulator circuit 271 based on the code of the erase mode (erase intensity information) Emd stored in the erase mode register 61.

The word line voltage regulator circuit 271 corresponding to the primary block BLKprm outputs a desired voltage (for example, the ground voltage VSS) to the plurality of word lines WL in the primary block BLKprm via the CG line group CGg and the word line switch array 51 so that the erase voltage EP having the desired erase intensity is supplied to the primary block BLKprm.

The word line voltage regulator circuit 271 corresponding to the secondary block BLKsnd outputs the adjusted voltage Veopt based on the selected adjusted voltage code SELeopt to the plurality of word lines WL in the secondary block BLKsnd via the word line switch array 51.

In the embodiment, for example, the erase intensity information Emd includes information (referred to as, for example, supply time information or pulse width information) for changing the voltage value of the word line voltage VWL in the secondary block BLKsnd from the adjusted voltage Veopt having a certain voltage value to the non-selected voltage Vunera during the supply of the erase voltage EP (during the period when the voltage Ve is applied to the erase node NDera). For example, the non-selected voltage Vunera has a certain voltage value (verification level) used for the verification voltage Vvfy during the program verification.

As illustrated in FIG. 22, in the first erase loop LP0, the erase sequence control circuit 251 executes the erase operation ERA using erase voltages EP0$a$ and EP0$d$ having the same erase intensity VERA0 on the primary block BLKprm and the secondary block BLKsnd, respectively.

After that, the erase sequence control circuit 251 executes the erase verification Evfy of the first erase loop LP0.

During the erase operation ERA of the second erase loop LP1, by the erase sequence control circuit 251 and the word line voltage regulator circuit 271, the adjusted voltage Veopt (for example, the voltage Veopt3) based on the selected adjusted voltage code SELeopt is applied to each word line WL in the secondary block BLKsnd.

It is noted that, during the erase operation ERA of the second erase loop LP1, the ground voltage VSS is applied to each word line WL in the primary block BLKprm.

Accordingly, the erase voltage EP1$a$ is supplied to the primary block BLKprm, and an erase voltage EP1$d$ is supplied to the secondary block BLKsnd. For example, the erase voltage EP1$d$ has the erase intensity VERA0.

In the erase operation ERA of the second erase loop LP1, the erase sequence control circuit 251 changes the word line voltage VWL of the secondary block BLKsnd from the adjusted voltage Veopt3 to a non-selected voltage Vunera1 at the time ta when the period te0 elapses from the start of the supply of the erase voltage EP. For example, according to the instruction of the erase sequence control circuit 251, the word line voltage regulator circuit 271 corresponding to the secondary block BLKsnd stops the output of the adjusted voltage Veopt3 and outputs the non-selected voltage Vunera1.

Accordingly, after the time ta (for example, in the period dt) in the erase operation ERA, the secondary block BLKsnd enters a state equivalent to the non-selected state (unera).

In this manner, during the period te1 in the erase operation ERA of the second erase loop LP1, the voltage Veopt3 is applied to the word lines WL of the secondary block BLKsnd during the period te0, and the voltage Vunera1 is applied to the word lines WL during the period dt. It is noted that, in some cases, the period in which the voltage Vunera1 is applied to the word lines WL of the secondary block BLKsnd may be different from the period dt.

After the second erase loop LP1, similarly to the above example, the erase sequence control circuit 251 executes the third erase loop LP2 according to the result of the erase verification Evfy.

When the erase operation ERA of the third erase loop LP2 is executed, the erase sequence control circuit 251 allows the corresponding word line voltage regulator circuit 271 to apply the ground voltage VSS to each word line WL of the primary block BLKprm.

At the start of the erase operation ERA in the third erase loop LP2, the erase sequence control circuit 251 applies the adjusted voltage Veopt4 to each word line WL of the secondary block BLKsnd by the corresponding word line voltage regulator circuit 271.

Accordingly, the erase voltage EP2$a$ is supplied to the primary block BLKprm, and the erase voltage EP2$d$ is supplied to the secondary block BLKsnd. For example, the erase voltage EP2$d$ has the erase intensity VERA0.

During the erase operation ERA of the third erase loop LP2, by instruction of the erase sequence control circuit 251, at the time tb when the period te0 has elapsed from the start of the supply of the erase voltage EP2 (EP2$a$ and EP2$d$), the word line voltage regulator circuit 271 changes the word line voltage VWL of the secondary block BLKsnd from the adjusted voltage Veopt4 to a non-selected voltage Vunera2. For example, the voltage value of the non-selected voltage Vunera2 is higher than the voltage value of the non-selected voltage Vunera1 by the voltage value dVe.

Accordingly, after the time tb in the erase operation ERA of the third erase loop LP2, the secondary block BLKsnd is in the state equivalent to the non-selected state.

As a result, in the erase operation period tet of the third erase loop LP2, the voltage Veopt4 is applied to the word lines WL during the period te0, and the non-selected voltage Vunera2 is applied to the word lines WL during a period 2$dt$.

It is noted that, in some cases, the period in which the non-selected voltage Vunera2 is applied to the word lines WL of the secondary block BLKsnd may be different from the period 2dt.

In this manner, in the embodiment, the secondary block BLKsnd is set to the non-selected state in a portion of the period of the erase operation ERA. Accordingly, a pulse width of the erase voltage EP (for example, erase voltages EP1d and EP2d) supplied to the secondary block BLKsnd is controlled. For example, in the secondary block BLKsnd, the effective period representing the voltages EP1d and EP2d in the second and third erase loops LP1 and LP2 are supplied is substantially the same as the supply period te0 of the erase voltage EP0d in the first erase loop LP0.

As a result, the effective erase intensity of the secondary block BLKsnd in each of the second and third erase loops LP1 and LP2 is less than or equal to the erase intensity of the first erase loop LP0.

As described above, the flash memory 2 of the embodiment can control the erase intensity of the erase voltage EP supplied to a certain block BLKsnd among the plurality of selected blocks BLKprm and BLKsnd by controlling a pulse width to of the erase voltage (erase pulse) EP in addition to controlling the voltage value of the word line voltage VWL during the erase operation ERA.

Therefore, the memory device and the memory system of the embodiment can improve the characteristics thereof.

(3) Third Embodiment

A memory device, a memory system, and a control method thereof according to a third embodiment will be described with reference to FIGS. 23 to 25.

Figure 23:
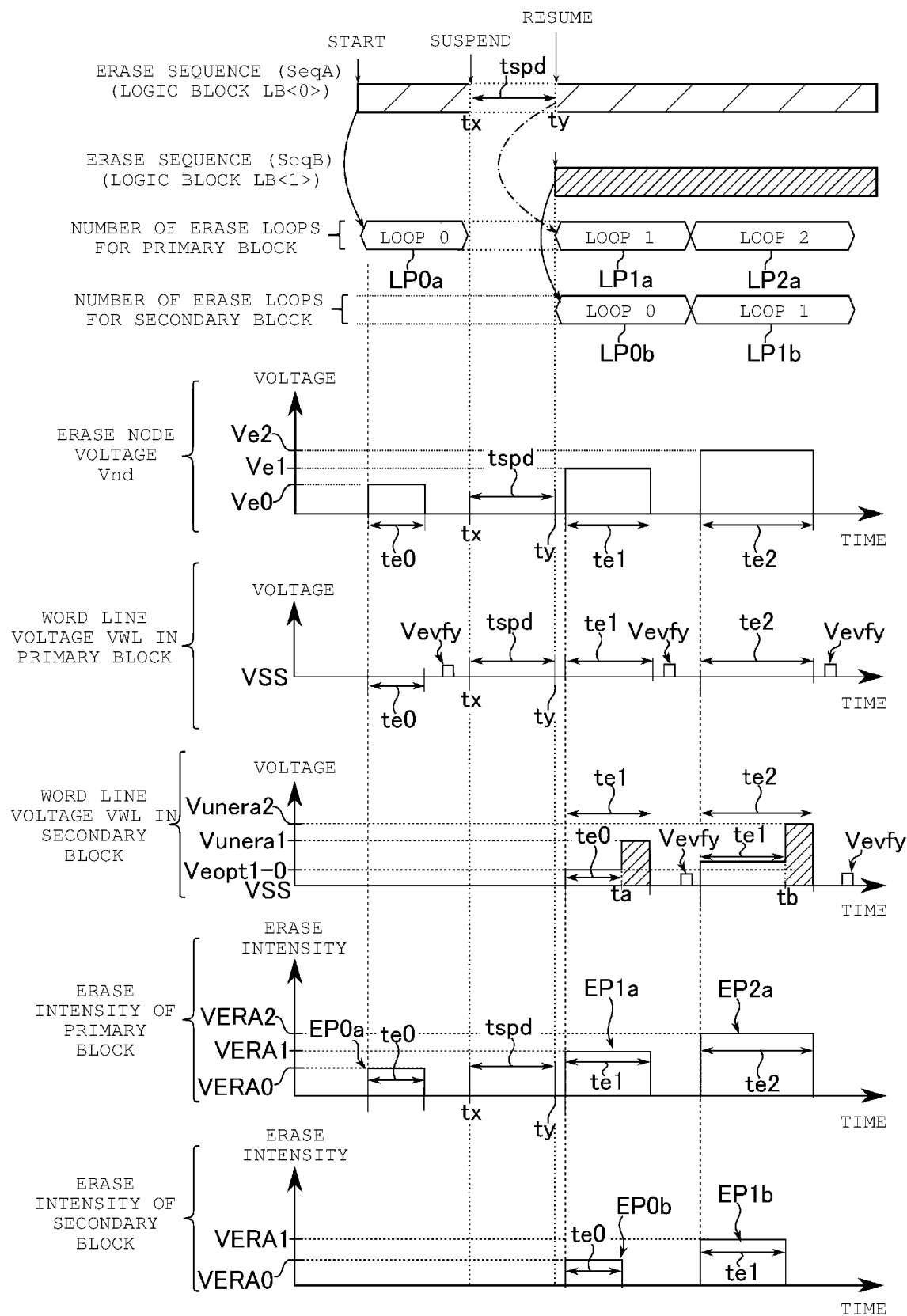
FIG. 23 is a waveform diagram illustrating an operation example of a memory device of a third embodiment.

FIG. 23 is a timing chart illustrating an operation example of a flash memory 2 of the embodiment.

As illustrated in FIG. 23, according to the operation of the memory system 90, there is a possibility that an erase sequence SeqA may be set to the suspended state during the erase sequences SeqA for one or more blocks BLK belonging to a certain logical block LB (for example, a logical block LB<0>). The logical block LB is a unit managed by the logical address to which one or more physical blocks BLK are assigned.

Furthermore, in some cases, after a suspend period tspd, the erase sequence SeqA of the logical block LB<0> is resumed, and simultaneously, a new erase sequence SeqB for one or more blocks BLK for another logical block LB<1> is started.

The flash memory 2 of the embodiment controls the erase intensity of the erase voltage EP for the physical block BLK that is an erase target with respect to the plurality of physical blocks BLK of each logical block LB for which the erase sequences (plurality of erase operations ERA) are executed in parallel, based on the number of erase loops of the erase sequences SeqA and SeqB of each logical block LB.

Figure 24:
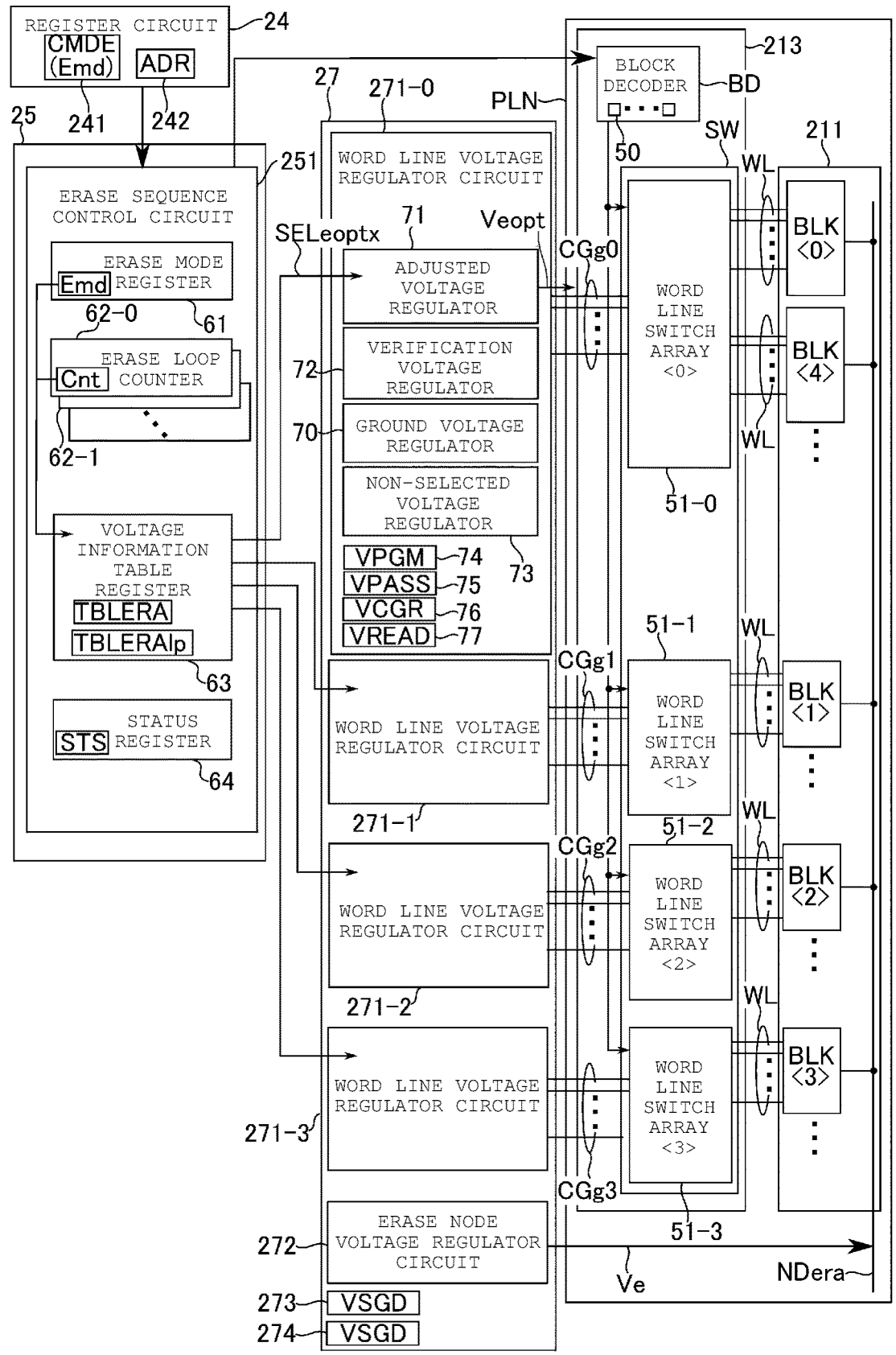
FIG. 24 is a block diagram illustrating a configuration example of the memory device of the third embodiment.
Figure 26A:
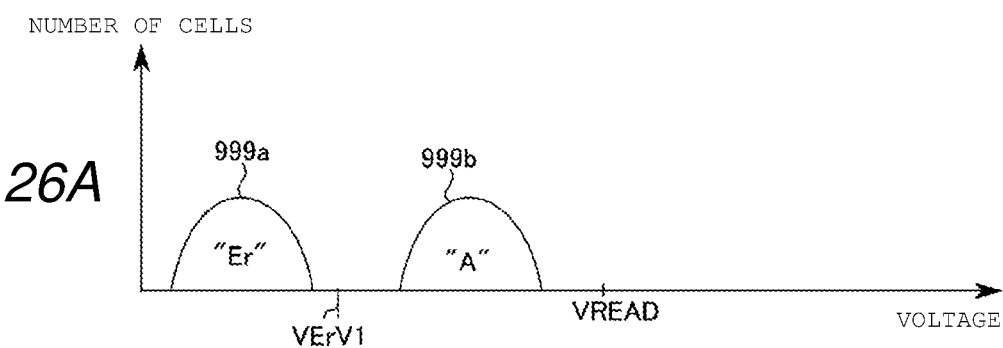
FIGS. 26A-26D are schematic diagrams illustrating a memory device of a fourth embodiment.
Figure 26B:
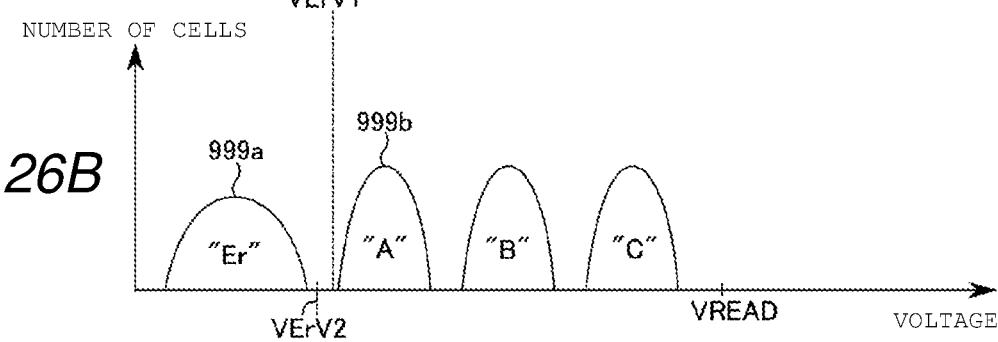
Figure 26C:
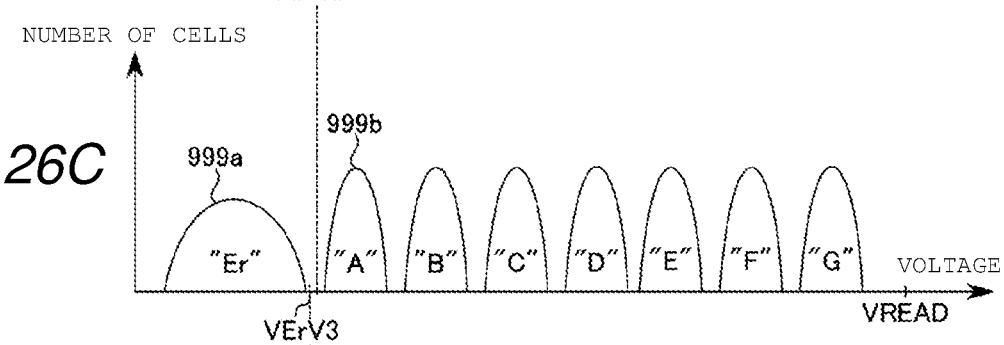
Figure 26D:
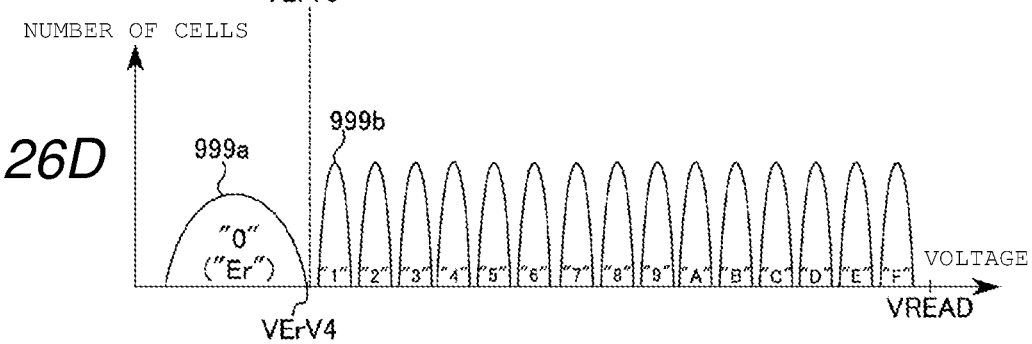

FIG. 24 is a block diagram illustrating a configuration example of the flash memory of the embodiment.

As illustrated in FIG. 24, the erase sequence control circuit 251 includes the plurality of erase loop counters 62 (62-0, 62-1, . . . ) so as to correspond to the plurality of erase sequences Seq (SeqA and SeqB) executed for the plurality of logical blocks LB.

The plurality of erase loop counters 62-0 and 62-1 count the number of erase loops LP of the corresponding erase sequence Seq with respect to the plurality of erase sequences Seq (SeqA and SeqB) executed in parallel. Accordingly, each of the erase loop counters 62-0 and 62-1 stores the count value (erase loop number information) Cnt indicating the number of erase loops.

Each of the plurality of erase loop counters 62 is associated with the selected blocks BLKprm and BLKsnd that are targets of the respective erase sequences Seq based on the command CMDE and the address ADR in the register circuit 24. It is noted that each of the plurality of erase loop counters 62 may be associated with a logical block LB.

The voltage information table register 63 includes a voltage information table TBLERAlp based on the erase loop number information (number of erase loops) Cnt of the selected blocks BLKprm and BLKsnd belonging to a certain logical block LB<0> and the erase loop number information Cnt of the selected blocks BLKprm and BLKsnd belonging to another logical block LB<1>.

In the embodiment, the selected block of the erase sequence SeqA that is executed earlier is referred to as a primary block BLKprm, and the selected block of the erase sequence SeqB that is newly added and executed later is referred to as a secondary block BLKsnd.

FIG. 25 illustrates an example of the voltage information table TBLERAlp in the flash memory 2 of the embodiment. The voltage information table TBLERAlp of FIG. 25 illustrates the correspondence of the number of erase loops LP with the word line voltage (adjusted voltage) Veopt of the plurality of selected blocks BLKprm and BLKsnd in each of the erase sequences SeqA and SeqB executed in parallel in each code indicating the word line voltage VWL.

As described above, an adjusted voltage code eoptx assigned to each of the plurality of adjusted voltages Veopt that can be applied to the word lines WL is a signal set (a data, a DAC value) represented by the plurality of bits (for example, 3 bits).

The adjusted voltage code eoptx of "000" represents the code of the voltage value (for example, the ground voltage VSS) of the word line voltage VWL used for the secondary block BLKsnd when the number of erase loops of the secondary block BLKsnd is equal to the number of erase loops of the primary block BLKprm.

The adjusted voltage code eoptx of "001" represents the code selected when the number of erase loops of the primary block BLKprm is 2 (LP1) and the number of erase loops of the secondary block BLKsnd is 1 (LP0).

The word line voltage VWL supplied to the secondary block BLKsnd by the adjusted voltage code eoptx ("001") has a voltage value Veopt1-0. The voltage value Veopt1-0 has the magnitude for adjusting the erase voltage EP supplied to the secondary block BLKsnd so that, when the erase node voltage Vnd has the voltage value Ve1 used in the second erase loop LP1, the erase intensity of the erase voltage EP of the secondary block BLKsnd is the erase intensity used in the first erase loop LP0.

The adjusted voltage code eoptx of "010" represents the code selected when the number of erase loops of the primary block BLKprm is 3 (LP2) and the number of erase loops of the secondary block BLKsnd is 1 (LP0).

The word line voltage VWL supplied to the secondary block BLKsnd by this adjusted voltage code eoptx ("010") has a voltage value Veopt2-0. The voltage value Veopt2-0 has the magnitude for adjusting the erase voltage EP supplied to the secondary block BLKsnd so that, when the erase node voltage Vnd has the voltage value Ve2 used in the third erase loop LP2, the erase intensity of the erase voltage EP of the secondary block BLKsnd is the erase intensity used in the first erase loop LP0.

The adjusted voltage code eoptx of "011" represents the code selected when the number of erase loops of the primary block BLKprm is 3 (LP2) and the number of erase loops of the secondary block BLKsnd is 2 (LP1).

The word line voltage VWL supplied to the secondary block BLKsnd by the adjusted voltage code eoptx ("011") has a voltage value Veopt2-1. The voltage value Veopt2-1 has the magnitude for adjusting the erase voltage EP supplied to the secondary block BLKsnd so that, when the erase node voltage Vnd has the voltage value Ve2 used in the third erase loop LP2, the erase intensity of the erase voltage EP of the secondary block BLKsnd is the erase intensity used in the second erase loop LP1.

The adjusted voltage code eoptx of "100" represents the code selected when the number of erase loops of the primary block BLKprm is 4 (LP3) and the number of erase loops of the secondary block BLKsnd is 1 (LP0).

The word line voltage VWL supplied to the secondary block BLKsnd by the adjusted voltage code eoptx ("100") has a voltage value Veopt3-0. The voltage value Veopt3-0 has the magnitude for adjusting the erase voltage EP supplied to the secondary block BLKsnd so that, when the erase node voltage Vnd has a voltage value Ve3 used in the fourth erase loop LP3, the erase intensity of the erase voltage EP of the secondary block BLKsnd is the erase intensity used in the first erase loop LP0.

The adjusted voltage code eoptx of "101" represents the code selected when the number of erase loops of the primary block BLKprm is 4 (LP3) and the number of erase loops of the secondary block BLKsnd is 2 (LP1).

The word line voltage VWL supplied to the secondary block BLKsnd by the adjusted voltage code eoptx ("101") has a voltage value Veopt3-1. The voltage value Veopt3-1 has the magnitude for adjusting the erase voltage EP supplied to the secondary block BLKsnd so that, when the erase node voltage Vnd has the voltage value Ve3 used in the fourth erase loop LP3, the erase intensity of the erase voltage EP of the secondary block BLKsnd is the erase intensity used in the second erase loop LP1.

The adjusted voltage code eoptx of "110" represents the code selected when the number of erase loops of the primary block BLKprm is 4 (LP3) and the number of erase loops of the secondary block BLKsnd is 3 (LP2).

The word line voltage VWL supplied to the secondary block BLKsnd by the adjusted voltage code eoptx ("110") has a voltage value Veopt3-2. The voltage value Veopt3-2 has the magnitude for adjusting the erase voltage EP supplied to the secondary block BLKsnd so that, when the erase node voltage Vnd has the voltage value Ve3 used in the fourth erase loop LP3, the erase intensity of the erase voltage EP of the secondary block BLKsnd is the erase intensity used in the third erase loop LP2.

For example, the adjusted voltage code eoptx of "111" indicates that the adjustment of the word line voltage VWL is not performed.

In this manner, the word line voltage VWL in the secondary block BLKsnd of the subsequent erase sequence SeqB is controlled based on the voltage information table TBLERAlp.

The flash memory 2 of the embodiment operates as follows.

For example, as illustrated in FIG. 23, the erase sequence SeqA is executed with respect to the block (primary block) BLKprm of the logical block LB<0>. A suspend command is transferred from the memory controller 1 to the flash memory 2 after a first erase loop LP0a.

Accordingly, at a certain time tx, the erase sequence SeqA of the primary block BLKprm is set to the suspended state.

After that, the memory controller 1 transmits the resume command for the erase sequence SeqA of the primary block BLKprm to the flash memory 2. At this time, the memory controller 1 transmits the erase command CMDE and the address ADR related to the erase sequence SeqB of the block BLKsnd of the logical block LB<1> to the flash memory 2.

Accordingly, the flash memory 2 restarts the starting erase sequence SeqA at the time ty and newly starts the subsequent erase sequence SeqB.

The voltage value of the erase node NDera after restarting depends on the number of erase loops of the starting erase sequence SeqA. For example, when the number Cnt of erase loops of the primary block BLKprm in the starting erase sequence SeqA is 2, the voltage value Ve1 (>Ve0) is applied to the erase node NDera.

In the flash memory 2, the erase sequence control circuit 251 controls the word line voltage VWL of the secondary block BLKsnd based on the voltage information table TBLERAlp so that the word line voltage VWL of the secondary block BLKsnd in the subsequent erase sequence SeqB has the voltage value at which the erase voltage EP having the erase intensity corresponding to the number Cnt of erase loops of the subsequent erase sequence SeqB is supplied to the secondary block BLKsnd.

The erase sequence control circuit 251 selects the adjusted voltage code eoptx corresponding to the word line voltage VWL used for the secondary block BLKsnd among the plurality of codes eoptx of the voltage information table TBLERAlp based on the erase mode (erase intensity information) Emd and the count value (erase loop number information) Cnt indicating the number of erase loops in each counter 62. The erase sequence control circuit 251 transmits a selected adjusted voltage code SELeoptx to the word line voltage regulator circuit 271 corresponding to the secondary block BLKsnd.

The word line voltage regulator circuit 271 outputs an adjusted voltage Veoptx according to a selected adjusted voltage code SELeoptx to the word lines WL of the secondary block BLKsnd.

For example, when the number of erase loops of the primary block BLKprm after the restart of the starting erase sequence SeqA is 2, the word line voltage regulator circuit 271 corresponding to the secondary block BLKsnd applies the voltage Veopt1-0 corresponding to the adjusted voltage code SELeoptx (for example, the adjusted voltage code of "001") selected by the adjusted voltage regulator 71 to the word lines WL of the secondary block BLKsnd in a first erase loop LP0b of the newly started subsequent erase sequence SeqB.

It is noted that, in the primary block BLKprm in which a second erase loop LP1a is executed after the erase sequence SeqA is restarted, similarly to the above-described example, the word line voltage regulator circuit 271 corresponding to the primary block BLKprm applies the ground voltage VSS to the word lines WL. The erase voltage EP1a having the erase intensity in accordance with the second erase loop LP1a is supplied to the primary block BLKprm.

After that, similarly to the above example, the erase sequence control circuit 251 executes the erase verification Evfy on the primary block BLKprm and the secondary block BLKsnd.

A plurality of erase loops LP2a and LP1b of each erase sequence SeqA and SeqB are executed until the erase verification Evfy with respect to the primary block BLKprm (and the secondary block BLKsnd) is pass or until the number Cnt of the erase loops reaches the upper limit value.

It is noted that, in the example of FIG. 23, in the erase operation ERA of the primary block BLKprm and the secondary block BLKsnd which is simultaneously executed in different number Cnt of erase loops, similarly to the second embodiment described above, the supply time of the erase voltage EP (pulse width of the erase voltage EP) of the secondary block BLKsnd can be controlled by changing the word line voltage VWL of the secondary block BLKsnd from the voltage Veopt to the non-selected voltage Vunera. However, even when the number of erase loops of the secondary block BLKsnd is different from the number of erase loops of the primary block BLKprm, the supply time of the erase voltage EP of the secondary block BLKsnd may be equal to the supply time of the erase voltage EP of the primary block BLKprm without control of the supply time of the erase voltage EP in the erase operation executed simultaneously.

As described above, the flash memory 2 of the embodiment supplies the erase voltage EP having the erase intensity in accordance with the number of erase loops continued before and after the resume of the starting erase sequence SeqA to the primary block BLKprm.

At the same time, the flash memory 2 of the embodiment controls the word line voltage VWL in the secondary block BLKsnd according to the operation state (for example, the voltage Vnd of the erase node NDera) of the primary block BLKprm in the subsequent erase sequence SeqB newly executed in parallel with the starting erase sequence SeqA. Accordingly, in the subsequent erase sequence SeqB, the erase voltage EP having the desired erase intensity VERA is supplied to the secondary block BLKsnd.

As a result, the flash memory 2 of the embodiment can execute the erase operation ERA under the conditions suitable for each of the plurality of blocks BLKprm and BLKsnd in parallel (substantially simultaneously) on the plurality of blocks BLKprm and BLKsnd.

As described above, the memory device and the memory system of the embodiment can improve the characteristics of the memory device.

(4) Fourth Embodiment

A memory device, a memory system, and a control method thereof according to a fourth embodiment will be described with reference to FIGS. 26 and 27.

The flash memory 2 of the embodiment changes the verification level related to the erase verification Evfy according to the number of bits that can be stored in the memory cell MT of the block BLK.

FIG. 26 is a diagram illustrating a relationship between the threshold voltage distribution and the erase verification level in accordance with the number of bits of the data that can be stored in the memory cell MT.

As illustrated in FIG. 26, as described above, the memory cell MT stores a data of one bit or more in any one of SLC (FIG. 25A), MLC (FIG. 25B), TLC (FIG. 25C), and QLC (FIG. 25D).

In some cases, in the plurality of blocks BLK in the plane PLN of the flash memory 2, the number of bits that can be stored in the memory cell MT among the block BLK may differ in the plurality of blocks BLK (or the plurality of chips CP). In the following, the block BLK including the SLC is referred to as an SLC block. In the following, the block BLK including the MLC is referred to as an MLC block. In the following, the block BLK including the TLC is referred to as a TLC block. In the following, the block BLK including the QLC is referred to as a QLC block.

As the number of bits of the data stored in the memory cell MT increases, the width of the threshold voltage distribution 999 decreases. For example, the width of the threshold voltage distribution 999b in the program state of the QLC is smaller than the width of the threshold voltage distribution 999b in the program state of the SLC.

Along with this, in the SLC block, the MLC block, the TLC block, and the QLC block, the read level and the verification level differ according to the number of bits per memory cell of the block BLK.

An erase verification level VErV (VErV1, VErV2, VErV3, or VErV4) is provided between the threshold voltage distribution 999a in the erase state and the threshold voltage distribution 999b in the lowest program state. For example, the erase verification level VErV2 of the MLC block is lower than an erase verification level VErV1 of the SLC block. The erase verification level VErV3 of the TLC block is lower than the erase verification level VErV2 of the MLC block. The erase verification level VErV4 of the QLC block is lower than the erase verification level VErV3 of the TLC block.

Figure 27:
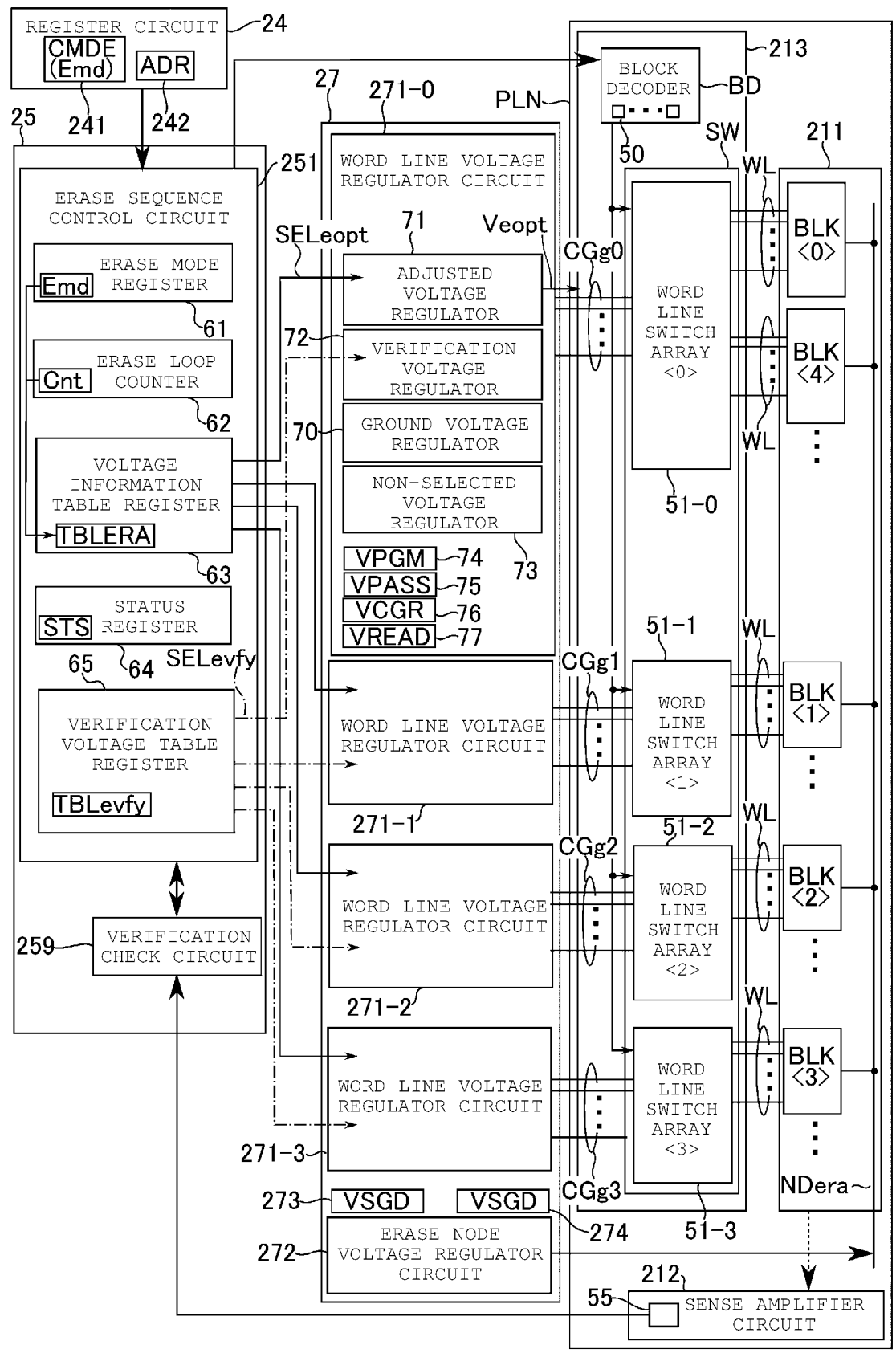
FIG. 27 is a block diagram illustrating a configuration example of the memory device of the fourth embodiment.

FIG. 27 is a block diagram illustrating a configuration example of the flash memory 2 of the embodiment.

As illustrated in FIG. 27, the flash memory 2 of the embodiment further includes a register (hereinafter, referred to as a verification voltage table register) 65 storing information (hereinafter, referred to as a verification voltage information table) TBLevfy on the erase verification level VErV.

The erase sequence control circuit 251 selects a code of the corresponding erase verification level VErV from the verification voltage information table TBLevfy according to the type of the block BLK that is an erase target (the number of bits of a data that can be stored). For example, the erase sequence control circuit 251 determines the type of block BLK that is an erase target based on the information (for example, a flag) from the memory controller 1 and the information (for example, a flag) stored in the memory cell array 211.

During the erase verification Evfy, the word line voltage regulator circuit 271 outputs the erase verification voltage Vevfy having a verification level (voltage value) VerV based on a selected code SELevfy from the verification voltage regulator 72 to the word lines WL of the selected blocks BLKprm and BLKsnd.

Accordingly, the erase verification Evfy of the selected blocks BLKprm and BLKsnd is executed by using the erase verification level VErV in accordance with the number of data bits (the number of stored data bits) per memory cell MT of the selected blocks BLKprm and BLKsnd.

The sense result of on/off of the memory cell MT with respect to the erase verification voltage Vevfy based on the code selected from the verification voltage information table TBLevfy is stored in a latch circuit (page buffer) 55 of the sense amplifier circuit 212. The sense amplifier circuit 212 transmits the sense result in the latch circuit 55 to a verification check circuit 259.

Based on the sense result from the sense amplifier circuit 212 by using a certain determination reference (a value based on an allowable number of on (verification pass) or off (verification fail) memory cells MT), the verification check circuit 259 determines whether the result Rst of the erase verification Evfy (erase operation ERA) with respect to the selected blocks BLKprm and BLKsnd is pass.

Based on the determination result of the verification check circuit 259, the erase sequence control circuit 251 determines the continuation or completion of the erase operation ERA (erase loop LP) with respect to the selected blocks BLKprm and BLKsnd.

As described above, in the flash memory 2 of the embodiment, even when the plurality of blocks BLK having different numbers of bits of the data stored per memory cell MT are mixed in the plane PLN (memory cell array 211), a verification level suitable for the erase verification Evfy of each block BLK can be supplied to the corresponding selected blocks BLKprm and BLKsnd in a certain erase sequence Seq.

Therefore, the flash memory 2 of the embodiment can improve the efficiency of the verification operation in the erase sequence.

As described above, the memory device and the memory system of the embodiment can improve the characteristics thereof.

(5) Fifth Embodiment

A memory device, a memory system, and a control method thereof according to a fifth embodiment will be described with reference to FIG. 28.

Figure 28:
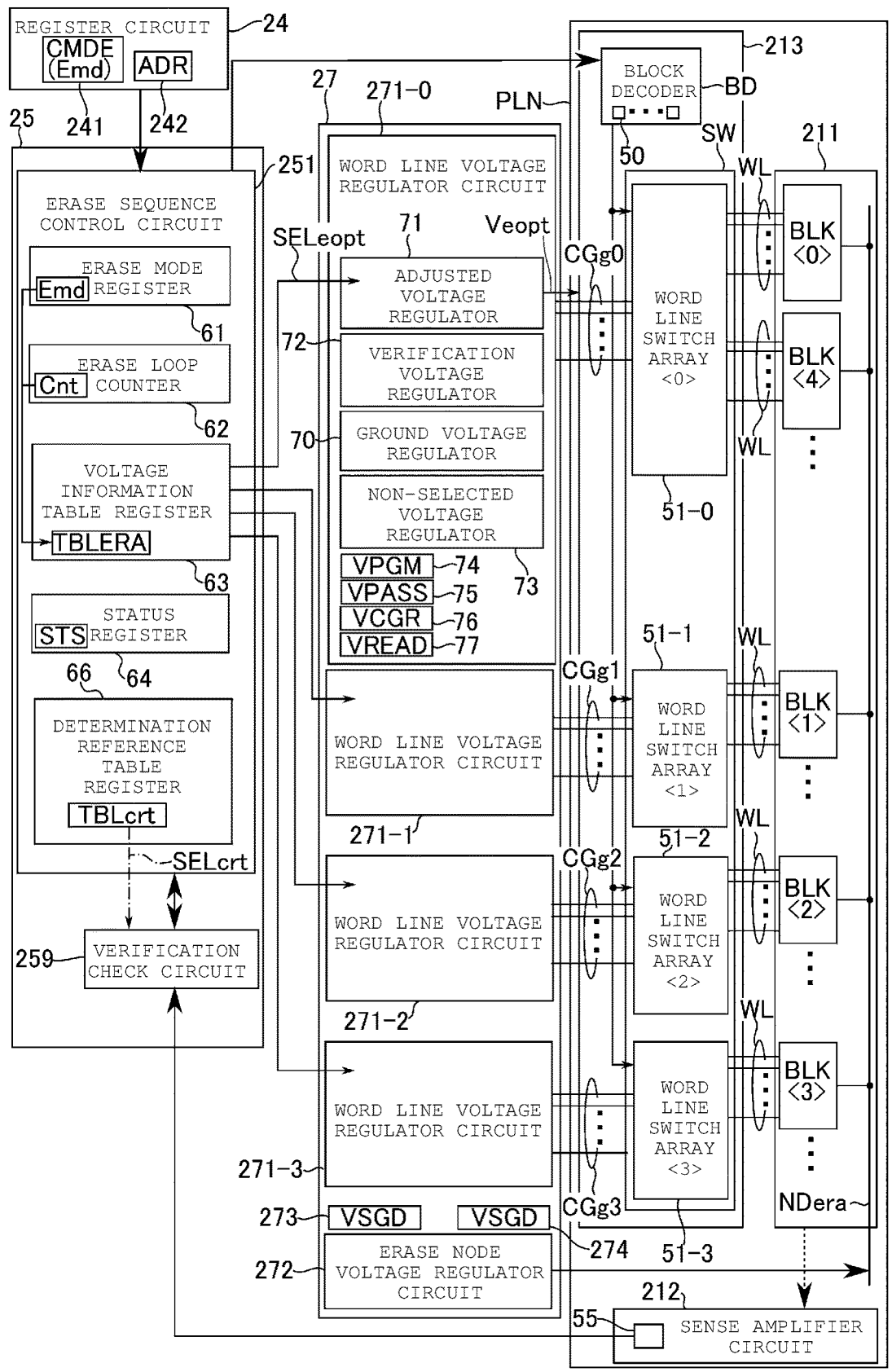
FIG. 28 is a block diagram illustrating a configuration example of a memory device of a fifth embodiment.

FIG. 28 is a block diagram illustrating a configuration example of a flash memory 2 of the embodiment.

When the number of bits of the data stored per memory cell MT is different among the plurality of blocks BLK, without changing a verification level VErV of a verification voltage Vevfy supplied to a word line WL, by changing a determination reference of erase verification Evfy in a verification check circuit 259, the flash memory 2 of the embodiment executes the erase verification Evfy in accordance with a type of the block BLK (SLC block, MLC block, TLC block, and QLC block).

As illustrated in FIG. 28, the erase sequence control circuit 251 stores a table (hereinafter, referred to as a determination reference information table) TBLcrt including information on the determination reference related to the erase verification Evfy in a register (referred to as a determination reference table register) 66.

The determination reference information table TBLcrt includes a code indicating each of the plurality of determination references (for example, values in accordance with the number of memory cells of on (verification pass) or off (verification fail)) in accordance with the type of the block BLK.

For example, the allowable number of memory cells MT of verification fail in the SLC block is less than the allowable number of memory cells MT of verification fail in the MLC block. For example, the allowable number of memory cells MT of verification fail in the MLC block is less than the allowable number of memory cells MT of verification fail in the TLC block. For example, the allowable number of memory cells MT of verification fail in the TLC block is less than the allowable number of memory cells MT of verification fail in the QLC block. Based on this relationship, the determination reference (and the code thereof) for erase verification with respect to each of the blocks BLK in the determination reference information table TBLcrt are set.

During the erase verification Evfy, the erase sequence control circuit 251 instructs the verification voltage regulator 72 of the word line voltage regulator circuit 271 to output the erase verification voltage Vevfy having the same verification level VErV to each of the selected blocks BLKprm and BLKsnd which are the targets of the erase verification Evfy, regardless of the type of the block BLK.

The erase sequence control circuit 251 determines the type of the selected blocks BLKprm and BLKsnd that are targets of the erase verification Evfy based on the information (for example, a flag) from the memory controller 1 and the information (for example, a flag) stored in the memory cell array 211.

Based on the determination result of the type of the selected blocks BLKprm and BLKsnd, the erase sequence control circuit 251 selects the determination reference code used for the erase verification Evfy with respect to the selected blocks BLKprm and BLKsnd from the plurality of codes of the determination reference information table TBLcrt.

The erase sequence control circuit 251 transmits a selected code SELcrt to the verification check circuit 259.

The verification check circuit 259 determines whether the result Rst of the erase verification Evfy (erase operation ERA) of the selected blocks BLKprm and BLKsnd is pass or fail based on the sense result from the sense amplifier circuit 212 by using the determination reference based on the received code SELcrt.

As described above, the flash memory 2 of the embodiment can execute the erase verification Evfy with respect to the erase operation ERA by using different determination references according to the types of the selected blocks BLKprm and BLKsnd.

Therefore, the flash memory 2 of the embodiment can improve the efficiency of the verification operation in the erase sequence.

As described above, the memory device and the memory system of the embodiment can improve the characteristics thereof.

(6) Others

A memory device of the embodiment illustrates a flash memory (for example, a NAND flash memory) as an example. However, the memory device of the embodiment may be a flash memory (for example, a NOR flash memory) other than the NAND flash memory, a volatile memory device such as a DRAM, or a non-volatile memory device such as a magnetoresistive random access memory (MRAM).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A memory device comprising:
a first block including a first memory cell and a first word line connected to the first memory cell;
a second block including a second memory cell and a second word line connected to the second memory cell; and
a control circuit configured to execute an erase sequence for the first and second blocks, and determine voltages to be applied to the first and second word lines during the erase sequence, wherein the control circuit applies a first voltage to each of the first and second word lines to supply a first erase pulse having a first erase intensity to each of the first and second blocks, when a first erase operation of a first erase sequence is executed on the first and second blocks, and applies the first voltage to the first word line and a second voltage higher than the first voltage to the second word line, to supply the first erase pulse to the first block and a second erase pulse having a second erase intensity less than the first erase intensity to the second block, when a second erase operation of a second erase sequence is executed on the first and second blocks.

2. The memory device according to claim 1, further comprising:
a driver circuit configured to supply the plurality of voltages to the first and second word lines, wherein the driver circuit
outputs the first voltage to the first and second word lines during the first erase operation, and
outputs the first voltage to the first word line and outputs the second voltage to the second word line during the second erase operation.

3. The memory device according to claim 2, wherein the control circuit
applies the second voltage to the second word line and, after that, applies a third voltage higher than the second voltage to the second word line during a period when the first voltage is applied to the first word line, and
sets the second block to a selected state during a period when the second voltage is applied to the second word line and sets the second block to a non-selected state during a period when the third voltage is applied to the second word line.

4. The memory device according to claim 3, further comprising
a driver circuit configured to supply the plurality of voltages to the first and second word lines,
wherein the driver circuit changes a voltage output to the second word line from the second voltage to the third voltage at a first time in a period during which the first voltage is applied to the first word line.

5. The memory device according to claim 1, wherein
the first memory cell stores data of n bits, and the second memory cell stores data of m bits, where n and m are positive integers different from each other, and
the control circuit performs erase verification on the first block using a first erase verification voltage and on the second block using a second erase verification voltage that is different from the first erase verification voltage.

6. The memory device according to claim 1, wherein the control circuit determines that one of the first erase sequence and the second erase sequence is to be executed based on erase intensity information received from an external controller.

7. The memory device according to claim 6, wherein when the second erase sequence is executed, the control circuit receives from the external controller a first erase command for the first block, a second erase command for the second block, and the erase intensity information associated with the second block.

8. The memory device according to claim 6, wherein when the second erase sequence is executed, the control circuit receives from the external controller a first erase command for the first block and a second erase command for the second block that includes the erase intensity information associated with the second block.

9. The memory device according to claim 1, wherein
the first and second blocks are connected to an erase node, and
the first erase intensity is based on a difference between the first voltage and a fourth voltage of the erase node, and the second erase intensity is based on a difference between the second voltage and the fourth voltage.

10. The memory device according to claim 1, wherein
the control circuit controls a first plane and a second plane that is controlled independently of the first plane, and
the first and second blocks are provided in the first plane.

11. A memory system comprising:
a memory device; and
a memory controller configured to instruct the memory device to erase data in the memory device,
wherein the memory device includes
a first block including a first memory cell and a first word line connected to the first memory cell;
a second block including a second memory cell and a second word line connected to the second memory cell; and
a control circuit configured to execute an erase sequence for the first and second blocks, and determine voltages to be applied to the first and second word lines during the erase sequence, wherein the control circuit
applies a first voltage to each of the first and second word lines to supply a first erase pulse having a first erase intensity to each of the first and second blocks, when a first erase operation of a first erase sequence is executed on the first and second blocks, and
applies the first voltage to the first word line and a second voltage higher than the first voltage to the second word line, to supply the first erase pulse to the first block and a second erase pulse having a second erase intensity less than the first erase intensity to the second block, when a second erase operation of a second erase sequence is executed on the first and second blocks.

12. The memory system according to claim 11, wherein the control circuit determines that one of the first erase sequence and the second erase sequence is to be executed based on erase intensity information received from an external controller.

13. The memory system according to claim 12, wherein when the second erase sequence is executed, the control circuit receives from the memory controller a first erase command for the first block, a second erase command for the second block, and the erase intensity information.

14. The memory system according to claim 12,
when the second erase sequence is executed, the control circuit receives from the memory controller a first erase command for the first block and a second erase command for the second block that includes the erase intensity information.

15. The memory system according to claim 11,
wherein the memory device further includes a driver circuit configured to supply the plurality of voltages to the first and second word lines, and
wherein the driver circuit
outputs the first voltage to the first and second word lines during the first erase operation, and
outputs the first voltage to the first word line, and outputs the second voltage to the second word line during the second erase operation.

16. The memory system according to claim 15, wherein
during a period when the first voltage is applied to the first word line, the control circuit applies the second voltage to the second word line, and after that, applies a third voltage higher than the second voltage to the second word line, and during a period when the second voltage is applied to the second word line, the control circuit sets the second block to a selected state, and during a period when the third voltage is applied to the second word line, the control circuit sets the second block to a non-selected state.

17. The memory system according to claim 16, wherein
the memory device further includes a driver circuit configured to supply the plurality of voltages to the first and second word lines, and the driver circuit changes a voltage output to the second word line from the second voltage to the third voltage at a first time in the period during which the first voltage is applied to the first word line.

18. The memory system according to claim 11, wherein
wherein the first memory cell stores data of n bits, and the second memory cell stores data of m bits, where n and m are positive integers different from each other, and the control circuit performs erase verification on the first block using a first erase verification voltage and on the second block using a second erase verification voltage that is different from the first erase verification voltage.

19. The memory system according to claim 11, wherein
wherein the first and second blocks are connected to an erase node, and the first erase intensity is based on a difference between the first voltage and a fourth voltage of the erase node, and the second erase intensity is based on a difference between the second voltage and the fourth voltage.

20. The memory system according to claim 11, wherein
the control circuit controls a first plane and a second plane that is controlled independently of the first plane, and the first and second blocks are provided in the first plane.

\* \* \* \* \*